US009741719B2

(12) United States Patent
Smayling et al.

(10) Patent No.: US 9,741,719 B2
(45) Date of Patent: Aug. 22, 2017

(54) METHODS, STRUCTURES, AND DESIGNS FOR SELF-ALIGNING LOCAL INTERCONNECTS USED IN INTEGRATED CIRCUITS

(71) Applicant: Tela Innovations, Inc., Los Gatos, CA (US)

(72) Inventors: Michael C. Smayling, Fremont, CA (US); Scott T. Becker, Scotts Valley, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 0 days.

(21) Appl. No.: 14/995,483

(22) Filed: Jan. 14, 2016

(65) Prior Publication Data

US 2016/0133626 A1     May 12, 2016

Related U.S. Application Data

(60) Continuation of application No. 14/188,321, filed on Feb. 24, 2014, now Pat. No. 9,240,413, which is a
(Continued)

(51) Int. Cl.
*H01L 21/70*     (2006.01)
*H01L 27/092*     (2006.01)
(Continued)

(52) U.S. Cl.
CPC ........ *H01L 27/092* (2013.01); *G06F 17/5077* (2013.01); *H01L 21/28518* (2013.01);
(Continued)

(58) Field of Classification Search
CPC ............ H01L 21/8228; H01L 21/8238; H01L 27/0826; H01L 27/092
(Continued)

(56) References Cited

U.S. PATENT DOCUMENTS 4,069,493 A    1/1978   Bobenrieth
4,197,555 A    4/1980   Uehara et al.
(Continued)

FOREIGN PATENT DOCUMENTS

EP     0102644     7/1989
EP     0788166     8/1997
(Continued)

OTHER PUBLICATIONS

U.S. Appl. No. 60/625,342, Pileggi et al., filed May 25, 2006.
(Continued)

*Primary Examiner* — Sonya D McCall Shepard
(74) *Attorney, Agent, or Firm* — Martine Penilla Group, LLP

(57) ABSTRACT

An integrated circuit includes a gate electrode level region that includes a plurality of linear-shaped conductive structures. Each of the plurality of linear-shaped conductive structures is defined to extend lengthwise in a first direction. Some of the plurality of linear-shaped conductive structures form one or more gate electrodes of corresponding transistor devices. A local interconnect conductive structure is formed between two of the plurality of linear-shaped conductive structures so as to extend in the first direction along the two of the plurality of linear-shaped conductive structures.

23 Claims, 24 Drawing Sheets

| Additional Interconnect Layers (225) | |
|---|---|
| Metal 4 (223) | |
| Via 3 (221) | |
| Metal 3 (219) | |
| Via 2 (217) | |
| Metal 2 (215) | |
| Via 1 (213) | |
| Metal 1 (211) | |
| Diffusion Contacts (205) | Gate Electrode Contacts (209) |
| | Gate Electrode Features (207) |
| Substrate (201) { Diffusion Regions (203) | Isolation Regions |

Related U.S. Application Data continuation of application No. 13/189,433, filed on Jul. 22, 2011, now Pat. No. 8,680,626, which is a continuation of application No. 12/814,411, filed on Jun. 11, 2010, now Pat. No. 7,994,545, which is a division of application No. 11/969,854, filed on Jan. 4, 2008, now Pat. No. 7,763,534.

(60) Provisional application No. 60/983,091, filed on Oct. 26, 2007.

(51) Int. Cl.
| | |
|---|---|
| *H01L 21/285* | (2006.01) |
| *H01L 21/768* | (2006.01) |
| *H01L 21/8234* | (2006.01) |
| *H01L 21/8238* | (2006.01) |
| *H01L 27/088* | (2006.01) |
| *G06F 17/50* | (2006.01) |
| *H01L 27/105* | (2006.01) |
| *H01L 23/528* | (2006.01) |
| *H01L 27/02* | (2006.01) |
| *G03F 1/00* | (2012.01) |

(52) U.S. Cl.
CPC ............ *H01L 21/76895* (2013.01); *H01L 21/823475* (2013.01); *H01L 21/823828* (2013.01); *H01L 21/823871* (2013.01); *H01L 23/528* (2013.01); *H01L 27/0207* (2013.01); *H01L 27/088* (2013.01); *H01L 27/105* (2013.01); *G03F 1/14* (2013.01); *H01L 2924/0002* (2013.01)

(58) Field of Classification Search
USPC ......... 257/369, 368; 438/153, 154, 197, 199
See application file for complete search history.

(56) References Cited

U.S. PATENT DOCUMENTS

| | | | |
|---|---|---|---|
| 4,417,161 A | 11/1983 | Uya |
| 4,424,460 A | 1/1984 | Best |
| 4,602,270 A | 7/1986 | Finegold |
| 4,613,940 A | 9/1986 | Shenton et al. |
| 4,657,628 A | 4/1987 | Holloway et al. |
| 4,682,202 A | 7/1987 | Tanizawa |
| 4,745,084 A | 5/1988 | Rowson et al. |
| 4,780,753 A | 10/1988 | Ohkura et al. |
| 4,801,986 A | 1/1989 | Chang et al. |
| 4,804,636 A | 2/1989 | Groover, III |
| 4,812,688 A | 3/1989 | Chu et al. |
| 4,884,115 A | 11/1989 | Michel et al. |
| 4,928,160 A | 5/1990 | Crafts |
| 4,975,756 A | 12/1990 | Haken et al. |
| 5,047,979 A | 9/1991 | Leung |
| 5,068,603 A | 11/1991 | Mahoney |
| 5,079,614 A | 1/1992 | Khatakhotan |
| 5,097,422 A | 3/1992 | Corbin et al. |
| 5,117,277 A | 5/1992 | Yuyama et al. |
| 5,121,186 A | 6/1992 | Wong et al. |
| 5,208,765 A | 5/1993 | Turnbull |
| 5,224,057 A | 6/1993 | Igarashi |
| 5,242,770 A | 9/1993 | Chen et al. |
| 5,268,319 A | 12/1993 | Harari |
| 5,298,774 A | 3/1994 | Ueda et al. |
| 5,313,426 A | 5/1994 | Sakuma et al. |
| 5,338,963 A | 8/1994 | Klaasen |
| 5,351,197 A | 9/1994 | Upton et al. |
| 5,359,226 A | 10/1994 | DeJong |
| 5,365,454 A | 11/1994 | Nakagawa et al. |
| 5,367,187 A | 11/1994 | Yuen |
| 5,378,649 A | 1/1995 | Huang |
| 5,396,128 A | 3/1995 | Dunning et al. |
| 5,420,447 A | 5/1995 | Waggoner |
| 5,461,577 A | 10/1995 | Shaw et al. |
| 5,471,403 A | 11/1995 | Fujimaga |
| 5,497,334 A | 3/1996 | Russell et al. |
| 5,497,337 A | 3/1996 | Ponnapalli et al. |
| 5,526,307 A | 6/1996 | Lin et al. |
| 5,536,955 A | 7/1996 | Ali |
| 5,545,904 A | 8/1996 | Orbach |
| 5,581,098 A | 12/1996 | Chang |
| 5,581,202 A | 12/1996 | Yano et al. |
| 5,612,893 A | 3/1997 | Hao et al. |
| 5,636,002 A | 6/1997 | Garofalo |
| 5,656,861 A | 8/1997 | Godinho et al. |
| 5,682,323 A | 10/1997 | Pasch et al. |
| 5,684,311 A | 11/1997 | Shaw |
| 5,684,733 A | 11/1997 | Wu et al. |
| 5,698,873 A | 12/1997 | Colwell et al. |
| 5,705,301 A | 1/1998 | Garza et al. |
| 5,723,883 A | 3/1998 | Gheewalla |
| 5,723,908 A | 3/1998 | Fuchida et al. |
| 5,740,068 A | 4/1998 | Liebmann et al. |
| 5,745,374 A | 4/1998 | Matsumoto |
| 5,764,533 A | 6/1998 | deDood |
| 5,774,367 A | 6/1998 | Reyes et al. |
| 5,780,909 A | 7/1998 | Hayashi |
| 5,789,776 A | 8/1998 | Lancaster et al. |
| 5,790,417 A | 8/1998 | Chao et al. |
| 5,796,128 A | 8/1998 | Tran et al. |
| 5,796,624 A | 8/1998 | Sridhar et al. |
| 5,798,298 A | 8/1998 | Yang et al. |
| 5,814,844 A | 9/1998 | Nagata et al. |
| 5,825,203 A | 10/1998 | Kusunoki et al. |
| 5,834,851 A | 11/1998 | Ikeda et al. |
| 5,838,594 A | 11/1998 | Kojima |
| 5,841,663 A | 11/1998 | Sharma et al. |
| 5,847,421 A | 12/1998 | Yamaguchi |
| 5,850,362 A | 12/1998 | Sakuma et al. |
| 5,852,562 A | 12/1998 | Shinomiya et al. |
| 5,858,580 A | 1/1999 | Wang et al. |
| 5,898,194 A | 4/1999 | Gheewala |
| 5,900,340 A | 5/1999 | Reich et al. |
| 5,905,287 A | 5/1999 | Hirata |
| 5,908,827 A | 6/1999 | Sirna |
| 5,915,199 A | 6/1999 | Hsu |
| 5,917,207 A | 6/1999 | Colwell et al. |
| 5,920,486 A | 7/1999 | Beahm et al. |
| 5,923,059 A | 7/1999 | Gheewala |
| 5,923,060 A | 7/1999 | Gheewala |
| 5,929,469 A | 7/1999 | Mimoto et al. |
| 5,930,163 A | 7/1999 | Hara et al. |
| 5,935,763 A | 8/1999 | Caterer et al. |
| 5,949,101 A | 9/1999 | Aritome |
| 5,973,369 A * | 10/1999 | Hayashi ............... H01L 21/84 |
| | | | 257/369 |
| 5,973,507 A | 10/1999 | Yamazaki |
| 5,977,305 A | 11/1999 | Wigler et al. |
| 5,977,574 A | 11/1999 | Schmitt et al. |
| 5,998,879 A | 12/1999 | Iwaki et al. |
| 6,009,251 A | 12/1999 | Ho et al. |
| 6,026,223 A | 2/2000 | Scepanovic et al. |
| 6,037,613 A | 3/2000 | Mariyama |
| 6,037,617 A | 3/2000 | Kumagai |
| 6,044,007 A | 3/2000 | Capodieci |
| 6,054,872 A | 4/2000 | Fudanuki et al. |
| 6,063,132 A | 5/2000 | DeCamp et al. |
| 6,077,310 A | 6/2000 | Yamamoto et al. |
| 6,080,206 A | 6/2000 | Tadokoro et al. |
| 6,084,255 A | 7/2000 | Ueda |
| 6,084,437 A | 7/2000 | Sako |
| 6,091,845 A | 7/2000 | Pierrat et al. |
| 6,099,584 A | 8/2000 | Arnold et al. |
| 6,100,025 A | 8/2000 | Wigler et al. |
| 6,114,071 A | 9/2000 | Chen et al. |
| 6,144,227 A | 11/2000 | Sato |
| 6,159,839 A | 12/2000 | Jeng et al. |
| 6,166,415 A | 12/2000 | Sakemi et al. |
| 6,166,560 A | 12/2000 | Ogura et al. |
| 6,174,742 B1 | 1/2001 | Sudhindranath et al. |
| 6,182,272 B1 | 1/2001 | Andreev et al. |
| 6,194,104 B1 | 2/2001 | Hsu |

(56) References Cited

U.S. PATENT DOCUMENTS

| | | |
|---|---|---|
| 6,194,252 B1 | 2/2001 | Yamaguchi |
| 6,194,912 B1 | 2/2001 | Or-Bach |
| 6,209,123 B1 | 3/2001 | Maziasz et al. |
| 6,230,299 B1 | 5/2001 | McSherry et al. |
| 6,232,173 B1 | 5/2001 | Hsu et al. |
| 6,240,542 B1 | 5/2001 | Kapur |
| 6,249,902 B1 | 6/2001 | Igusa et al. |
| 6,255,600 B1 | 7/2001 | Schaper |
| 6,255,845 B1 | 7/2001 | Wong et al. |
| 6,262,487 B1 | 7/2001 | Igarashi et al. |
| 6,269,472 B1 | 7/2001 | Garza et al. |
| 6,275,973 B1 | 8/2001 | Wein |
| 6,282,696 B1 | 8/2001 | Garza et al. |
| 6,291,276 B1 | 9/2001 | Gonzalez |
| 6,297,668 B1 | 10/2001 | Schober |
| 6,297,674 B1 | 10/2001 | Kono et al. |
| 6,303,252 B1 | 10/2001 | Lin |
| 6,331,733 B1 | 12/2001 | Or-Bach et al. |
| 6,331,791 B1 | 12/2001 | Huang |
| 6,335,250 B1 | 1/2002 | Egi |
| 6,338,972 B1 | 1/2002 | Sudhindranath et al. |
| 6,347,062 B2 | 2/2002 | Nii et al. |
| 6,356,112 B1 | 3/2002 | Tran et al. |
| 6,359,804 B2 | 3/2002 | Kuriyama et al. |
| 6,370,679 B1 | 4/2002 | Chang et al. |
| 6,378,110 B1 | 4/2002 | Ho |
| 6,380,592 B2 | 4/2002 | Tooher et al. |
| 6,388,296 B1 | 5/2002 | Hsu |
| 6,393,601 B1 | 5/2002 | Tanaka et al. |
| 6,399,972 B1 | 6/2002 | Masuda et al. |
| 6,400,183 B2 | 6/2002 | Yamashita et al. |
| 6,408,427 B1 | 6/2002 | Cong et al. |
| 6,415,421 B2 | 7/2002 | Anderson et al. |
| 6,416,907 B1 | 7/2002 | Winder et al. |
| 6,417,549 B1 | 7/2002 | Oh |
| 6,421,820 B1 | 7/2002 | Mansfield et al. |
| 6,425,112 B1 | 7/2002 | Bula et al. |
| 6,425,117 B1 | 7/2002 | Pasch et al. |
| 6,426,269 B1 | 7/2002 | Haffner et al. |
| 6,436,805 B1 | 8/2002 | Trivedi |
| 6,445,049 B1 | 9/2002 | Iranmanesh |
| 6,445,065 B1 | 9/2002 | Gheewala et al. |
| 6,467,072 B1 | 10/2002 | Yang et al. |
| 6,469,328 B2 | 10/2002 | Yanai et al. |
| 6,470,489 B1 | 10/2002 | Chang et al. |
| 6,476,493 B2 | 11/2002 | Or-Bach et al. |
| 6,477,695 B1 | 11/2002 | Gandhi |
| 6,480,032 B1 | 11/2002 | Aksamit |
| 6,480,989 B2 | 11/2002 | Chan et al. |
| 6,492,066 B1 | 12/2002 | Capodieci et al. |
| 6,496,965 B1 | 12/2002 | van Ginneken et al. |
| 6,504,186 B2 | 1/2003 | Kanamoto et al. |
| 6,505,327 B2 | 1/2003 | Lin |
| 6,505,328 B1 | 1/2003 | van Ginneken et al. |
| 6,507,941 B1 | 1/2003 | Leung et al. |
| 6,509,952 B1 | 1/2003 | Govil et al. |
| 6,514,849 B1 | 2/2003 | Hui et al. |
| 6,516,459 B1 | 2/2003 | Sahouria |
| 6,523,156 B2 | 2/2003 | Cirit |
| 6,525,350 B1 | 2/2003 | Kinoshita et al. |
| 6,536,028 B1 | 3/2003 | Katsioulas et al. |
| 6,543,039 B1 | 4/2003 | Watanabe |
| 6,553,544 B2 | 4/2003 | Tanaka et al. |
| 6,553,559 B2 | 4/2003 | Liebmann et al. |
| 6,553,562 B2 | 4/2003 | Capodieci et al. |
| 6,566,720 B2 | 5/2003 | Aldrich |
| 6,570,234 B1 | 5/2003 | Gardner |
| 6,571,140 B1 | 5/2003 | Wewalaarachchi |
| 6,571,379 B2 | 5/2003 | Takayama |
| 6,574,786 B1 | 6/2003 | Pohlenz et al. |
| 6,578,190 B2 | 6/2003 | Ferguson et al. |
| 6,583,041 B1 | 6/2003 | Capodieci |
| 6,588,005 B1 | 7/2003 | Kobayashi et al. |
| 6,590,289 B2 | 7/2003 | Shively |
| 6,591,207 B2 | 7/2003 | Naya et al. |
| 6,609,235 B2 | 8/2003 | Ramaswamy et al. |
| 6,610,607 B1 | 8/2003 | Armbrust et al. |
| 6,617,621 B1 | 9/2003 | Gheewala et al. |
| 6,620,561 B2 | 9/2003 | Winder et al. |
| 6,621,132 B2 | 9/2003 | Onishi et al. |
| 6,632,741 B1 | 10/2003 | Clevenger et al. |
| 6,633,182 B2 | 10/2003 | Pileggi et al. |
| 6,635,935 B2 | 10/2003 | Makino |
| 6,642,744 B2 | 11/2003 | Or-Bach et al. |
| 6,643,831 B2 | 11/2003 | Chang et al. |
| 6,650,014 B2 | 11/2003 | Kariyazaki |
| 6,661,041 B2 | 12/2003 | Keeth |
| 6,662,350 B2 | 12/2003 | Fried et al. |
| 6,664,587 B2 | 12/2003 | Guterman et al. |
| 6,673,638 B1 | 1/2004 | Bendik et al. |
| 6,677,649 B2 | 1/2004 | Minami et al. |
| 6,687,895 B2 | 2/2004 | Zhang |
| 6,690,206 B2 | 2/2004 | Rikino et al. |
| 6,691,297 B1 | 2/2004 | Misaka et al. |
| 6,700,405 B1 | 3/2004 | Hirairi |
| 6,703,170 B1 | 3/2004 | Pindo |
| 6,709,880 B2 | 3/2004 | Yamamoto et al. |
| 6,714,903 B1 | 3/2004 | Chu et al. |
| 6,732,334 B2 | 5/2004 | Nakatsuka |
| 6,732,338 B2 | 5/2004 | Crouse et al. |
| 6,732,344 B2 | 5/2004 | Sakamoto et al. |
| 6,734,506 B2 | 5/2004 | Oyamatsu |
| 6,737,199 B1 | 5/2004 | Hsieh |
| 6,737,318 B2 | 5/2004 | Murata et al. |
| 6,737,347 B1 | 5/2004 | Houston et al. |
| 6,745,372 B2 | 6/2004 | Cote et al. |
| 6,745,380 B2 | 6/2004 | Bodendorf et al. |
| 6,749,972 B2 | 6/2004 | Yu |
| 6,750,555 B2 | 6/2004 | Satomi et al. |
| 6,760,269 B2 | 7/2004 | Nakase et al. |
| 6,765,245 B2 | 7/2004 | Bansal |
| 6,777,138 B2 | 8/2004 | Pierrat et al. |
| 6,777,146 B1 | 8/2004 | Samuels |
| 6,787,823 B2 | 9/2004 | Shibutani |
| 6,789,244 B1 | 9/2004 | Dasasathyan et al. |
| 6,789,246 B1 | 9/2004 | Mohan et al. |
| 6,792,591 B2 | 9/2004 | Shi et al. |
| 6,792,593 B2 | 9/2004 | Takashima et al. |
| 6,794,677 B2 | 9/2004 | Tamaki et al. |
| 6,794,914 B2 | 9/2004 | Sani et al. |
| 6,795,332 B2 | 9/2004 | Yamaoka et al. |
| 6,795,358 B2 | 9/2004 | Tanaka et al. |
| 6,795,952 B1 | 9/2004 | Stine et al. |
| 6,795,953 B2 | 9/2004 | Bakarian et al. |
| 6,800,883 B2 | 10/2004 | Furuya et al. |
| 6,806,180 B2 | 10/2004 | Cho |
| 6,807,663 B2 | 10/2004 | Cote et al. |
| 6,809,399 B2 | 10/2004 | Ikeda et al. |
| 6,812,574 B2 | 11/2004 | Tomita et al. |
| 6,818,389 B2 | 11/2004 | Fritze et al. |
| 6,818,929 B2 | 11/2004 | Tsutsumi et al. |
| 6,819,136 B2 | 11/2004 | Or-Bach |
| 6,820,248 B1 | 11/2004 | Gan |
| 6,826,738 B2 | 11/2004 | Cadouri |
| 6,834,375 B1 | 12/2004 | Stine et al. |
| 6,841,880 B2 | 1/2005 | Matsumoto et al. |
| 6,850,854 B2 | 2/2005 | Naya et al. |
| 6,854,096 B2 | 2/2005 | Eaton et al. |
| 6,854,100 B1 | 2/2005 | Chuang et al. |
| 6,867,073 B1 | 3/2005 | Enquist |
| 6,871,338 B2 | 3/2005 | Yamauchi |
| 6,872,990 B1 | 3/2005 | Kang |
| 6,877,144 B1 | 4/2005 | Rittman et al. |
| 6,881,523 B2 | 4/2005 | Smith |
| 6,884,712 B2 | 4/2005 | Yelehanka et al. |
| 6,885,045 B2 | 4/2005 | Hidaka |
| 6,889,370 B1 | 5/2005 | Kerzman et al. |
| 6,897,517 B2 | 5/2005 | Houdt et al. |
| 6,897,536 B2 | 5/2005 | Nomura et al. |
| 6,898,770 B2 | 5/2005 | Boluki et al. |
| 6,904,582 B1 | 6/2005 | Rittman et al. |
| 6,918,104 B2 | 7/2005 | Pierrat et al. |
| 6,920,079 B2 | 7/2005 | Shibayama |
| 6,921,982 B2 | 7/2005 | Joshi et al. |

(56) References Cited

U.S. PATENT DOCUMENTS

| | | |
|---|---|---|
| 6,922,354 B2 | 7/2005 | Ishikura et al. |
| 6,924,560 B2 | 8/2005 | Wang et al. |
| 6,928,635 B2 | 8/2005 | Pramanik et al. |
| 6,931,617 B2 | 8/2005 | Sanie et al. |
| 6,953,956 B2 | 10/2005 | Or-Bach et al. |
| 6,954,918 B2 | 10/2005 | Houston |
| 6,957,402 B2 | 10/2005 | Templeton et al. |
| 6,968,527 B2 | 11/2005 | Pierrat |
| 6,974,978 B1 | 12/2005 | Possley |
| 6,977,856 B2 | 12/2005 | Tanaka et al. |
| 6,978,436 B2 | 12/2005 | Cote et al. |
| 6,978,437 B1 | 12/2005 | Rittman et al. |
| 6,980,211 B2 | 12/2005 | Lin et al. |
| 6,992,394 B2 | 1/2006 | Park |
| 6,992,925 B2 | 1/2006 | Peng |
| 6,993,741 B2 | 1/2006 | Liebmann et al. |
| 6,994,939 B1 | 2/2006 | Ghandehari et al. |
| 6,998,722 B2 | 2/2006 | Madurawe |
| 7,003,068 B2 | 2/2006 | Kushner et al. |
| 7,009,862 B2 | 3/2006 | Higeta et al. |
| 7,016,214 B2 | 3/2006 | Kawamata |
| 7,022,559 B2 | 4/2006 | Barnak et al. |
| 7,028,285 B2 | 4/2006 | Cote et al. |
| 7,041,568 B2 | 5/2006 | Goldbach et al. |
| 7,052,972 B2 | 5/2006 | Sandhu et al. |
| 7,053,424 B2 | 5/2006 | Ono |
| 7,063,920 B2 | 6/2006 | Baba-Ali |
| 7,064,068 B2 | 6/2006 | Chou et al. |
| 7,065,731 B2 | 6/2006 | Jacques et al. |
| 7,079,413 B2 | 7/2006 | Tsukamoto et al. |
| 7,079,989 B2 | 7/2006 | Wimer |
| 7,093,208 B2 | 8/2006 | Williams et al. |
| 7,093,228 B2 | 8/2006 | Andreev et al. |
| 7,103,870 B2 | 9/2006 | Misaka et al. |
| 7,105,871 B2 | 9/2006 | Or-Bach et al. |
| 7,107,551 B1 | 9/2006 | de Dood et al. |
| 7,115,343 B2 | 10/2006 | Gordon et al. |
| 7,115,920 B2 | 10/2006 | Bernstein et al. |
| 7,120,882 B2 | 10/2006 | Kotani et al. |
| 7,124,386 B2 | 10/2006 | Smith et al. |
| 7,126,837 B1 | 10/2006 | Banachowicz et al. |
| 7,132,203 B2 | 11/2006 | Pierrat |
| 7,137,092 B2 | 11/2006 | Maeda |
| 7,141,853 B2 | 11/2006 | Campbell et al. |
| 7,143,380 B1 | 11/2006 | Anderson et al. |
| 7,149,999 B2 | 12/2006 | Kahng et al. |
| 7,152,215 B2 | 12/2006 | Smith et al. |
| 7,155,685 B2 | 12/2006 | Mori et al. |
| 7,155,689 B2 | 12/2006 | Pierrat et al. |
| 7,159,197 B2 | 1/2007 | Falbo et al. |
| 7,174,520 B2 | 2/2007 | White et al. |
| 7,175,940 B2 | 2/2007 | Laidig et al. |
| 7,176,508 B2 | 2/2007 | Joshi et al. |
| 7,177,215 B2 | 2/2007 | Tanaka et al. |
| 7,183,611 B2 | 2/2007 | Bhattacharyya |
| 7,185,294 B2 | 2/2007 | Zhang |
| 7,188,322 B2 | 3/2007 | Cohn et al. |
| 7,194,712 B2 | 3/2007 | Wu |
| 7,200,835 B2 | 4/2007 | Zhang et al. |
| 7,202,517 B2 | 4/2007 | Dixit et al. |
| 7,205,191 B2 | 4/2007 | Kobayashi |
| 7,208,794 B2 | 4/2007 | Hofmann et al. |
| 7,214,579 B2 | 5/2007 | Widdershoven et al. |
| 7,219,326 B2 | 5/2007 | Reed et al. |
| 7,221,031 B2 | 5/2007 | Ryoo et al. |
| 7,225,423 B2 | 5/2007 | Bhattacharya et al. |
| 7,227,183 B2 | 6/2007 | Donze et al. |
| 7,228,510 B2 | 6/2007 | Ono |
| 7,231,628 B2 | 6/2007 | Pack et al. |
| 7,235,424 B2 | 6/2007 | Chen et al. |
| 7,243,316 B2 | 7/2007 | White et al. |
| 7,252,909 B2 | 8/2007 | Shin et al. |
| 7,257,017 B2 | 8/2007 | Liaw |
| 7,264,990 B2 | 9/2007 | Rueckes et al. |
| 7,266,787 B2 | 9/2007 | Hughes et al. |
| 7,269,803 B2 | 9/2007 | Khakzadi et al. |
| 7,278,118 B2 | 10/2007 | Pileggi et al. |
| 7,279,727 B2 | 10/2007 | Ikoma et al. |
| 7,287,320 B2 | 10/2007 | Wang et al. |
| 7,294,534 B2 | 11/2007 | Iwaki |
| 7,302,651 B2 | 11/2007 | Allen et al. |
| 7,308,669 B2 | 12/2007 | Buehler et al. |
| 7,312,003 B2 | 12/2007 | Cote et al. |
| 7,315,994 B2 | 1/2008 | Aller et al. |
| 7,327,591 B2 | 2/2008 | Sadra et al. |
| 7,329,938 B2 | 2/2008 | Kinoshita |
| 7,335,966 B2 | 2/2008 | Ihme et al. |
| 7,337,421 B2 | 2/2008 | Kamat |
| 7,338,896 B2 | 3/2008 | Vanhaelemeersch et al. |
| 7,345,909 B2 | 3/2008 | Chang et al. |
| 7,346,885 B2 | 3/2008 | Semmler |
| 7,350,183 B2 | 3/2008 | Cui et al. |
| 7,353,492 B2 | 4/2008 | Gupta et al. |
| 7,358,131 B2 | 4/2008 | Bhattacharyya |
| 7,360,179 B2 | 4/2008 | Smith et al. |
| 7,360,198 B2 | 4/2008 | Rana et al. |
| 7,366,997 B1 | 4/2008 | Rahmat et al. |
| 7,367,008 B2 | 4/2008 | White et al. |
| 7,376,931 B2 | 5/2008 | Kokubun |
| 7,383,521 B2 | 6/2008 | Smith et al. |
| 7,397,260 B2 | 7/2008 | Chanda et al. |
| 7,400,627 B2 | 7/2008 | Wu et al. |
| 7,402,848 B2 | 7/2008 | Chang et al. |
| 7,404,154 B1 | 7/2008 | Venkatraman et al. |
| 7,404,173 B2 | 7/2008 | Wu et al. |
| 7,411,252 B2 | 8/2008 | Anderson et al. |
| 7,421,678 B2 | 9/2008 | Barnes et al. |
| 7,423,298 B2 | 9/2008 | Mariyama et al. |
| 7,424,694 B2 | 9/2008 | Ikeda |
| 7,424,695 B2 | 9/2008 | Tamura et al. |
| 7,424,696 B2 | 9/2008 | Vogel et al. |
| 7,426,710 B2 | 9/2008 | Zhang et al. |
| 7,432,562 B2 | 10/2008 | Bhattacharyya |
| 7,434,185 B2 | 10/2008 | Dooling et al. |
| 7,441,211 B1 | 10/2008 | Gupta et al. |
| 7,442,630 B2 | 10/2008 | Kelberlau et al. |
| 7,444,609 B2 | 10/2008 | Charlebois et al. |
| 7,446,352 B2 | 11/2008 | Becker et al. |
| 7,449,371 B2 | 11/2008 | Kemerling et al. |
| 7,458,045 B2 | 11/2008 | Cote et al. |
| 7,459,792 B2 | 12/2008 | Chen |
| 7,465,973 B2 | 12/2008 | Chang et al. |
| 7,466,607 B2 | 12/2008 | Hollis et al. |
| 7,469,396 B2 | 12/2008 | Hayashi et al. |
| 7,480,880 B2 | 1/2009 | Visweswariah et al. |
| 7,480,891 B2 | 1/2009 | Sezginer |
| 7,484,197 B2 | 1/2009 | Allen et al. |
| 7,485,934 B2 | 2/2009 | Liaw |
| 7,487,475 B1 | 2/2009 | Kriplani et al. |
| 7,492,013 B2 | 2/2009 | Correale, Jr. |
| 7,500,211 B2 | 3/2009 | Komaki |
| 7,502,275 B2 | 3/2009 | Nii et al. |
| 7,503,026 B2 | 3/2009 | Ichiryu et al. |
| 7,504,184 B2 | 3/2009 | Hung et al. |
| 7,506,300 B2 | 3/2009 | Sezginer et al. |
| 7,508,238 B2 | 3/2009 | Yamagami |
| 7,509,621 B2 | 3/2009 | Melvin, III |
| 7,509,622 B2 | 3/2009 | Sinha et al. |
| 7,512,017 B2 | 3/2009 | Chang |
| 7,512,921 B2 | 3/2009 | Shibuya |
| 7,514,355 B2 | 4/2009 | Katase |
| 7,514,959 B2 | 4/2009 | Or-Bach et al. |
| 7,523,429 B2 | 4/2009 | Kroyan et al. |
| 7,527,900 B2 | 5/2009 | Zhou et al. |
| 7,538,368 B2 | 5/2009 | Yano |
| 7,543,262 B2 | 6/2009 | Wang et al. |
| 7,563,701 B2 | 7/2009 | Chang et al. |
| 7,564,134 B2 | 7/2009 | Lee et al. |
| 7,568,174 B2 | 7/2009 | Sezginer et al. |
| 7,569,309 B2 | 8/2009 | Blatchford et al. |
| 7,569,310 B2 | 8/2009 | Wallace et al. |
| 7,569,894 B2 | 8/2009 | Suzuki |
| 7,575,973 B2 | 8/2009 | Mokhlesi et al. |
| 7,598,541 B2 | 10/2009 | Okamoto et al. |

(56) References Cited

U.S. PATENT DOCUMENTS

| | | |
|---|---|---|
| 7,598,558 B2 | 10/2009 | Hashimoto et al. |
| 7,614,030 B2 | 11/2009 | Hsu |
| 7,625,790 B2 | 12/2009 | Yang |
| 7,632,610 B2 | 12/2009 | Wallace et al. |
| 7,640,522 B2 | 12/2009 | Gupta et al. |
| 7,646,651 B2 | 1/2010 | Lee et al. |
| 7,653,884 B2 | 1/2010 | Furnish et al. |
| 7,665,051 B2 | 2/2010 | Ludwig et al. |
| 7,700,466 B2 | 4/2010 | Booth et al. |
| 7,712,056 B2 | 5/2010 | White et al. |
| 7,739,627 B2 | 6/2010 | Chew et al. |
| 7,749,662 B2 | 7/2010 | Matthew et al. |
| 7,755,110 B2 | 7/2010 | Gliese et al. |
| 7,770,144 B2 | 8/2010 | Dellinger |
| 7,791,109 B2 | 9/2010 | Wann et al. |
| 7,802,219 B2 | 9/2010 | Tomar et al. |
| 7,825,437 B2 | 11/2010 | Pillarisetty et al. |
| 7,842,975 B2 | 11/2010 | Becker et al. |
| 7,873,929 B2 | 1/2011 | Kahng et al. |
| 7,882,456 B2 | 2/2011 | Zach |
| 7,888,705 B2 | 2/2011 | Becker et al. |
| 7,898,040 B2 | 3/2011 | Nawaz |
| 7,906,801 B2 | 3/2011 | Becker et al. |
| 7,908,578 B2 | 3/2011 | Becker et al. |
| 7,910,958 B2 | 3/2011 | Becker et al. |
| 7,910,959 B2 | 3/2011 | Becker et al. |
| 7,917,877 B2 | 3/2011 | Singh et al. |
| 7,917,879 B2 | 3/2011 | Becker et al. |
| 7,923,266 B2 | 4/2011 | Thijs et al. |
| 7,923,337 B2 | 4/2011 | Chang et al. |
| 7,923,757 B2 | 4/2011 | Becker et al. |
| 7,926,001 B2 | 4/2011 | Pierrat |
| 7,932,544 B2 | 4/2011 | Becker et al. |
| 7,932,545 B2 | 4/2011 | Becker et al. |
| 7,934,184 B2 | 4/2011 | Zhang |
| 7,939,443 B2 | 5/2011 | Fox et al. |
| 7,943,966 B2 | 5/2011 | Becker et al. |
| 7,943,967 B2 | 5/2011 | Becker et al. |
| 7,948,012 B2 | 5/2011 | Becker et al. |
| 7,948,013 B2 | 5/2011 | Becker et al. |
| 7,952,119 B2 | 5/2011 | Becker et al. |
| 7,956,421 B2 | 6/2011 | Becker |
| 7,958,465 B2 | 6/2011 | Lu et al. |
| 7,962,867 B2 | 6/2011 | White et al. |
| 7,962,879 B2 | 6/2011 | Tang et al. |
| 7,964,267 B1 | 6/2011 | Lyons et al. |
| 7,971,160 B2 | 6/2011 | Osawa et al. |
| 7,989,847 B2 | 8/2011 | Becker et al. |
| 7,989,848 B2 | 8/2011 | Becker et al. |
| 7,992,122 B1 | 8/2011 | Burstein et al. |
| 7,994,583 B2 | 8/2011 | Inaba |
| 8,004,042 B2 | 8/2011 | Yang et al. |
| 8,022,441 B2 | 9/2011 | Becker et al. |
| 8,030,689 B2 | 10/2011 | Becker et al. |
| 8,035,133 B2 | 10/2011 | Becker et al. |
| 8,044,437 B1 | 10/2011 | Venkatraman et al. |
| 8,058,671 B2 | 11/2011 | Becker et al. |
| 8,058,690 B2 | 11/2011 | Chang |
| 8,072,003 B2 | 12/2011 | Becker et al. |
| 8,072,053 B2 | 12/2011 | Li |
| 8,088,679 B2 | 1/2012 | Becker et al. |
| 8,088,680 B2 | 1/2012 | Becker et al. |
| 8,088,681 B2 | 1/2012 | Becker et al. |
| 8,088,682 B2 | 1/2012 | Becker et al. |
| 8,089,098 B2 | 1/2012 | Becker et al. |
| 8,089,099 B2 | 1/2012 | Becker et al. |
| 8,089,100 B2 | 1/2012 | Becker et al. |
| 8,089,101 B2 | 1/2012 | Becker et al. |
| 8,089,102 B2 | 1/2012 | Becker et al. |
| 8,089,103 B2 | 1/2012 | Becker et al. |
| 8,089,104 B2 | 1/2012 | Becker et al. |
| 8,101,975 B2 | 1/2012 | Becker et al. |
| 8,110,854 B2 | 2/2012 | Becker et al. |
| 8,129,750 B2 | 3/2012 | Becker et al. |
| 8,129,751 B2 | 3/2012 | Becker et al. |
| 8,129,752 B2 | 3/2012 | Becker et al. |
| 8,129,754 B2 | 3/2012 | Becker et al. |
| 8,129,755 B2 | 3/2012 | Becker et al. |
| 8,129,756 B2 | 3/2012 | Becker et al. |
| 8,129,757 B2 | 3/2012 | Becker et al. |
| 8,129,819 B2 | 3/2012 | Becker et al. |
| 8,130,529 B2 | 3/2012 | Tanaka |
| 8,134,183 B2 | 3/2012 | Becker et al. |
| 8,134,184 B2 | 3/2012 | Becker et al. |
| 8,134,185 B2 | 3/2012 | Becker et al. |
| 8,134,186 B2 | 3/2012 | Becker et al. |
| 8,138,525 B2 | 3/2012 | Becker et al. |
| 8,161,427 B2 | 4/2012 | Morgenshtein et al. |
| 8,178,905 B2 | 5/2012 | Toubou |
| 8,178,909 B2 | 5/2012 | Venkatraman et al. |
| 8,198,656 B2 | 6/2012 | Becker et al. |
| 8,207,053 B2 | 6/2012 | Becker et al. |
| 8,214,778 B2 | 7/2012 | Quandt et al. |
| 8,217,428 B2 | 7/2012 | Becker et al. |
| 8,225,239 B2 | 7/2012 | Reed et al. |
| 8,225,261 B2 | 7/2012 | Hong et al. |
| 8,245,180 B2 | 8/2012 | Smayling et al. |
| 8,247,846 B2 | 8/2012 | Becker |
| 8,253,172 B2 | 8/2012 | Becker et al. |
| 8,253,173 B2 | 8/2012 | Becker et al. |
| 8,258,547 B2 | 9/2012 | Becker et al. |
| 8,258,548 B2 | 9/2012 | Becker et al. |
| 8,258,549 B2 | 9/2012 | Becker et al. |
| 8,258,550 B2 | 9/2012 | Becker et al. |
| 8,258,551 B2 | 9/2012 | Becker et al. |
| 8,258,552 B2 | 9/2012 | Becker et al. |
| 8,258,581 B2 | 9/2012 | Becker et al. |
| 8,264,007 B2 | 9/2012 | Becker et al. |
| 8,264,008 B2 | 9/2012 | Becker et al. |
| 8,264,009 B2 | 9/2012 | Becker et al. |
| 8,283,701 B2 | 10/2012 | Becker et al. |
| 8,294,212 B2 | 10/2012 | Wang et al. |
| 8,316,327 B2 | 11/2012 | Herold |
| 8,356,268 B2 | 1/2013 | Becker et al. |
| 8,378,407 B2 | 2/2013 | Audzeyeu et al. |
| 8,395,224 B2 | 3/2013 | Becker et al. |
| 8,402,397 B2 | 3/2013 | Robles et al. |
| 8,405,163 B2 | 3/2013 | Becker et al. |
| 8,422,274 B2 | 4/2013 | Tomita et al. |
| 8,436,400 B2 | 5/2013 | Becker et al. |
| 8,453,094 B2 | 5/2013 | Kornachuk et al. |
| 8,575,706 B2 | 11/2013 | Becker et al. |
| 8,667,443 B2 | 3/2014 | Smayling et al. |
| 8,701,071 B2 | 4/2014 | Kornachuk et al. |
| 8,735,995 B2 | 5/2014 | Becker et al. |
| 8,756,551 B2 | 6/2014 | Becker et al. |
| 8,836,045 B2 | 9/2014 | Becker et al. |
| 8,839,162 B2 | 9/2014 | Amundson et al. |
| 8,839,175 B2 | 9/2014 | Smayling et al. |
| 8,847,329 B2 | 9/2014 | Becker et al. |
| 8,863,063 B2 | 10/2014 | Becker et al. |
| 9,202,779 B2 | 12/2015 | Kornachuk et al. |
| 9,336,344 B2 | 5/2016 | Smayling |
| 2001/0049813 A1 | 12/2001 | Chan et al. |
| 2002/0003270 A1 | 1/2002 | Makino |
| 2002/0015899 A1 | 2/2002 | Chen et al. |
| 2002/0030510 A1 | 3/2002 | Kono et al. |
| 2002/0063582 A1 | 5/2002 | Rikino |
| 2002/0068423 A1 | 6/2002 | Park et al. |
| 2002/0079927 A1 | 6/2002 | Katoh et al. |
| 2002/0149392 A1 | 10/2002 | Cho |
| 2002/0166107 A1 | 11/2002 | Capodieci et al. |
| 2002/0194575 A1 | 12/2002 | Allen et al. |
| 2003/0042930 A1 | 3/2003 | Pileggi et al. |
| 2003/0046653 A1 | 3/2003 | Liu |
| 2003/0061592 A1 | 3/2003 | Agrawal et al. |
| 2003/0088839 A1 | 5/2003 | Watanabe |
| 2003/0088842 A1 | 5/2003 | Cirit |
| 2003/0103176 A1 | 6/2003 | Abe et al. |
| 2003/0106037 A1 | 6/2003 | Moniwa et al. |
| 2003/0117168 A1 | 6/2003 | Uneme et al. |
| 2003/0124847 A1 | 7/2003 | Houston et al. |
| 2003/0125917 A1 | 7/2003 | Rich et al. |
| 2003/0126569 A1 | 7/2003 | Rich et al. |

(56) References Cited

U.S. PATENT DOCUMENTS

| | | |
|---|---|---|
| 2003/0145288 A1 | 7/2003 | Wang et al. |
| 2003/0145299 A1 | 7/2003 | Fried et al. |
| 2003/0177465 A1 | 9/2003 | MacLean et al. |
| 2003/0185076 A1 | 10/2003 | Worley |
| 2003/0203287 A1 | 10/2003 | Miyagawa |
| 2003/0229868 A1 | 12/2003 | White et al. |
| 2003/0229875 A1 | 12/2003 | Smith et al. |
| 2004/0029372 A1 | 2/2004 | Jang et al. |
| 2004/0049754 A1 | 3/2004 | Liao et al. |
| 2004/0063038 A1 | 4/2004 | Shin et al. |
| 2004/0115539 A1 | 6/2004 | Broeke et al. |
| 2004/0139412 A1 | 7/2004 | Ito et al. |
| 2004/0145028 A1 | 7/2004 | Matsumoto et al. |
| 2004/0153979 A1 | 8/2004 | Chang |
| 2004/0161878 A1 | 8/2004 | Or-Bach et al. |
| 2004/0164360 A1 | 8/2004 | Nishida et al. |
| 2004/0169201 A1 | 9/2004 | Hidaka |
| 2004/0194050 A1 | 9/2004 | Hwang et al. |
| 2004/0196705 A1 | 10/2004 | Ishikura et al. |
| 2004/0229135 A1 | 11/2004 | Wang et al. |
| 2004/0232444 A1 | 11/2004 | Shimizu |
| 2004/0243966 A1 | 12/2004 | Dellinger |
| 2004/0262640 A1 | 12/2004 | Suga |
| 2005/0009312 A1 | 1/2005 | Butt et al. |
| 2005/0009344 A1 | 1/2005 | Hwang et al. |
| 2005/0012157 A1 | 1/2005 | Cho et al. |
| 2005/0044522 A1 | 2/2005 | Maeda |
| 2005/0055828 A1 | 3/2005 | Wang et al. |
| 2005/0076320 A1 | 4/2005 | Maeda |
| 2005/0087806 A1 | 4/2005 | Hokazono |
| 2005/0093147 A1 | 5/2005 | Tu |
| 2005/0101112 A1 | 5/2005 | Rueckes et al. |
| 2005/0110130 A1 | 5/2005 | Kitabayashi et al. |
| 2005/0135134 A1 | 6/2005 | Yen |
| 2005/0136340 A1 | 6/2005 | Baselmans et al. |
| 2005/0138598 A1 | 6/2005 | Kokubun |
| 2005/0156200 A1 | 7/2005 | Kinoshita |
| 2005/0185325 A1 | 8/2005 | Hur |
| 2005/0189604 A1 | 9/2005 | Gupta et al. |
| 2005/0189614 A1 | 9/2005 | Ihme et al. |
| 2005/0196685 A1 | 9/2005 | Wang et al. |
| 2005/0205894 A1 | 9/2005 | Sumikawa et al. |
| 2005/0212018 A1 | 9/2005 | Schoellkopf et al. |
| 2005/0224982 A1 | 10/2005 | Kemerling et al. |
| 2005/0229130 A1 | 10/2005 | Wu et al. |
| 2005/0251771 A1 | 11/2005 | Robles |
| 2005/0264320 A1 | 12/2005 | Chan et al. |
| 2005/0264324 A1 | 12/2005 | Nakazato |
| 2005/0266621 A1 | 12/2005 | Kim |
| 2005/0268256 A1 | 12/2005 | Tsai et al. |
| 2005/0278673 A1 | 12/2005 | Kawachi |
| 2005/0280031 A1 | 12/2005 | Yano |
| 2006/0038234 A1 | 2/2006 | Liaw |
| 2006/0063334 A1 | 3/2006 | Donze et al. |
| 2006/0070018 A1 | 3/2006 | Semmler |
| 2006/0084261 A1 | 4/2006 | Iwaki |
| 2006/0091550 A1 | 5/2006 | Shimazaki et al. |
| 2006/0095872 A1 | 5/2006 | McElvain |
| 2006/0101370 A1 | 5/2006 | Cui et al. |
| 2006/0112355 A1 | 5/2006 | Pileggi et al. |
| 2006/0113533 A1 | 6/2006 | Tamaki et al. |
| 2006/0113567 A1 | 6/2006 | Ohmori et al. |
| 2006/0120143 A1 | 6/2006 | Liaw |
| 2006/0121715 A1 | 6/2006 | Chang et al. |
| 2006/0123376 A1 | 6/2006 | Vogel et al. |
| 2006/0125024 A1 | 6/2006 | Ishigaki |
| 2006/0131609 A1 | 6/2006 | Kinoshita et al. |
| 2006/0136848 A1 | 6/2006 | Ichiryu et al. |
| 2006/0146638 A1 | 7/2006 | Chang et al. |
| 2006/0151810 A1 | 7/2006 | Ohshige |
| 2006/0158270 A1 | 7/2006 | Gibet et al. |
| 2006/0177744 A1 | 8/2006 | Bodendorf et al. |
| 2006/0181310 A1 | 8/2006 | Rhee |
| 2006/0195809 A1 | 8/2006 | Cohn et al. |
| 2006/0195810 A1 | 8/2006 | Morton |
| 2006/0197557 A1 | 9/2006 | Chung |
| 2006/0206854 A1 | 9/2006 | Barnes et al. |
| 2006/0223302 A1 | 10/2006 | Chang et al. |
| 2006/0248495 A1 | 11/2006 | Sezginer |
| 2006/0261417 A1 | 11/2006 | Suzuki |
| 2006/0277521 A1 | 12/2006 | Chen |
| 2007/0001304 A1 | 1/2007 | Liaw |
| 2007/0002617 A1 | 1/2007 | Houston |
| 2007/0004147 A1 | 1/2007 | Toubou |
| 2007/0007574 A1 | 1/2007 | Ohsawa |
| 2007/0038973 A1 | 2/2007 | Li et al. |
| 2007/0074145 A1 | 3/2007 | Tanaka |
| 2007/0094634 A1 | 4/2007 | Seizginer et al. |
| 2007/0101305 A1 | 5/2007 | Smith et al. |
| 2007/0105023 A1 | 5/2007 | Zhou et al. |
| 2007/0106971 A1 | 5/2007 | Lien et al. |
| 2007/0113216 A1 | 5/2007 | Zhang |
| 2007/0172770 A1 | 7/2007 | Witters et al. |
| 2007/0186196 A1 | 8/2007 | Tanaka |
| 2007/0196958 A1 | 8/2007 | Bhattacharya et al. |
| 2007/0209029 A1 | 9/2007 | Ivonin et al. |
| 2007/0210391 A1 | 9/2007 | Becker et al. |
| 2007/0234252 A1 | 10/2007 | Visweswariah et al. |
| 2007/0234262 A1 | 10/2007 | Uedi et al. |
| 2007/0241810 A1 | 10/2007 | Onda |
| 2007/0256039 A1 | 11/2007 | White |
| 2007/0257277 A1 | 11/2007 | Takeda et al. |
| 2007/0264758 A1 | 11/2007 | Correale |
| 2007/0274140 A1 | 11/2007 | Joshi et al. |
| 2007/0277129 A1 | 11/2007 | Allen et al. |
| 2007/0288882 A1 | 12/2007 | Kniffin et al. |
| 2007/0290361 A1 | 12/2007 | Chen |
| 2007/0294652 A1 | 12/2007 | Bowen |
| 2007/0297249 A1 | 12/2007 | Chang et al. |
| 2008/0001176 A1 | 1/2008 | Gopalakrishnan |
| 2008/0005712 A1 | 1/2008 | Charlebois et al. |
| 2008/0021689 A1 | 1/2008 | Yamashita et al. |
| 2008/0022247 A1 | 1/2008 | Kojima et al. |
| 2008/0046846 A1 | 2/2008 | Chew et al. |
| 2008/0073717 A1* | 3/2008 | Ha .................. H01L 21/743 257/347 |
| 2008/0081472 A1 | 4/2008 | Tanaka |
| 2008/0082952 A1 | 4/2008 | O'Brien |
| 2008/0086712 A1 | 4/2008 | Fujimoto |
| 2008/0097641 A1 | 4/2008 | Miyashita et al. |
| 2008/0098334 A1 | 4/2008 | Pileggi et al. |
| 2008/0098341 A1 | 4/2008 | Kobayashi et al. |
| 2008/0099795 A1 | 5/2008 | Bernstein et al. |
| 2008/0127000 A1 | 5/2008 | Majumder et al. |
| 2008/0127029 A1 | 5/2008 | Graur et al. |
| 2008/0134128 A1 | 6/2008 | Blatchford et al. |
| 2008/0144361 A1 | 6/2008 | Wong |
| 2008/0148216 A1 | 6/2008 | Chan et al. |
| 2008/0163141 A1 | 7/2008 | Scheffer et al. |
| 2008/0168406 A1 | 7/2008 | Rahmat et al. |
| 2008/0211028 A1 | 9/2008 | Suzuki |
| 2008/0216207 A1 | 9/2008 | Tsai |
| 2008/0244494 A1 | 10/2008 | McCullen |
| 2008/0251779 A1 | 10/2008 | Kakoschke et al. |
| 2008/0265290 A1 | 10/2008 | Nielsen et al. |
| 2008/0276105 A1 | 11/2008 | Hoberman et al. |
| 2008/0283910 A1 | 11/2008 | Dreeskornfeld et al. |
| 2008/0285331 A1 | 11/2008 | Torok et al. |
| 2008/0308848 A1 | 12/2008 | Inaba |
| 2008/0308880 A1 | 12/2008 | Inaba |
| 2008/0315258 A1 | 12/2008 | Masuda et al. |
| 2009/0014811 A1 | 1/2009 | Becker et al. |
| 2009/0024974 A1 | 1/2009 | Yamada |
| 2009/0031261 A1 | 1/2009 | Smith et al. |
| 2009/0032898 A1 | 2/2009 | Becker et al. |
| 2009/0032967 A1 | 2/2009 | Becker et al. |
| 2009/0037864 A1 | 2/2009 | Becker et al. |
| 2009/0057780 A1 | 3/2009 | Wong et al. |
| 2009/0075485 A1 | 3/2009 | Ban et al. |
| 2009/0077524 A1 | 3/2009 | Nagamura |
| 2009/0085067 A1 | 4/2009 | Hayashi et al. |
| 2009/0087991 A1 | 4/2009 | Yatsuda et al. |
| 2009/0101940 A1 | 4/2009 | Barrows et al. |
| 2009/0106714 A1 | 4/2009 | Culp et al. |

(56) References Cited

U.S. PATENT DOCUMENTS

| | | |
|---|---|---|
| 2009/0155990 A1 | 6/2009 | Yanagidaira et al. |
| 2009/0181314 A1 | 7/2009 | Shyu et al. |
| 2009/0187871 A1 | 7/2009 | Cork |
| 2009/0206443 A1 | 8/2009 | Juengling |
| 2009/0224408 A1 | 9/2009 | Fox |
| 2009/0228853 A1 | 9/2009 | Hong et al. |
| 2009/0228857 A1 | 9/2009 | Kornachuk et al. |
| 2009/0235215 A1 | 9/2009 | Lavin |
| 2009/0273100 A1 | 11/2009 | Aton et al. |
| 2009/0280582 A1 | 11/2009 | Thijs et al. |
| 2009/0302372 A1 | 12/2009 | Chang et al. |
| 2009/0319977 A1 | 12/2009 | Saxena et al. |
| 2010/0001321 A1 | 1/2010 | Becker et al. |
| 2010/0006897 A1 | 1/2010 | Becker et al. |
| 2010/0006898 A1 | 1/2010 | Becker et al. |
| 2010/0006899 A1 | 1/2010 | Becker et al. |
| 2010/0006900 A1 | 1/2010 | Becker et al. |
| 2010/0006901 A1 | 1/2010 | Becker et al. |
| 2010/0006902 A1 | 1/2010 | Becker et al. |
| 2010/0006903 A1 | 1/2010 | Becker et al. |
| 2010/0006947 A1 | 1/2010 | Becker et al. |
| 2010/0006948 A1 | 1/2010 | Becker et al. |
| 2010/0006950 A1 | 1/2010 | Becker et al. |
| 2010/0006951 A1 | 1/2010 | Becker et al. |
| 2010/0006986 A1 | 1/2010 | Becker et al. |
| 2010/0011327 A1 | 1/2010 | Becker et al. |
| 2010/0011328 A1 | 1/2010 | Becker et al. |
| 2010/0011329 A1 | 1/2010 | Becker et al. |
| 2010/0011330 A1 | 1/2010 | Becker et al. |
| 2010/0011331 A1 | 1/2010 | Becker et al. |
| 2010/0011332 A1 | 1/2010 | Becker et al. |
| 2010/0011333 A1 | 1/2010 | Becker et al. |
| 2010/0012981 A1 | 1/2010 | Becker et al. |
| 2010/0012982 A1 | 1/2010 | Becker et al. |
| 2010/0012983 A1 | 1/2010 | Becker et al. |
| 2010/0012984 A1 | 1/2010 | Becker et al. |
| 2010/0012985 A1 | 1/2010 | Becker et al. |
| 2010/0012986 A1 | 1/2010 | Becker et al. |
| 2010/0017766 A1 | 1/2010 | Becker et al. |
| 2010/0017767 A1 | 1/2010 | Becker et al. |
| 2010/0017768 A1 | 1/2010 | Becker et al. |
| 2010/0017769 A1 | 1/2010 | Becker et al. |
| 2010/0017770 A1 | 1/2010 | Becker et al. |
| 2010/0017771 A1 | 1/2010 | Becker et al. |
| 2010/0017772 A1 | 1/2010 | Becker et al. |
| 2010/0019280 A1 | 1/2010 | Becker et al. |
| 2010/0019281 A1 | 1/2010 | Becker et al. |
| 2010/0019282 A1 | 1/2010 | Becker et al. |
| 2010/0019283 A1 | 1/2010 | Becker et al. |
| 2010/0019284 A1 | 1/2010 | Becker et al. |
| 2010/0019285 A1 | 1/2010 | Becker et al. |
| 2010/0019286 A1 | 1/2010 | Becker et al. |
| 2010/0019287 A1 | 1/2010 | Becker et al. |
| 2010/0019288 A1 | 1/2010 | Becker et al. |
| 2010/0019308 A1 | 1/2010 | Chan et al. |
| 2010/0023906 A1 | 1/2010 | Becker et al. |
| 2010/0023907 A1 | 1/2010 | Becker et al. |
| 2010/0023908 A1 | 1/2010 | Becker et al. |
| 2010/0023911 A1 | 1/2010 | Becker et al. |
| 2010/0025731 A1 | 2/2010 | Becker et al. |
| 2010/0025732 A1 | 2/2010 | Becker et al. |
| 2010/0025733 A1 | 2/2010 | Becker et al. |
| 2010/0025734 A1 | 2/2010 | Becker et al. |
| 2010/0025735 A1 | 2/2010 | Becker et al. |
| 2010/0025736 A1 | 2/2010 | Becker et al. |
| 2010/0032722 A1 | 2/2010 | Becker et al. |
| 2010/0032723 A1 | 2/2010 | Becker et al. |
| 2010/0032724 A1 | 2/2010 | Becker et al. |
| 2010/0032726 A1 | 2/2010 | Becker et al. |
| 2010/0037194 A1 | 2/2010 | Becker et al. |
| 2010/0037195 A1 | 2/2010 | Becker et al. |
| 2010/0096671 A1 | 4/2010 | Becker et al. |
| 2010/0115484 A1 | 5/2010 | Frederick |
| 2010/0203689 A1 | 8/2010 | Bernstein et al. |
| 2010/0224943 A1 | 9/2010 | Kawasaki |
| 2010/0229140 A1 | 9/2010 | Strolenberg et al. |
| 2010/0232212 A1 | 9/2010 | Anderson et al. |
| 2010/0252865 A1 | 10/2010 | Van Der Zanden |
| 2010/0252896 A1 | 10/2010 | Smayling |
| 2010/0264468 A1 | 10/2010 | Xu |
| 2010/0270681 A1 | 10/2010 | Bird et al. |
| 2010/0287518 A1 | 11/2010 | Becker |
| 2010/0301482 A1 | 12/2010 | Schultz et al. |
| 2011/0016909 A1 | 1/2011 | Mirza et al. |
| 2011/0108890 A1 | 5/2011 | Becker et al. |
| 2011/0108891 A1 | 5/2011 | Becker et al. |
| 2011/0154281 A1 | 6/2011 | Zach |
| 2011/0207298 A1 | 8/2011 | Anderson et al. |
| 2011/0260253 A1 | 10/2011 | Inaba |
| 2011/0298025 A1 | 12/2011 | Haensch et al. |
| 2011/0317477 A1 | 12/2011 | Liaw |
| 2012/0012932 A1 | 1/2012 | Perng et al. |
| 2012/0118854 A1 | 5/2012 | Smayling |
| 2012/0273841 A1 | 11/2012 | Quandt et al. |
| 2013/0097574 A1 | 4/2013 | Balabanov et al. |
| 2013/0200465 A1 | 8/2013 | Becker et al. |
| 2013/0200469 A1 | 8/2013 | Becker et al. |
| 2013/0207198 A1 | 8/2013 | Becker et al. |
| 2013/0207199 A1 | 8/2013 | Becker et al. |
| 2013/0254732 A1 | 9/2013 | Kornachuk et al. |
| 2014/0197543 A1 | 7/2014 | Kornachuk et al. |
| 2015/0249041 A1 | 9/2015 | Becker et al. |
| 2015/0270218 A1 | 9/2015 | Becker et al. |

FOREIGN PATENT DOCUMENTS

| | | |
|---|---|---|
| EP | 1394858 | 3/2004 |
| EP | 1670062 | 6/2006 |
| EP | 1833091 | 8/2007 |
| EP | 1730777 | 9/2007 |
| EP | 2251901 | 11/2010 |
| FR | 2860920 | 4/2005 |
| JP | 58-182242 | 10/1983 |
| JP | 58-215827 | 12/1983 |
| JP | 61-182244 | 8/1986 |
| JP | S63-310136 A | 12/1988 |
| JP | H01284115 | 11/1989 |
| JP | 03-165061 | 7/1991 |
| JP | H05152937 A | 6/1993 |
| JP | H05211437 | 8/1993 |
| JP | H05218362 | 8/1993 |
| JP | H07-153927 A | 6/1995 |
| JP | 2684980 | 7/1995 |
| JP | 1995-302706 | 11/1995 |
| JP | 1997-09289251 A | 11/1997 |
| JP | 10-116911 | 5/1998 |
| JP | 1999-045948 | 2/1999 |
| JP | 2001-068558 | 3/2001 |
| JP | 2001-168707 | 6/2001 |
| JP | 2002-026125 | 1/2002 |
| JP | 2002-026296 A | 1/2002 |
| JP | 2002-184870 A | 6/2002 |
| JP | 2001-056463 | 9/2002 |
| JP | 2002-258463 | 9/2002 |
| JP | 2002-289703 | 10/2002 |
| JP | 2001-272228 | 3/2003 |
| JP | 2003-100872 | 4/2003 |
| JP | 2003-264231 | 9/2003 |
| JP | 2004-013920 | 1/2004 |
| JP | 2004-200300 | 7/2004 |
| JP | 2004-241529 | 8/2004 |
| JP | 2004-342757 A | 12/2004 |
| JP | 2005-020008 | 1/2005 |
| JP | 2003-359375 | 5/2005 |
| JP | 2005-135971 A | 5/2005 |
| JP | 2005-149265 | 6/2005 |
| JP | 2005-183793 | 7/2005 |
| JP | 2005-203447 | 7/2005 |
| JP | 2005-268610 | 9/2005 |
| JP | 2006-073696 | 3/2006 |
| JP | 2005-114752 | 10/2006 |
| JP | 2006-303022 A | 11/2006 |
| JP | 2007-012855 | 1/2007 |
| JP | 2007-013060 | 1/2007 |

(56) References Cited

FOREIGN PATENT DOCUMENTS

| | | |
|---|---|---|
| JP | 2007-043049 | 2/2007 |
| JP | 2007-141971 | 6/2007 |
| JP | 2011-515841 | 5/2011 |
| KR | 10-0417093 | 6/1997 |
| KR | 10-1998-087485 | 12/1998 |
| KR | 1998-0084215 A | 12/1998 |
| KR | 10-1999-0057943 A | 7/1999 |
| KR | 2000-0005660 | 1/2000 |
| KR | 10-2000-0028830 A | 5/2000 |
| KR | 10-2002-0034313 | 5/2002 |
| KR | 10-2002-0070777 | 9/2002 |
| KR | 2003-0022006 | 3/2003 |
| KR | 2004-0005609 | 1/2004 |
| KR | 10-2005-0030347 A | 3/2005 |
| KR | 2005-0037965 A | 4/2005 |
| KR | 2006-0108233 A | 10/2006 |
| TW | 386288 | 4/2000 |
| TW | 200709309 | 3/2007 |
| TW | 200709565 | 3/2007 |
| TW | 200811704 A | 3/2008 |
| TW | 200947567 A | 11/2009 |
| WO | WO 2005/104356 | 11/2005 |
| WO | WO 2006/014849 | 2/2006 |
| WO | WO 2006/052738 | 5/2006 |
| WO | WO 2006/090445 | 8/2006 |
| WO | WO 2007/014053 | 2/2007 |
| WO | WO 2007/103587 | 9/2007 |

OTHER PUBLICATIONS

Acar, et al., "A Linear-Centric Simulation Framework for Parametric Fluctuations", 2002, IEEE, Carnegie Mellon University USA, pp. 1-8. Jan. 28, 2002.
Amazawa, et al., "Fully Planarized Four-Level Interconnection with Stacked VLAS Using CMP of Selective CVD-A1 and Insulator and its Application to Quarter Micron Gate Array LSIs", 1995, IEEE, Japan, pp. 473-476, Dec. 10, 1995.
Axelrad et al. "Efficient Full-Chip Yield Analysis Methodology for OPC-Corrected VLSI Design", 2000, International Symposium on Quality Electronic Design (ISQED), Mar. 20, 2000.
Balasinski et al. "Impact of Subwavelength CD Tolerance on Device Performance", 2002, SPIE vol. 4692, Jul. 11, 2002.
Burkhardt, et al., "Dark Field Double Dipole Lithography (DDL) for Back-End-Of-Line Processes", 2007, SPIE Proceeding Series, vol. 6520; Mar. 26, 2007.
Capetti, et al., "Sub k1=0.25 Lithography with Double Patterning Technique for 45nm Technology Node Flash Memory Devices at λ=193nm", 2007, SPIE Proceeding Series, vol. 6520; Mar. 27, 2007.
Capodieci, L., et al., "Toward a Methodology for Manufacturability-Driven Design Rule Exploration," DAC 2004, Jun. 7, 2004, San Diego, CA.
Chandra, et al., "An Interconnect Channel Design Methodology for High Performance Integrated Circuits", 2004, IEEE, Carnegie Mellon University, pp. 1-6, Feb. 16, 2004.
Cheng, et al., "Feasibility Study of Splitting Pitch Technology on 45nm Contact Patterning with 0.93 NA", 2007, SPIE Proceeding Series, vol. 6520; Feb. 25, 2007.
Chow, et al., "The Design of a SRAM-Based Field-Programmable Gate Array—Part II: Circuit Design and Layout", 1999, IEEE, vol. 7 # 3 pp. 321-330, Sep. 1, 1999.
Clark et al. "Managing Standby and Active Mode Leakage Power in Deep Sub-Micron Design", Aug. 9, 2004, ACM.
Cobb et al. "Using OPC to Optimize for Image Slope and Improve Process Window", 2003, SPIE vol. 5130, Apr. 16, 2003.
Devgan "Leakage Issues in IC Design: Part 3", 2003, ICCAD, Nov. 9, 2003.
DeVor, et al., "Statistical Quality Design and Control", 1992, Macmillan Publishing Company, pp. 264-267, Jan. 3, 1992.

Dictionary.com, "channel," in Collins English Dictionary—Complete & Unabridged 10th Edition. Source location: HarperCollins Publishers. Sep. 3, 2009.
Dusa, et al. "Pitch Doubling Through Dual Patterning Lithography Challenges in Integration and Litho Budgets", 2007, SPIE Proceeding Series, vol. 6520; Feb. 25, 2007.
El-Gamal, "Fast, Cheap and Under Control: The Next Implementation Fabric", Jun. 2, 2003, ACM Press, pp. 354-355.
Firedberg, et al., "Modeling Within-Field Gate Length Spatial Variation for Process-Design Co-Optimization," 2005 Proc. of SPIE vol. 5756, pp. 178-188, Feb. 27, 2005.
Frankel, "Quantum State Control Interference Lithography and Trim Double Patterning for 32-16nm Lithography", 2007, SPIE Proceeding Series, vol. 6520; Feb. 27, 2007.
Garg, et al. "Lithography Driven Layout Design", 2005, IEEE VLSI Design 2005, Jan. 3, 2005.
Grobman et al. "Reticle Enhancement Technology Trends: Resource and Manufacturability Implications for the Implementation of Physical Designs" Apr. 1, 2001, ACM.
Grobman et al. "Reticle Enhancement Technology: Implications and Challenges for Physical Design" Jun. 18, 2001, ACM.
Gupta et al. "Enhanced Resist and Etch CD Control by Design Perturbation", Oct. 4, 2006, Society of Photo-Optical Instrumentation Engineers.
Gupta et al. "A Practical Transistor-Level Dual Threshold Voltage Assignment Methodology", 2005, Sixth International Symposium on Quality Electronic Design (ISQED), Mar. 21, 2005.
Gupta et al. "Detailed Placement for Improved Depth of Focus and CD Control", 2005, ACM, Jan. 18, 2005.
Gupta et al. "Joining the Design and Mask Flows for Better and Cheaper Masks", Oct. 14, 2004, Society of Photo-Optical Instrumentation Engineers.
Gupta et al. "Manufacturing-Aware Physical Design", ICCAD 2003, Nov. 9, 2003.
Gupta et al. "Selective Gate-Length Biasing for Cost-Effective Runtime Leakage Control", Jun. 7, 2004, ACM.
Gupta et al. "Wafer Topography-Aware Optical Proximity Correction for Better DOF Margin and CD Control", Apr. 13, 2005, SPIE.
Gupta, Puneet, et al., "Manufacturing-aware Design Methodology for Assist Feature Correctness," SPIE vol. 5756, May 13, 2005.
Ha et al., "Reduction in the Mask Error Factor by Optimizing the Diffraction Order of a Scattering Bar in Lithography," Journal of the Korean Physical Society, vol. 46, No. 5, May 5, 2005, pp. 1213-1217.
Hakko, et al., "Extension of the 2D-TCC Technique to Optimize Mask Pattern Layouts," 2008 Proc. of SPIE vol. 7028, 11 pages, Apr. 16, 2008.
Halpin et al., "Detailed Placement with Net Length Constraints," Publication Year 2003, Proceedings of the 3rd IEEE International Workshop on System-on-Chip for Real-Time Applications, pp. 22-27, Jun. 30, 2003.
Hayashida, et al., "Manufacturable Local Interconnect technology Fully Compatible with Titanium Salicide Process", Jun. 11, 1991, VMIC Conference.
Heng, et al., "A VLSI Artwork Legalization Technique Base on a New Criterion of Minimum Layout Perturbation", Proceedings of 1997 International Symposium on Physical Design, pp. 116-121, Apr. 14, 1997.
Heng, et al., "Toward Through-Process Layout Quality Metrics", Mar. 3, 2005. Society of Photo-Optical Instrumentation Engineers.
Hu, et al., "Synthesis and Placement Flow for Gain-Based Programmable Regular Fabrics", Apr. 6, 2003, ACM Press, pp. 197-203.
Hur et al., "Mongrel: Hybrid Techniques for Standard Cell Placement," Publication Year 2000, IEEE/ACM International Conference on Computer Aided Design, ICCAD-2000, pp. 165-170, Nov. 5, 2000.
Hutton, et al., "A Methodology for FPGA to Structured-ASIC Synthesis and Verification", 2006, EDAA, pp. 64-69, Mar. 6, 2006.
Intel Core Microarchitecture White Paper "Introducing the 45 nm Next-Generation Intel Core Microarchitecture," Intel Corporation, 2007 (best available publication date).

(56) References Cited

OTHER PUBLICATIONS

Jayakumar, et al., "A Metal and VIA Maskset Programmable VLSI Design Methodology using PLAs", 2004, IEEE, pp. 590-594, Nov. 7, 2004.
Jhaveri, T. et al., Maximization of Layout Printability/Manufacturability by Extreme Layout Regularity, Proc. of the SPIE vol. 6156, Feb. 19, 2006.
Kang, S.M., Metal-Metal Matrix (M3) for High-Speed MOS VLSI Layout, IEEE Trans. on CAD, vol. CAD-6, No. 5, Sep. 1, 1987.
Kawashima, et al., "Mask Optimization for Arbitrary Patterns with 2D-TCC Resolution Enhancement Technique," 2008 Proc. of SPIE vol. 6924, 12 pages, Feb. 24, 2008.
Kheterpal, et al., "Design Methodology for IC Manufacturability Based on Regular Logic-Bricks", DAC, Jun. 13, 2005, IEEE/AMC, vol. 6520.
Kheterpal, et al., "Routing Architecture Exploration for Regular Fabrics", DAC, Jun. 7, 2004, ACM Press, pp. 204-207.
Kim, et al., "Double Exposure Using 193nm Negative Tone Photoresist", 2007, SPIE Proceeding Series, vol. 6520; Feb. 25, 2007.
Kim, et al., "Issues and Challenges of Double Patterning Lithography in DRAM", 2007, SPIE Proceeding Series, vol. 6520; Feb. 25, 2007.
Koorapaty, et al., "Exploring Logic Block Granularity for Regular Fabrics", 2004, IEEE, pp. 1-6, Feb. 16, 2004.
Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 1, 2003, Springer-Verlag, vol. 2778, pp. 426-436.
Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2, 2002, Springer-Verlag, vol. 2438 pp. 132-141.
Kuh et al., "Recent Advances in VLSI Layout," Proceedings of the IEEE, vol. 78, Issue 2, pp. 237-263, Feb. 1, 1990.
Lavin et al. "Backend DAC Flows for "Restrictive Design Rules"", 2004, IEEE, Nov. 7, 2004.
Li, et al., "A Linear-Centric Modeling Approach to Harmonic Balance Analysis", 2002, IEEE, pp. 1-6, Mar. 4, 2002.
Li, et al., "Nonlinear Distortion Analysis via Linear-Centric Models", 2003, IEEE, pp. 897-903, Jan. 21, 2003.
Liebmann et al., "Integrating DfM Components into a Cohesive Design-to-Silicon Solution," Proc. SPIE 5756, Design and Process Integration for Microelectronic Manufacturing III, Feb. 27, 2005.
Liebmann et al., "Optimizing Style Options for Sub-Resolution Assist Features," Proc. of SPIE vol. 4346, Feb. 25, 2001, pp. 141-152.
Liebmann, et al., "High-Performance Circuit Design for the RET-Enabled 65nm Technology Node", Feb. 26, 2004, SPIE Proceeding Series, vol. 5379 pp. 20-29.
Liebmann, L. W., Layout Impact of Resolution Enhancement Techniques: Impediment or Opportunity?, International Symposium on Physical Design, Apr. 6, 2003.
Liu et al., "Double Patterning with Multilayer Hard Mask Shrinkage for Sub 0.25 k1 Lithography," Proc. SPIE 6520, Optical Microlithography XX, Feb. 25, 2007.
Mansfield et al., "Lithographic Comparison of Assist Feature Design Strategies," Proc. of SPIE vol. 4000, Feb. 27, 2000, pp. 63-76.
Miller, "Manufacturing-Aware Design Helps Boost IC Yield", Sep. 9, 2004, http://www.eetimes.com/showArticle.jhtml?articleID=47102054.
Mishra, P., et al., "FinFET Circuit Design," Nanoelectronic Circuit Design, pp. 23-54, Dec. 21, 2010.
Mo, et al., "Checkerboard: A Regular Structure and its Synthesis, International Workshop on Logic and Synthesis", Department of Electrical Engineering and Computer Sciences, UC Berkeley, California, pp. 1-7. Jun. 1, 2003.
Mo, et al., "PLA-Based Regular Structures and Their Synthesis", Department of Electrical Engineering and Computer Sciences, IEEE, pp. 723-729, Jun. 1, 2003.
Mo, et al., "Regular Fabrics in Deep Sub-Micron Integrated-Circuit Design", Kluwer Academic Publishers, Entire Book. Jun. 1, 2002.
Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.
Mutoh et al. "1-V Power Supply High-Speed Digital Circuit Technology with Multithreshold-Voltage CMOS", 1995, IEEE, Aug. 1, 1995.
Op de Beek, et al., "Manufacturability issues with Double Patterning for 50nm half pitch damascene applications, using RELACS® shrink and corresponding OPC", 2007, SPIE Proceeding Series, vol. 6520; Feb. 25, 2007.
Or-Bach, "Programmable Circuit Fabrics", Sep. 18, 2001, c-ASIC, pp. 1-36.
Otten, et al., "Planning for Performance", DAC 1998, ACM Inc., pp. 122-127, Jun. 15, 1998.
Pack et al. "Physical & Timing Verification of Subwavelength-Scale Designs—Part I: Lithography Impact on MOSFETs", 2003, SPIE vol. 5042, Feb. 23, 2003.
Pandini, et al., "Congestion-Aware Logic Synthesis", 2002, IEEE, pp. 1-8. Mar. 4, 2002.
Pandini, et al., "Understanding and Addressing the Impact of Wiring Congestion During Technology Mapping", ISPD Apr. 7, 2002, ACM Press, pp. 131-136.
Patel, et al., "An Architectural Exploration of Via Patterned Gate Arrays, ISPD 2003", Apr. 6, 2003, pp. 184-189.
Pham, D., et al., "FinFET Device Junction Formation Challenges," 2006 International Workshop on Junction Technology, pp. 73-77, Aug. 1, 2006.
Pileggi, et al., "Exploring Regular Fabrics to Optimize the Performance-Cost Trade-Offs, Proceedings of the 40th ACM/IEEE Design Automation Conference (DAC) 2003", Jun. 2, 2003, ACM Press, pp. 782-787.
Poonawala, et al., "ILT for Double Exposure Lithography with Conventional and Novel Materials", 2007, SPIE Proceeding Series, vol. 6520; Feb. 25, 2007.
Qian et al. "Advanced Physical Models for Mask Data Verification and Impacts on Physical Layout Synthesis" 2003 IEEE, Mar. 24, 2003.
Ran, et al., "An Integrated Design Flow for a Via-Configurable Gate Array", 2004, IEEE, pp. 582-589, Nov. 7, 2004.
Ran, et al., "Designing a Via-Configurable Regular Fabric", Custom Integrated Circuits Conference (CICC). Proceedings of the IEEE, Oct. 1, 2004. pp. 423-426.
Ran, et al., "On Designing Via-Configurable Cell Blocks for Regular Fabrics" Proceedings of the Design Automation Conference (DAC) 2004, Jun. 7, 2004, ACM Press, s 198-203.
Ran, et al., "The Magic of a Via-Configurable Regular Fabric", Proceedings of the IEEE International Conference on Computer Design (ICCD) Oct. 11, 2004.
Ran, et al., "Via-Configurable Routing Architectures and Fast Design Mappability Estimation for Regular Fabrics", 2005, IEEE, pp. 25-32, Sep. 1, 2006.
Reis, et al., "Physical Design Methodologies for Performance Predictability and Manufacturability", Apr. 14, 2004, ACM Press, pp. 390-397.
Robertson, et al., "The Modeling of Double Patterning Lithographic Processes", 2007, SPIE Proceeding Series, vol. 6520; Feb. 25, 2007.
Rosenbluth, et al., "Optimum Mask and Source Patterns to Print a Given Shape," 2001 Proc. of SPIE vol. 4346, pp. 486-502, Feb. 25, 2001.
Rovner, "Design for Manufacturability in Via Programmable Gate Arrays", May 1, 2003, Graduate School of Carnegie Mellon University.
Sengupta, "An Integrated CAD Framework Linking VLSI Layout Editors and Process Simulators", 1998, Thesis for Rice University, pp. 1-101, Nov. 1, 1998.
Sengupta, et al., "An Integrated CAD Framework Linking VLSI Layout Editors and Process Simulators", 1996, SPIE Proceeding Series, vol. 2726; pp. 244-252, Mar. 10, 1996.

(56) References Cited

OTHER PUBLICATIONS

Sherlekar, "Design Considerations for Regular Fabrics", Apr. 18, 2004, ACM Press, pp. 97-102.
Shi et al., "Understanding the Forbidden Pitch and Assist Feature Placement," Proc. of SPIE vol. 4562, pp. 968-979. Mar. 11, 2002.
Smayling et al., "APF Pitch Halving for 22 nm Logic Cells Using Gridded Design Rules," Proceedings of SPIE, USA, vol. 6925, Jan. 1, 2008, pp. 69251E-1-69251E-7.
Socha, et al., "Simultaneous Source Mask Optimization (SMO)," 2005 Proc. of SPIE vol. 5853, pp. 180-193, Apr. 13, 2005.
Sreedhar et al. "Statistical Yield Modeling for Sub-Wavelength Lithography", 2008 IEEE, Oct. 28, 2008.
Stapper, "Modeling of Defects in Integrated Circuit Photolithographic Patterns", Jul. 1, 1984, IBM, vol. 28 # 4. pp. 461-475.
Taylor, et al., "Enabling Energy Efficiency in Via-Patterned Gate Array Devices", Jun. 7, 2004, ACM Press, pp. 874-877.
Tian et al. "Model-Based Dummy Feature Placement for Oxide Chemical_Mechanical Polishing Manufacturability" IEEE, vol. 20, Issue 7, Jul. 1, 2001.
Tong, et al., "Regular Logic Fabrics for a Via Patterned Gate Array (VPGA), Custom Integrated Circuits Conference", Sep. 21, 2003, Proceedings of the IEEE, pp. 53-56.
Vanleenhove, et al., "A Litho-Only Approach to Double Patterning", 2007, SPIE Proceeding Series, vol. 6520; Feb. 25, 2007.
Wang, et al., "Performance Optimization for Gridded-Layout Standard Cells", vol. 5567 SPIE, Sep. 13, 2004.
Wang, J. et al., Standard Cell Layout with Regular Contact Placement, IEEE Trans. on Semicon. Mfg., vol. 17, No. 3, Aug. 9, 2004.
Webb, Clair, "45nm Design for Manufacturing," Intel Technology Journal, vol. 12, Issue 02, Jun. 17, 2008, ISSN 1535-864X, pp. 121-130.
Webb, Clair, "Layout Rule Trends and Affect upon CPU Design", vol. 6156 SPIE, Feb. 19, 2006.
Wenren, et al., "The Improvement of Photolithographic Fidelity of Two-dimensional Structures Though Double Exposure Method", 2007, SPIE Proceeding Series, vol. 6520; Feb. 25, 2007.
Wilcox, et al., "Design for Manufacturability: A Key to Semiconductor Manufacturing Excellence", 1998 IEEE, pp. 308-313, Sep. 23, 1998.
Wong, et al., "Resolution Enhancement Techniques and Design for Manufacturability: Containing and Accounting for Variabilities in Integrated Circuit Creation," J. Micro/Nanolith. MEMS MOEMS, Sep. 27, 2007, vol. 6(3), 2 pages.
Wu, et al., "A Study of Process Window Capabilities for Two-dimensional Structures under Double Exposure Condition", 2007, SPIE Proceeding Series, vol. 6520; Feb. 25, 2007.
Xiong, et al., "The Constrained Via Minimization Problem for PCB and VLSI Design", 1988 ACM Press/IEEE, pp. 573-578, Jun. 12, 1998.
Yamamaoto, et al., "New Double Exposure Technique without Alternating Phase Shift Mask", SPIE Proceeding Series, vol. 6520; Feb. 25, 2007.
Yamazoe, et al., "Resolution Enhancement by Aerial Image Approximation with 2D-TCC," 2007 Proc. of SPIE vol. 6730, 12 pages, Sep. 17, 2007.
Yang, et al., "Interconnection Driven VLSI Module Placement Based on Quadratic Programming and Considering Congestion Using LFF Principles", 2004 IEEE, pp. 1243-1247, Jun. 27, 2004.
Yao, et al., "Multilevel Routing With Redundant Via Insertion", Oct. 23, 2006, IEEE, pp. 1148-1152.
Yu, et al., "True Process Variation Aware Optical Proximity Correction with Variational Lithography Modeling and Model Calibration," J. Micro/Nanolith. MEMS MOEMS, Sep. 11, 2007, vol. 6(3), 16 pages.
Zheng, et al."Modeling and Analysis of Regular Symmetrically Structured Power/Ground Distribution Networks", DAC, Jun. 10, 2002, ACM Press, pp. 395-398.
Zhu, et al., "A Stochastic Integral Equation Method for Modeling the Rough Surface Effect on Interconnect Capacitance", 2004 IEEE, Nov. 7, 2004.
Zhu, et al., "A Study of Double Exposure Process Design with Balanced Performance Parameters for Line/Space Applications", 2007, SPIE Proceeding Series, vol. 6520; Feb. 25, 2007.
Zuchowski, et al., "A Hybrid ASIC and FPGA Architecture", 2003 IEEE, pp. 187-194, Nov. 10, 2002.
Alam, Syed M. et al., "A Comprehensive Layout Methodology and Layout-Specific Circuit Analyses for Three-Dimensional Integrated Circuits," Mar. 21, 2002.
Alam, Syed M. et al., "Layout-Specific Circuit Evaluation in 3-D Integrated Circuits," May 1, 2003.
Aubusson, Russel, "Wafer-Scale Integration of Semiconductor Memory," Apr. 1, 1979.
Bachtold, "Logic Circuits with Carbon," Nov. 9, 2001.
Baker, R. Jacob, "CMOS: Circuit Design, Layout, and Simulation (2nd Edition)," Nov. 1, 2004.
Baldi et al., "A Scalable Single Poly EEPROM Cell for Embedded Memory Applications," pp. 1-4, Fig. 1, Sep. 1, 1997.
Cao, Ke, "Design for Manufacturing (DFM) in Submicron VLSI Design," Aug. 1, 2007.
Capodieci, Luigi, "From Optical Proximity Correction to Lithography-Driven Physical Design (1996-2006): 10 years of Resolution Enhancement Technology and the roadmap enablers for the next decade," Proc. SPIE 6154, Optical Microlithography XIX, 615401, Mar. 20, 2006.
Chang, Leland et al., "Stable SRAM Cell Design for the 32 nm Node and Beyond," Jun. 16, 2005.
Cheung, Peter, "Layout Design," Apr. 4, 2004.
Chinnery, David, "Closing the Gap Between ASIC & Custom: Tools and Techniques for High-Performance ASIC Design," Jun. 30, 2002.
Chou, Dyiann et al., "Line End Optimization through Optical Proximity Correction (OPC): A Case Study," Feb. 19, 2006.
Clein, Dan, "CMOS IC Layout: Concepts, Methodologies, and Tools," Dec. 22, 1999.
Cowell, "Exploiting Non-Uniform Access Time," Jul. 1, 2003.
Das, Shamik, "Design Automation and Analysis of Three-Dimensional Integrated Circuits," May 1, 2004.
Dehaene, W. et al., "Technology-Aware Design of SRAM Memory Circuits," Mar. 1, 2007.
Deng, Liang et al., "Coupling-aware Dummy Metal Insertion for Lithography," p. 1, col. 2, Jan. 23, 2007.
Devoivre et al., "Validated 90nm CMOS Technology Platform with Low-k Copper Interconnects for Advanced System-on-Chip (SoC)," Jul. 12, 2002.
Enbody, R. J., "Near-Optimal n-Layer Channel Routing," Jun. 29, 1986.
Ferretti, Marcos et al., "High Performance Asynchronous ASIC Back-End Design Flow Using Single-Track Full-Buffer Standard Cells," Apr. 23, 2004.
Garg, Manish et al., "Litho-driven Layouts for Reducing Performance Variability," p. 2, Figs. 2b-2c, May 23, 2005.
Greenway, Robert et al., "32nm 1-D Regular Pitch SRAM Bitcell Design for Interference-Assisted Lithography," Oct. 6, 2008.
Gupta et al., "Modeling Edge Placement Error Distribution in Standard Cell Library," Feb. 23, 2006.
Grad, Johannes et al., "A standard cell library for student projects," Proceedings of the 2003 IEEE International Conference on Microelectronic Systems Education, Jun. 2, 2003.
Hartono, Roy et al., "Active Device Generation for Automatic Analog Layout Retargeting Tool," May 13, 2004.
Hartono, Roy et al., "IPRAIL—Intellectual Property Reuse-based Analog IC Layout Automation," Mar. 17, 2003.
Hastings, Alan, "The Art of Analog Layout (2nd Edition)," Jul. 4, 2005.
Hurat et al., "A Genuine Design Manufacturability Check for Designers," Feb. 19, 2006.
Institute of Microelectronic Systems, "Digital Subsystem Design," Oct. 13, 2006.
Ishida, M. et al., "A Novel 6T-SRAM Cell Technology Designed with Rectangular Patterns Scalable beyond 0.18 pm Generation and Desirable for Ultra High Speed Operation," IEDM 1998, Dec. 6, 1998.

(56) References Cited

OTHER PUBLICATIONS

Jakusovszky, "Linear IC Parasitic Element Simulation Methodology," Oct. 1, 1993.
Jangkrajarng, Nuttorn et al., "Template-Based Parasitic-Aware Optimization and Retargeting of Analog and RF Integrated Circuit Layouts," Nov. 5, 2006.
Kahng, Andrew B., "Design Optimizations DAC-2006 DFM Tutorial, part V)," Jul. 24, 2006.
Kang, Sung-Mo et al., "CMOS Digital Integrated Circuits Analysis & Design," Oct. 29, 2002.
Kottoor, Mathew Francis, "Development of a Standard Cell Library based on Deep Sub-Micron SCMOS Design Rules using Open Source Software (MS Thesis)," Aug. 1, 2005.
Kubicki, "Intel 65nm and Beyond (or Below): IDF Day 2 Coverage (available at http://www.anandtech.com/show/1468/4)," Sep. 9, 2004.
Kuhn, Kelin J., "Reducing Variation in Advanced Logic Technologies: Approaches to Process and Design for Manufacturability of Nanoscale CMOS," p. 27, Dec. 12, 2007.
Kurokawa, Atsushi et al., "Dummy Filling Methods for Reducing Interconnect Capacitance and Number of Fills, Proc. of ISQED," pp. 586-591, Mar. 21, 2005.
Lavin, Mark, "Open Access Requirements from RDR Design Flows," Nov. 11, 2004.
Liebmann, Lars et al., "Layout Methodology Impact of Resolution Enhancement Techniques," pp. 5-6, Apr. 6, 2003.
Liebmann, Lars et al., "TCAD development for lithography resolution enhancement," Sep. 1, 2001.
Lin, Chung-Wei et al., "Recent Research and Emerging Challenges in Physical Design for Manufacturability/Reliability," Jan. 26, 2007.
McCullen, Kevin W., "Layout Techniques for Phase Correct and Gridded Wiring," pp. 13, 17, Fig. 5, Dec. 1, 2006.
MOSIS, "Design Rules MOSIS Scalable CMOS (SCMOS) (Revision 8.00)," Oct. 4, 2004.
MOSIS, "MOSIS Scalable CMOS (SCMOS) Design Rules (Revision 7.2)," Jan. 1, 1995.
Muta et al., "Manufacturability-Aware Design of Standard Cells," pp. 2686-2690, Figs. 3, 12, Dec. 1, 2007.
Na, Kee-Yeol et al., "A Novel Single Polysilicon EEPROM Cell With a Polyfinger Capacitor," Nov. 30, 2007.
Pan et al., "Redundant Via Enhanced Maze Routing for Yield Improvement," DAC 2005, Jan. 18, 2005.
Park, Tae Hong, "Characterization and Modeling of Pattern Dependencies in Copper Interconnects for Integrated Circuits," Ph.D. Thesis, MIT, May 24, 2002.
Patel, Chetan, "An Architectural Exploration of Via Patterned Gate Arrays (CMU Master's Project)," May 1, 2003.
Pease, R. Fabian et al., "Lithography and Other Patterning Techniques for Future Electronics," IEEE 2008, vol. 96, Issue 2, Jan. 16, 2008.
Serrano, Diego Emilio, Pontificia Universidad Javeriana Facultad De Ingenieria, Departamento De Electronica, "Diseño De Multiplicador 4×8 en VLSI, Introduccion al VLSI," 2006 (best available publication date).
Pramanik, "Impact of layout on variability of devices for sub 90nm technologies," 2004 (best available publication date).
Pramanik, Dipankar et al., "Lithography-driven layout of logic cells for 65-nm node (SPIE Proceedings vol. 5042)," Jul. 10, 2003.
Roy et al., "Extending Aggressive Low-K1 Design Rule Requirements for 90 and 65 Nm Nodes Via Simultaneous Optimization of Numerical Aperture, Illumination and Optical Proximity Correction," J.Micro/Nanolith, MEMS MOEMS, 4(2), 023003, Apr. 26, 2005.
Saint, Christopher et al., "IC Layout Basics: A Practical Guide," Chapter 3, Nov. 5, 2001.
Saint, Christopher et al., "IC Mask Design: Essential Layout Techniques," May 24, 2002.
Scheffer, "Physical CAD Changes to Incorporate Design for Lithography and Manufacturability," Feb. 4, 2004.
Smayling, Michael C., "Part 3: Test Structures, Test Chips, In-Line Metrology & Inspection," Jul. 24. 2006.
Spence, Chris, "Full-Chip Lithography Simulation and Design Analysis: How OPC is changing IC Design, Emerging Lithographic Technologies IX," May 6, 2005.
Subramaniam, Anupama R., "Design Rule Optimization of Regular layout for Leakage Reduction in Nanoscale Design," pp. 474-478, Mar. 24, 2008.
Tang, C. W. et al., "A compact large signal model of LDMOS," Solid-State Electronics 46(2002) 2111-2115, May 17, 2002.
Taylor, Brian et al., "Exact Combinatorial Optimization Methods for Physical Design of Regular Logic Bricks," Jun. 8, 2007.
Tian, Ruiqi et al., "Dummy Feature Placement for Chemical-Mechanical Uniformity in a Shallow Trench Isolation Process," IEEE Trans. on Computer-Aided Design of Integrated Circuits and Systems, vol. 21, No. 1, pp. 63-71, Jan. 1, 2002.
Tian, Ruiqi et al., "Proximity Dummy Feature Placement and Selective Via Sizing for Process Uniformity in a Trench-First-Via-Last Dual-Inlaid Metal Process," Proc. of IITC, pp. 48-50, Jun. 6, 2001.
Torres, J. A. et al., "RET Compliant Cell Generation for sub-130nm Processes," SPIE vol. 4692, Mar. 6, 2002.
Uyemura, John P., "Introduction to VLSI Circuits and Systems," Chapters 2, 3, 5, and Part 3, Jul. 30, 2001.
Uyemura, John, "Chip Design for Submicron VLSI: CMOS Layout and Simulation," Chapters 2-5, 7-9, Feb. 8, 2005.
Verhaegen et al., "Litho Enhancements for 45nm-nod MuGFETs," Aug. 1, 2005.
Wong, Ban P., "Bridging the Gap between Dreams and Nano-Scale Reality (DAC-2006 DFM Tutorial)," Jul. 28, 2006.
Wang, Dunwei et al., "Complementary Symmetry Silicon Nanowire Logic: Power-Efficient Inverters with Gain," Aug. 17, 2006.
Wang, Jun et al., "Effects of grid-placed contacts on circuit performance," pp. 135-139, Figs. 2, 4-8, Feb. 28, 2003.
Wang, Jun et al., "Standard cell design with regularly placed contacts and gates (SPIE vol. 5379)," Feb. 22, 2004.
Wang, Jun et al., "Standard cell design with resolution-enhancement-technique-driven regularly placed contacts and gates," J. Micro/Nanolith, MEMS MOEMS, 4(1), 013001, Mar. 16, 2005.
Watson, Bruce, "Challenges and Automata Applications in Chip-Design Software," pp. 38-40, Jul. 16, 2007.
Weste, Neil et al., "CMOS VLSI Design: A Circuits and Systems Perspective, 3rd Edition," May 21, 2004.
Wingerden, Johannes van, "Experimental verification of improved printability for litho-driven designs," Mar. 14, 2005.
Wong, Alfred K., "Microlithography: Trends, Challenges, Solutions,, and Their Impact on Design," Micro IEEE vol. 23, Issue 2, Apr. 29, 2003.
Xu, Gang, "Redundant-Via Enhanced Maze Routing for Yield Improvement," Proceedings of ASP-DAC 2005, Jan. 18, 2005.
Yang, Jie, "Manufacturability Aware Design," pp. 93, 102, Fig. 5.2, Jan. 16, 2008.
Yongshun, Wang et al., "Static Induction Devices with Planar Type Buried Gate," Chinese Journal of Semiconductors, vol. 25, No. 2, Feb. 1, 2004.
Zobrist, George (editor), "Progress in Computer Aided VLSI Design: Implementations (Ch. 5)," Ablex Publishing Corporation, Feb. 1, 1990.
Petley, Graham, "VLSI and ASIC Technology Standard Cell Library Design," from website www.vlsitechnology.org, Jan. 11, 2005.
Liebmann, Lars, et al., "Layout Optimization at the Pinnacle of Optical Lithography," Design and Process Integration for Microelectronic Manufacturing II, Proceedings of SPIE vol. 5042, Jul. 8, 2003.
Kawasaki, H., et al., "Challenges and Solutions of FinFET Integration in an SRAM Cell and a Logic Circuit for 22 nm node and beyond," Electron Devices Meeting (IEDM), 2009 IEEE International, IEEE, Piscataway, NJ, USA, Dec. 7, 2009, pp. 1-4.

* cited by examiner

| Additional Interconnect Layers (225) | |
|---|---|
| Metal 4 (223) | |
| Via 3 (221) | |
| Metal 3 (219) | |
| Via 2 (217) | |
| Metal 2 (215) | |
| Via 1 (213) | |
| Metal 1 (211) | |
| Diffusion Contacts (205) | Gate Electrode Contacts (209) |
| | Gate Electrode Features (207) |
| Diffusion Regions (203) | Isolation Regions |

Substrate (201)

Figure 1

METHODS, STRUCTURES, AND DESIGNS FOR SELF-ALIGNING LOCAL INTERCONNECTS USED IN INTEGRATED CIRCUITS

CLAIM OF PRIORITY

This application is a continuation application under 35 U.S.C. 120 of prior U.S. patent application Ser. No. 14/188,321, filed on Feb. 24, 2014, which is a continuation application under 35 U.S.C. 120 of prior U.S. patent application Ser. No. 13/189,433, filed on Jul. 22, 2011, issued as U.S. Pat. No. 8,680,626, on Mar. 25, 2014, which is a continuation application under 35 U.S.C. 120 of prior U.S. patent application Ser. No. 12/814,411, filed Jun. 11, 2010, issued as U.S. Pat. No. 7,994,545, on Aug. 9, 2011, which is a divisional application under 35 U.S.C. 121 of prior U.S. application Ser. No. 11/969,854, filed Jan. 4, 2008, issued as U.S. Pat. No. 7,763,534, on Jul. 27, 2010, which claims the priority benefit of U.S. Provisional Patent Application No. 60/983,091, filed Oct. 26, 2007. The disclosure of each above-identified patent application and patent is incorporated herein by reference in its entirety for all purposes.

CROSS-REFERENCE AND RELATED APPLICATIONS

This application is related to U.S. patent application Ser. No. 11/683,402, filed on Mar. 7, 2007, entitled "Dynamic Array Architecture," by Becker et al., now U.S. Pat. No. 7,446,352, issued on Nov. 4, 2008, which claims priority to U.S. Provisional Patent Application No. 60/781,288, filed on Mar. 9, 2006. The disclosure of each above-identified patent application and patent is incorporated herein by reference in its entirety.

BACKGROUND

The present invention generally relates to integrated circuits and particularly, but without limitation, to the design and fabrication of self-aligned local interconnects for interconnecting semiconductor devices in an integrated circuit.

As semiconductor technology continues to advance, a continuing trend is towards ultra large-scale integration with the fabrication of smaller and smaller integrated circuits containing more and more devices on a single semiconductor chip.

Scaling of devices has long been used to increase the density of logic and memory functions. This scaling has been possible because of improvements in photolithography and other process steps. However, as optical lithography reaches the end of the cost effective improvement curve, other approaches to improve density are needed.

Interconnect provides connections between NMOS and PMOS transistors and other components such as resistors and capacitors in a semiconductor chip. Interconnects are generally fabricated by first depositing and planarizing dielectric layers on the semiconductor devices and passive components. Next, feed-thrus are formed in the dielectric layers. Finally, conductors are formed and routed over the dielectric layers to connect the feed-thrus. A stack is formed of multiple layers of dielectrics, feed-thrus, and conductors to complete the circuit node interconnection. This process of fabricating interconnects is generally termed "metallization." As the density of devices on the semiconductor chip is increased, the complexity of metallization has also increased.

Local interconnects can be a special form of interconnects. Local interconnects are generally used for short distances, such as within a functional cell. Conventional circuits use the same interconnect levels for both local and global connections.

Traditionally, diffusion regions to Vdd and Vss contacts require fabricating L shaped or T shaped bent diffusion regions extending towards Vdd and Vss lines from PMOS and NMOS diffusion regions, respectively. The bent regions are not preferred because they require more costly photolithography equipment to fabricate. Alternatively, Vdd and Vss rails may be extended over rectangular diffusion regions and contacts may be formed to the diffusion regions. However, it is inefficient to have the power rails over the diffusion regions because they occupy tracks that could be used for signals and they are no longer located at a cell boundary so they can not be shared between vertically adjacent cells.

It is within this context that embodiments of the invention arise.

SUMMARY

Broadly speaking, embodiments of the present invention defines methods of fabrication, structures, layouts, design methodologies, and conductive structures to enable the definition of local interconnects of a circuit. The local interconnects, in accordance with embodiments of the present invention, are referred to herein as "self-aligned" local interconnects, as they align, in response to the fabrication process, in channels or regions between or beside gate electrodes. The local interconnects, are ones defined in the self-aligned orientation that can be patterned to remove some of the material, leaving only those portions that are needed to complete selected local interconnections.

One of many beneficial features is that a circuit layout can be done with rectangular or substantially diffusion regions. These rectangular diffusion regions can be fabricated with better fidelity than diffusion regions with bends or extensions. Additionally, the self-aligned local interconnects can be used to make the power connections (i.e., Vdd and Vss) with the source and drains of transistors, without requiring diffusion region extensions. Self-aligned local interconnects can also eliminate the need for certain contacts to transistor diffusion regions. As will be described in greater detail below, the local interconnects make direct and integral contact with the diffusion regions. Thus, the local interconnects provide previously unavailable metal routing on the substrate level, which serves to eliminate the need for certain first metal tracks, certain vias, and in some cases, a second metal track (e.g., for connections between NMOS transistor source/drains and PMOS transistor source/drains).

Still further, by eliminating traditional diffusion contacts in active transistor channels, the strain layer in the diffusion regions are not altered. This improves the effectiveness of mobility enhancing strain layers. In addition, allowing the diffusion contacts to be connected to a wider choice of metal-1 tracks gives more flexibility in circuit design, thus enhancing layout and making for more efficient place & route.

In one embodiment, a method for designing local interconnect structures is disclosed. The method includes designing diffusion regions to be in a substrate. Some of a plurality of gates are designed to be active gates and some of the plurality of gates are designed to be formed over isolation regions. The method includes designing the plurality of gates in a regular and repeating alignment along a same direction, and each of the plurality of gates are designed to have dielectric spacers. The method also includes designing a local interconnect layer between or adjacent to the plurality of gates. The local interconnect layer is conductive and disposed over the substrate to allow electrical contact and interconnection with or to some of the diffusion regions of the active gates. The local interconnect layer is self-aligned by the dielectric spacers of the plurality of gates.

The advantages of the present inventions are numerous. Most notably, the self-aligned local interconnects permit diffusion region with fewer bends, extensions, etc. The self-aligned local interconnects also reduces the number of contacts needed, metal 1 track usage, number of vias needed to make contact to diffusions, and in turn metal 2 track usage. Thus, more tracks are opened up for routing. Furthermore, use of the self-aligned local interconnects reduces use of metal to diffusion contacts, which reduces interference with strain materials on the substrate. Thus, by eliminating most metal to diffusion regions, device efficiency is boosted significantly. The self-aligned local interconnect also provide more flexibility in metal-1 track assignments for connections within a cell or cells, improving density and simplifying subsequent place and route.

Another advantage of the self-aligning process for the fabrication of local interconnects over photo aligned process is that the fabrication of the self-aligned local interconnects does not require dependence on the lithography for aligning the local interconnects with the side wall spacers of the gates. It is well known that the lithography has a margin of error, hence, even if minor shift in the local interconnect layer towards the side wall spacers of the gates in the integrated circuit may "short" the device or will result in an unwanted outcome.

In one embodiment, a semiconductor device is disclosed. The semiconductor device includes a substrate portion and a plurality of diffusion regions formed in the substrate portion to define source and drain regions of transistor devices. The semiconductor device also includes a gate electrode layer including a number of linear-shaped conductive structures each defined to extend lengthwise over the substrate portion in only a single common direction. Portions of some of the linear-shaped conductive structures that extend over the plurality of diffusion regions form a plurality of gate electrode segments of corresponding transistor devices. The semiconductor device also includes local interconnect metal disposed on the substrate portion between the linear-shaped conductive structures of the gate electrode layer. The local interconnect metal is configured to form connections to, from, or between the source and drain regions, or between selected source or drain regions and one or more of the linear-shaped conductive structures that form one or more gate electrode segments. The local interconnect metal is disposed beneath an inter-metal dielectric material.

In another embodiment, a semiconductor device is disclosed. The semiconductor device includes a substrate portion and a number of diffusion regions formed within the substrate portion. The number of diffusion regions are separated from each other by a number of isolation regions formed within the substrate portion. The semiconductor device also includes a gate electrode layer defined over the substrate portion to include a number of linear-shaped conductive structures each formed to extend in a single common direction over the substrate portion. Portions of some of the linear-shaped conductive structures extend over one or more of the number of diffusion regions formed within the substrate to form gate electrodes. The gate electrode layer further includes dielectric side spacers formed along side surfaces of the linear-shaped conductive structures. Channels exist within the gate electrode layer between dielectric side spacers formed along facing side surfaces of each pair of adjacently disposed linear-shaped conductive structures. The semiconductor device further includes a number of local interconnect structures disposed on the substrate regions within portions of one or more of the channels. Portions of the number of local interconnect structures are self-aligned according to disposal of the linear-shaped conductive structures and have a corresponding linear-shape along the single common direction in which the number of linear-shaped conductive structures extend.

In another embodiment, an integrated circuit includes a gate electrode level region that includes a plurality of linear-shaped conductive structures. Each of the plurality of linear-shaped conductive structures is defined to extend lengthwise in a first direction. Some of the plurality of linear-shaped conductive structures form one or more gate electrodes of corresponding transistor devices. A local interconnect conductive structure is formed between two of the plurality of linear-shaped conductive structures so as to extend in the first direction along the two of the plurality of linear-shaped conductive structures.

In another embodiment, an integrated circuit includes a gate electrode level region that includes first, second, and third linear-shaped conductive structures positioned in a side-by-side and spaced-apart manner, such that the second linear-shaped conductive structure is positioned between the first and third linear-shaped conductive structures. Each of the first, second, and third linear-shaped conductive structures is formed to extend lengthwise in a first direction. The second linear-shaped conductive structure extends over a diffusion region of a first diffusion type to form a gate electrode of a transistor of a first transistor type. The second linear-shaped conductive structure also extends over a diffusion region of a second diffusion type to form a gate electrode of a transistor of a second transistor type. A first local interconnect conductive structure is formed between the first and second linear-shaped conductive structures so as to extend in the first direction along the first and second linear-shaped conductive structures. A second local interconnect conductive structure is formed between the second and third linear-shaped conductive structures so as to extend in the first direction along the second and third linear-shaped conductive structures.

Other aspects and advantages of the present inventions will become apparent from the following detailed description, taken in conjunction with the accompanying drawings, illustrating by way of example the principles of the present invention.

BRIEF DESCRIPTION OF DRAWINGS

The present invention will be readily understood by the following detailed description in conjunction with the accompanying drawings. To facilitate this description, like reference numerals designate like structural elements.

FIG. 1 shows a generalized stack of layers used to define a dynamic array architecture, in accordance with one embodiment of the present invention.

DETAILED DESCRIPTION

Figure 2A:
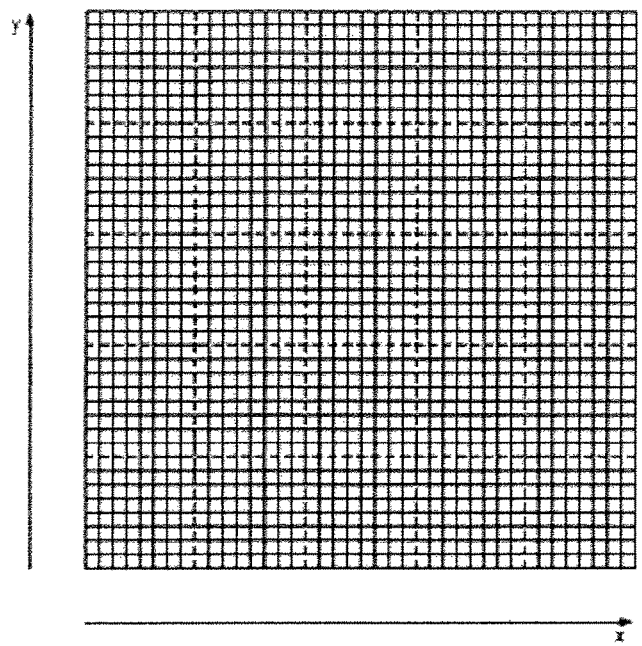
FIG. 2A is shows an exemplary base grid to be projected onto the dynamic array to facilitate definition of the restricted topology, in accordance with one embodiment of the present invention.

Embodiments of an invention for methods and processes for designing, layout-out, making, fabricating and implementing "self-aligned local interconnects" in integrated circuits, are disclosed. In the following description, numerous specific details are set forth in order to provide a thorough understanding of the present invention. In one embodiment, a process of fabricating self-aligned local interconnects is provided. In other embodiments, method and layout techniques are disclosed, which illustrate ways of using the self-aligned local interconnects. The benefits and advantages of using these self-aligned local interconnects are also outlined below, with specific reference to a particular logic cell. However, it should be understood that the example logic cell is not limiting on the use of local interconnects that are self-aligned. The use of self-aligned local interconnects can be extended to any circuit layout, logic device, logic cell, logic primitive, interconnect structure, design mask, etc. Therefore, in the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

The self-aligned local interconnects have numerous applications in the fabrication of integrated circuits. The self-aligning of the local interconnects in integrated circuits eliminates lithography error margins and resulting device loss, as even a minor misalignment of a local interconnect on the integrated circuit may cause an electric short and/or render the device inoperable.

Furthermore, self-aligned local interconnects may be used for various other purposes. One such purpose is to use the self-aligned local interconnects to move away metal contacts from the diffusion regions of transistors.

Additionally, the process of fabricating "self-aligned" local interconnects in integrated circuits is advantageous over other techniques, which require precise aligning through lithography processes. As is known, as feature sizes continue to shrink, the ability to accurately align masks has not kept pace. Additionally, interference patterns from neighboring shapes can create constructive or destructive interference. In the case of constructive interference, unwanted shapes may be inadvertently created. In the case of destructive interference, desired shapes may be inadvertently removed. In either case, a particular shape is printed in a different manner than intended, possibly causing a device failure. Correction methodologies, such as optical proximity correction (OPC), attempt to predict the impact from neighboring shapes and modify the mask such that the printed shape is fabricated as desired. As noted, however, the quality of the light interaction prediction is declining as process geometries shrink and as the light interactions become more complex.

With this overview in mind, the following figures will illustrate example structures, fabrication steps, layout geometries, masks, and interconnect layouts. All of which can be presented in either a layout, masks, computer files having mask definitions, and resulting layers on a semiconductor substrate. Consequently, it should be understood that the fabrication processes described below are only exemplary, and some steps may be omitted or replaced by other steps, so long as the spirit and definition of a "self-aligned" local interconnect line is maintained.

In one embodiment, the methods and structures of the present invention take advantage of a consistent feature orientation, which defines a canvas of substantially uniform feature orientations. In a canvas, a number of diffusion regions are defined within the substrate to define active regions for transistor devices. The canvas also includes a number of linear gate electrode segments oriented in a common direction over the substrate. Some of the linear gate electrode segments are disposed over a diffusion region. Each of the linear gate electrode segments that is disposed over a diffusion region includes a necessary active portion defined over the diffusion region and a uniformity extending portion defined to extend over the substrate beyond the diffusion region. Additionally, the linear gate electrode segments are defined to have variable lengths to enable logic gate functionality. The canvas further includes a number of linear conductor segments disposed within a level over the gate electrode segments, so as to cross the common direction of the gate electrode segments in a substantially perpendicular direction. The number of linear conductor segments is defined to minimize an end-to-end spacing between adjacent linear conductor segments within a common line over the substrate.

In describing the figures and explaining the embodiments, various details of the fabrication process that are well known in the art, have been left out for providing clarity and focus on the embodiments being described. Furthermore, many terms related with the fabrication process are not described in detail because these terms are well known in the art.

I. Overview of Canvas Design Implementing Consistent Relative Feature Orientation FIG. 1 is an illustration showing a generalized stack of layers used to define a dynamic array architecture, in accordance with one embodiment of the present invention. It should be appreciated that the generalized stack of layers used to define the dynamic array architecture, as described with respect to FIG. 1, is not intended to represent an exhaustive description of the CMOS manufacturing process. However, the dynamic array is to be built in accordance with standard CMOS manufacturing processes. Generally speaking, the dynamic array architecture includes both the definition of the underlying structure of the dynamic array and the techniques for assembling the dynamic array for optimization of area utilization and manufacturability. Thus, the dynamic array is designed to optimize semiconductor manufacturing capabilities.

With regard to the definition of the underlying structure of the dynamic array, the dynamic array is built-up in a layered manner upon a base substrate (e.g. semiconductor wafer) 201, e.g., upon a silicon substrate, or silicon-on-insulator (SOI) substrate. Diffusion regions 203 are defined in the base substrate 201. The diffusion regions 203 are generally separated by the isolation regions or Shallow Trench Isolation (STI) regions. The diffusion regions 203 represent selected regions of the base substrate 201 within which impurities are introduced for the purpose of modifying the electrical properties of the base substrate 201. Above the diffusion regions 203, diffusion contacts 205 are defined to enable connection between the diffusion regions 203 and conductor lines. For example, the diffusion contacts 205 are defined to enable connection between source and drain diffusion regions 203 and their respective conductor nets. Also, gate electrode features 207 are defined above the diffusion regions 203 to form transistor gates. Gate electrode contacts 209 are defined to enable connection between the gate electrode features 207 and conductor lines. For example, the gate electrode contacts 209 are defined to enable connection between transistor gates and their respective conductor nets.

Interconnect layers are defined above the diffusion contact 205 layer and the gate electrode contact layer 209. The interconnect layers include a first metal (metal 1) layer 211, a first via (via 1) layer 213, a second metal (metal 2) layer 215, a second via (via 2) layer 217, a third metal (metal 3) layer 219, a third via (via 3) layer 221, and a fourth metal (metal 4) layer 223. The metal and via layers enable definition of the desired circuit connectivity. For example, the metal and via layers enable electrical connection of the various diffusion contacts 205 and gate electrode contacts 209 such that the logic function of the circuitry is realized. It should be appreciated that the dynamic array architecture is not limited to a specific number of interconnect layers, i.e., metal and via layers. In one embodiment, the dynamic array may include additional interconnect layers 225, beyond the fourth metal (metal 4) layer 223. Alternatively, in another embodiment, the dynamic array may include less than four metal layers.

The dynamic array is defined such that layers (other than the diffusion region layer 203) are restricted with regard to layout feature shapes that can be defined therein. Specifically, in each layer other than the diffusion region layer 203, substantially linear-shaped layout features are allowed. A linear-shaped layout feature in a given layer is characterized as having a consistent vertical cross-section shape and extending in a single direction over the substrate. Some minor perpendicular extrusions would be allowed, however, if contacts need to be made to some lines, but these minor perpendicular extrusions should not constitute a substantial change in direction. Thus, the linear-shaped layout features define structures that are one-dimensionally varying. The diffusion regions 203 are not required to be one-dimensionally varying, although they are allowed to be if necessary. Specifically, the diffusion regions 203 within the substrate can be defined to have any two-dimensionally varying shape with respect to a plane coincident with a top surface of the substrate. In one embodiment, the number of diffusion bend topologies is limited such that the interaction between the bend in diffusion and the conductive material, e.g., polysilicon, that forms the gate electrode of the transistor is predictable and can be accurately modeled. The linear-shaped layout features in a given layer are positioned to be parallel with respect to each other. Thus, the linear-shaped layout features in a given layer extend in a common direction over the substrate and parallel with the substrate.

In one embodiment, the underlying layout methodology of the dynamic array may (but does not have to) use constructive light interference of light waves in the lithographic process to reinforce exposure of neighboring shapes in a given layer. Therefore, the spacing of the parallel, linear-shaped layout features in a given layer is designed around the constructive light interference of the standing light waves such that lithographic correction (e.g., OPC/RET) is minimized or eliminated. Thus, in contrast to conventional OPC/RET-based lithographic processes, the dynamic array defined herein exploits the light interaction between neighboring features, rather than attempting to compensate for the light interaction between neighboring features.

Because the standing light wave for a given linear-shaped layout feature can be accurately modeled, it is possible to predict how the standing light waves associated with the neighboring linear-shaped layout features disposed in parallel in a given layer will interact. Therefore, it is possible to predict how the standing light wave used to expose one linear-shaped feature will contribute to the exposure of its neighboring linear-shaped features. Prediction of the light interaction between neighboring linear-shaped features enables the identification of an optimum feature-to-feature spacing such that light used to render a given shape will reinforce its neighboring shapes. The feature-to-feature spacing in a given layer is defined as the feature pitch, wherein the pitch is the center-to-center separation distance between adjacent linear-shaped features in a given layer.

In one embodiment, to provide the desired exposure reinforcement between neighboring features, the linear-shaped layout features in a given layer are spaced such that constructive and destructive interference of the light from neighboring features will be optimized to produce the best rendering of all features in the neighborhood. The feature-to-feature spacing in a given layer is proportional to the wavelength of the light used to expose the features. The light used to expose each feature within about a five light wavelength distance from a given feature will serve to enhance the exposure of the given feature to some extent. The exploitation of constructive interference of the light waves used to expose neighboring features enables the manufacturing equipment capability to be maximized and not be limited by concerns regarding light interactions during the lithography process.

As discussed above, the dynamic array incorporates a restricted topology in which the features within each layer (other than diffusion) are required to be substantially linear in shape, and are oriented in a parallel manner to traverse over the substrate in a common direction. With the restricted topology of the dynamic array, the light interaction in the photolithography process can be optimized such that an accurate transfer of the layout onto the resist is achieved.

FIG. 2A is an illustration showing an exemplary base grid to be projected onto the dynamic array to facilitate definition of the restricted topology, in accordance with one embodiment of the present invention. The base grid can be used to facilitate parallel placement of the linear-shaped features in each layer of the dynamic array at the appropriate optimized pitch. Although not physically defined as part of the dynamic array, the base grid can be considered as a projection on each layer of the dynamic array. Also, it should be understood that the base grid is projected in a substantially consistent manner with respect to position on each layer of the dynamic array, thus facilitating accurate feature stacking and alignment.

Figure 2B:
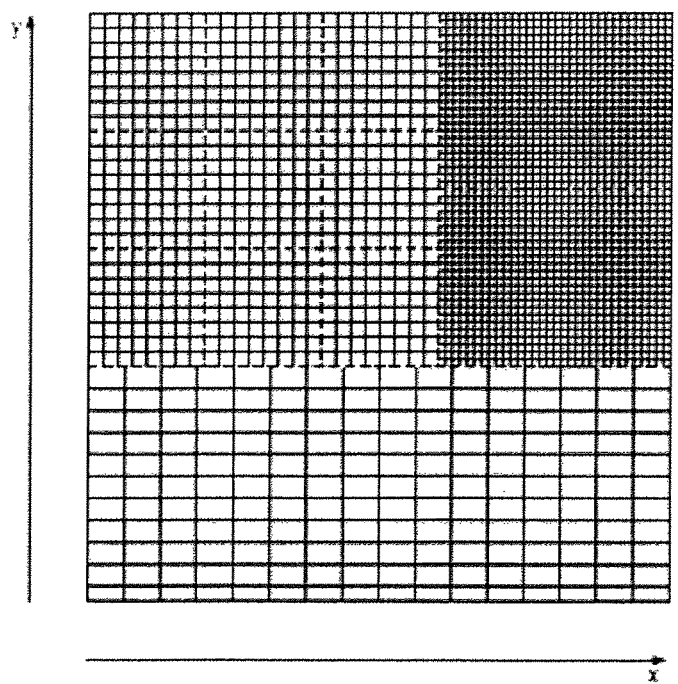
FIG. 2B shows separate base grids projected across separate regions of the die, in accordance with an exemplary embodiment of the present invention.

In the exemplary embodiment of FIG. 2A, the base grid is defined as a rectangular grid, i.e., Cartesian grid, in accordance with a first reference direction (x) and a second reference direction (y). The gridpoint-to-gridpoint spacing in the first and second reference directions can be defined as necessary to enable definition of the linear-shaped features at the optimized feature-to-feature spacing. Also, the gridpoint spacing in the first reference direction (x) can be different than the gridpoint spacing in the second reference direction (y). In one embodiment, a single base grid is projected across the entire die to enable location of the various linear-shaped features in each layer across the entire die. However, in other embodiments, separate base grids can be projected across separate regions of the die to support different feature-to-feature spacing requirements within the separate regions of the die. FIG. 2B is an illustration showing separate base grids projected across separate regions of the die, in accordance with an exemplary embodiment of the present invention.

The layout architecture of the dynamic array follows the base grid pattern. Thus, it is possible to use grid points to represent where changes in direction occur in diffusion, wherein gate electrode and metal linear-shaped features are placed, where contacts are placed, where opens are in the linear-shaped gate electrode and metal features, etc. The pitch of the gridpoints, i.e., the gridpoint-to-gridpoint spacing, should be set for a given feature line width, such that exposure of neighboring linear-shaped features of the given feature line width will reinforce each other, wherein the linear-shaped features are centered on gridpoints. With reference to the dynamic array stack of FIG. 1 and the exemplary base grid of FIG. 2A, in one embodiment, the gridpoint spacing in the first reference direction (x) is set by the required gate electrode pitch. In this same embodiment, the gridpoint pitch in the second reference direction (y) is set by the metal 1 pitch. For example, in a 90 nm logic process technology, the gridpoint pitch in the second reference direction (y) is about 0.24 micron. In one embodiment, metal 1 and metal 2 layers will have a common spacing and pitch. A different spacing and pitch may be used above the metal 2 layer.

The various layers of the dynamic array are defined such that the linear-shaped features in adjacent layers extend in a crosswise manner with respect to each other. For example, the linear-shaped features of adjacent layers may extend orthogonally, i.e., perpendicularly with respect to each other. Also, the linear-shaped features of one layer may extend across the linear-shaped features of an adjacent layer at an angle, e.g., at about 45 degrees. For example, in one embodiment the linear-shaped feature of one layer extend in the first reference direction (x) and the linear-shaped features of the adjacent layer extend diagonally with respect to the first (x) and second (y) reference directions. It should be appreciated that to route a design in the dynamic array having the linear-shaped features positioned in the crosswise manner in adjacent layers, opens can be defined in the linear-shaped features, and contacts and vias can be defined as necessary.

The dynamic array minimizes the use of bends (or substantial changes in direction) in layout shapes to eliminate unpredictable lithographic interactions. Specifically, prior to OPC or other RET processing, the dynamic array allows bends in the diffusion layer to enable control of device sizes, but does not allow substantial bends (or substantial changes in direction) in layers above the diffusion layer.

Figure 3:
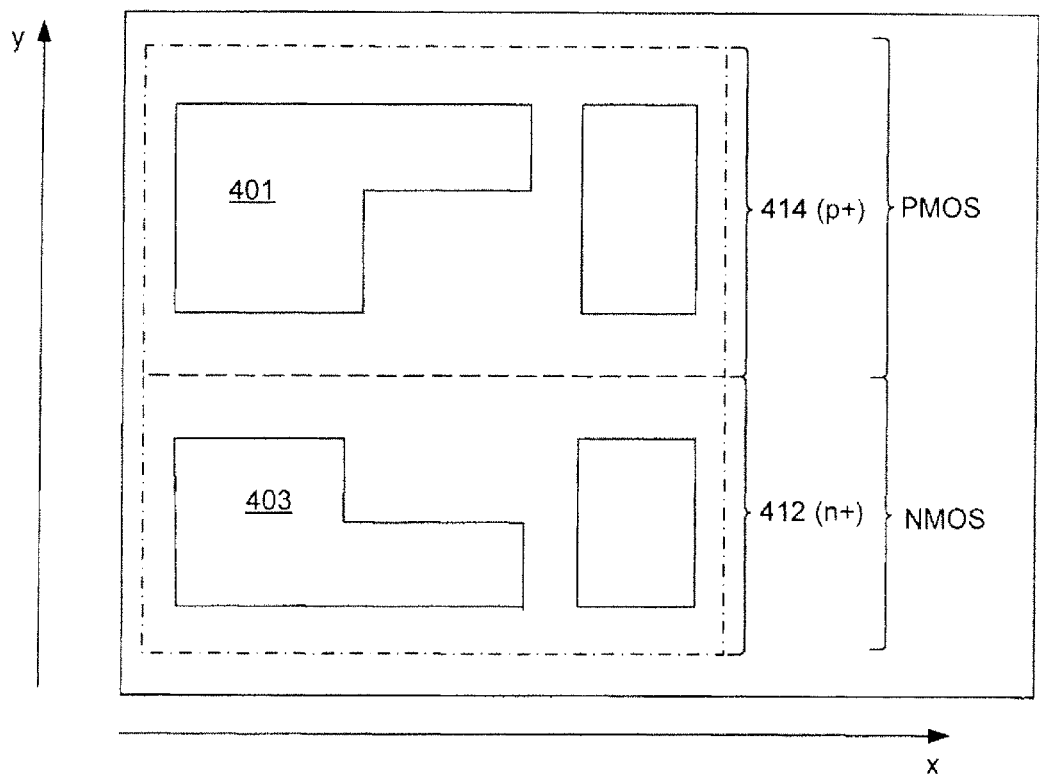
FIG. 3 shows a diffusion layer layout of an exemplary dynamic array, in accordance with one embodiment of the present invention.
Figure 4A:
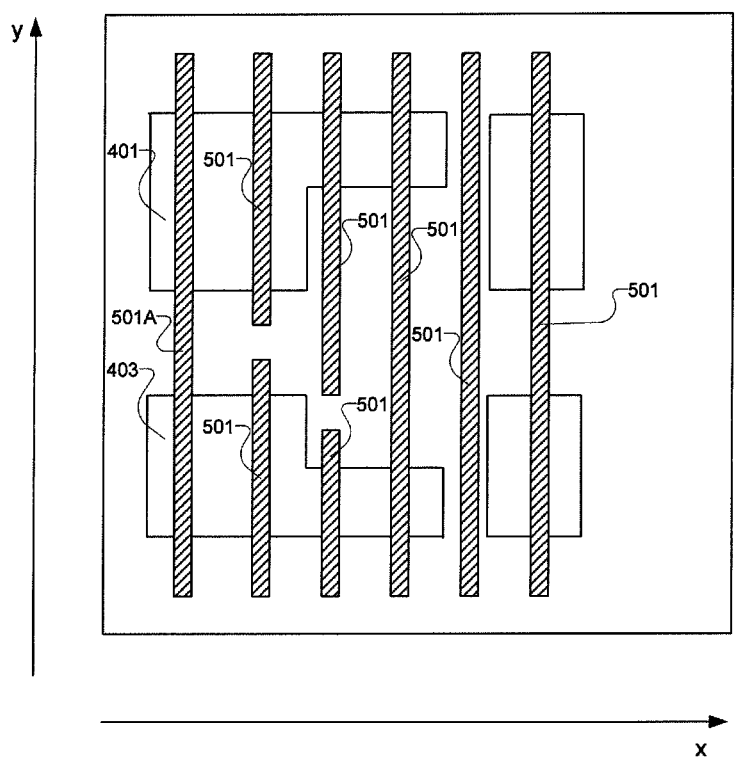
FIG. 4A shows a gate electrode layer and the diffusion layer of FIG. 3, in accordance with one embodiment of the present invention.

An exemplary buildup of dynamic array layers from diffusion through metal 2 are described with respect to FIGS. 3 and 4A. It should be appreciated that the dynamic array described with respect to FIGS. 3 through 4A is provided by way of example only, and is not intended to convey limitations of the dynamic array architecture. The dynamic array can be used in accordance with the principles presented herein to define essentially any integrated circuit design, any logic cell, a base cell, an architecture, or design layouts. Designs can be on physical chips, wafers, substrates or drawn on paper, film, or stored in files. If stored in files, the files can be stored on any computer readable device. The computer readable device can be stored on a local computer, on a networked computer and the files can be transferred, shared or used over the Internet or local network.

FIG. 3 shows a diffusion layer layout of an exemplary dynamic array, in accordance with one embodiment of the present invention. The diffusion layer of FIG. 3 shows a p-diffusion region 401 and an n-diffusion region 403. While the diffusion regions are defined according to the underlying base grid, the diffusion regions are not subject to the linear-shaped feature restrictions associated with the layers above the diffusion layer. However, it is noted that the implant layouts are simpler than in prior art designs, which would otherwise require more shape extension and bends. As shown, n+ implant regions (412) and p+ implant regions (414) are defined as rectangles on the (x), (y) grid with no extraneous jogs or notches. This style permits use of larger implant regions, reduces need for OPC/RET, and enables use of lower resolution and lower cost lithographic systems, e.g., i-line illumination at 365 nm.

FIG. 4A is an illustration showing a gate electrode layer above and adjacent to the diffusion layer of FIG. 3, in accordance with one embodiment of the present invention. As those skilled in the CMOS art will appreciate, the gate electrode features 501 define the transistor gates. The gate electrode features 501 are defined as linear shaped features extending in a parallel relationship across the dynamic array in the second reference direction (y). In one embodiment, the gate electrode features 501 are defined to have a common width. However, in another embodiment, one or more of the gate electrode features can be defined to have a different width. The pitch (center-to-center spacing) of the gate electrode features 501 is minimized while ensuring optimization of lithographic reinforcement, i.e., resonant imaging, provided by neighboring gate electrode features 501. For discussion purposes, gate electrode features 501 extending across the dynamic array in a given line are referred to as a gate electrode track.

The gate electrode features 501 form n-channel and p-channel transistors as they cross the diffusion regions 403 and 401, respectively. Optimal gate electrode feature 501 printing is achieved by drawing gate electrode features 501 at every grid location, even though no diffusion region may be present at some grid locations. Also, long continuous gate electrode features 501 tend to improve line end shortening effects at the ends of gate electrode features within the interior of the dynamic array. Additionally, gate electrode printing is significantly improved when substantially all bends are removed from the gate electrode features 501.

Each of the gate electrode tracks may be interrupted, i.e., broken, any number of times in linearly traversing across the dynamic array in order to provide required electrical connectivity for a particular logic function to be implemented. When a given gate electrode track is required to be interrupted, the separation between ends of the gate electrode track segments at the point of interruption is minimized to the extent possible taking into consideration the manufacturing capability and electrical effects. In one embodiment, optimal manufacturability is achieved when a common end-to-end spacing is used between features within a particular layer.

Figure 4B:
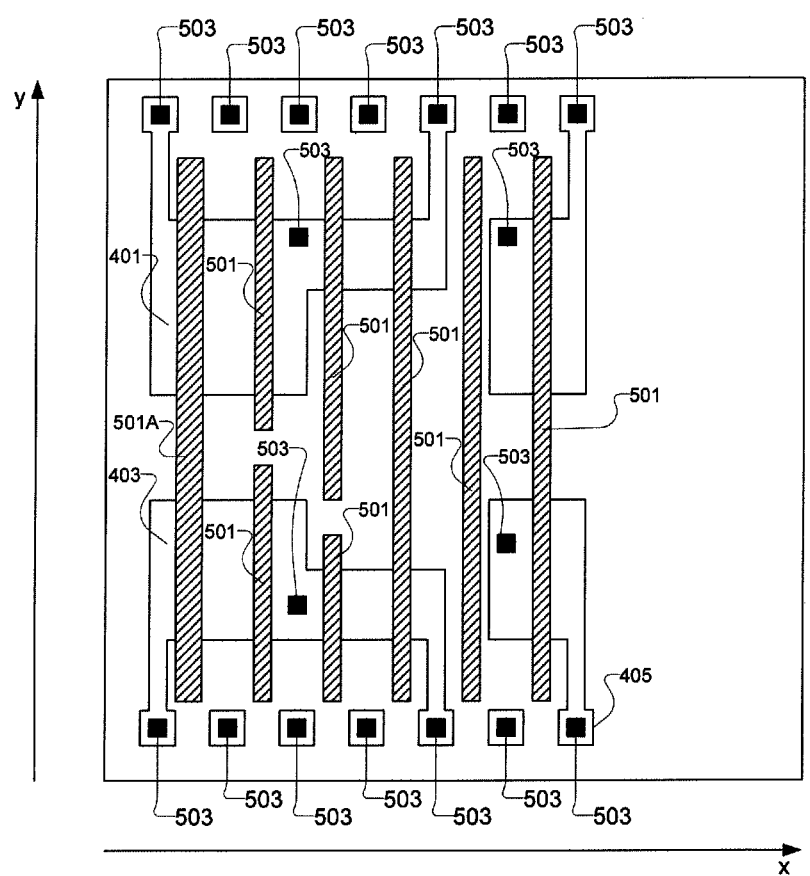
FIG. 4B is an illustration showing a gate electrode layer and a diffusion contact layer above and adjacent to the diffusion layer of FIG. 4A, in accordance with one embodiment of the present invention.

As described in U.S. patent application Ser. No. 11/683, 402, which is incorporated by reference herein, FIG. 4B is an illustration showing a gate electrode layer and a diffusion contact layer above and adjacent to the diffusion layer of FIG. 4A, in accordance with one embodiment of the present invention. As those skilled in the CMOS arts will appreciate, the gate electrode features 501 define the transistor gates. The gate electrode features 501 are defined as linear shaped features extending in a parallel relationship across the dynamic array in the second reference direction (y). In one embodiment, the gate electrode features 501 are defined to have a common width. However, in another embodiment, one or more of the gate electrode features can be defined to have a different width. For example, FIG. 4B shows a gate electrode features 501A that has a larger width relative to the other gate electrode features 501. The pitch (center-to-center spacing) of the gate electrode features 501 is minimized while ensuring optimization of lithographic reinforcement, i.e., resonant imaging, provided by neighboring gate electrode features 501. For discussion purposes, gate electrode features 501 extending across the dynamic array in a given line are referred to as a gate electrode track.

The gate electrode features 501 form n-channel and p-channel transistors as they cross the diffusion regions 403 and 401, respectively. Optimal gate electrode feature 501 printing is achieved by drawing gate electrode features 501 at every grid location, even though no diffusion region may be present at some grid locations. Also, long continuous gate electrode features 501 tend to improve line end shortening effects at the ends of gate electrode features within the interior of the dynamic array. Additionally, gate electrode printing is significantly improved when all bends are removed from the gate electrode features 501.

Each of the gate electrode tracks may be interrupted, i.e., broken, any number of times in linearly traversing across the dynamic array in order to provide required electrical connectivity for a particular logic function to be implemented. When a given gate electrode track is required to be interrupted, the separation between ends of the gate electrode track segments at the point of interruption is minimized to the extent possible taking into consideration the manufacturing capability and electrical effects. In one embodiment, optimal manufacturability is achieved when a common end-to-end spacing is used between features within a particular layer.

Minimizing the separation between ends of the gate electrode track segments at the points of interruption serves to maximize the lithographic reinforcement, and uniformity thereof, provided from neighboring gate electrode tracks. Also, in one embodiment, if adjacent gate electrode tracks need to be interrupted, the interruptions of the adjacent gate electrode tracks are made such that the respective points of interruption are offset from each other so as to avoid, to the extent possible, an occurrence of neighboring points of interruption. More specifically, points of interruption within adjacent gate electrode tracks are respectively positioned such that a line of sight does not exist through the points of interruption, wherein the line of sight is considered to extend perpendicularly to the direction in which the gate electrode tracks extend over the substrate. Additionally, in one embodiment, the gate electrodes may extend through the boundaries at the top and bottom of the cells, i.e., the PMOS or NMOS cells. This embodiment would enable bridging of neighboring cells.

With further regard to FIG. 4B, diffusion contacts 503 are defined at each diffusion square 405 to enhance the printing of diffusion contacts via resonant imaging. The diffusion squares 405 are present around every diffusion contact 503 to enhance the printing of the power and ground connection polygons at the diffusion contacts 503.

The gate electrode features 501 and diffusion contacts 503 share a common grid spacing. More specifically, the gate electrode feature 501 placement is offset by one-half the grid spacing relative to the diffusion contacts 503. For example, if the gate electrode features 501 and diffusion contact 503 grid spacing is 0.36 µm, then the diffusion contacts are placed such that the x-coordinate of their center falls on an integer multiple of 0.36 µm, while the x-coordinate of the center of each gate electrode feature 501 minus 0.18 µm should be an integer multiple of 0.36 µm. In the present example, the x-coordinates are represented by the following:

Diffusion contact center x-coordinate=I*0.36 µm, where I is the grid number;

Gate electrode feature center x-coordinate=0.18 µm+I*0.36 µm, where I is the grid number.

The grid based system of the dynamic array ensures that all contacts (diffusion and gate electrode) will land on a horizontal grid that is equal to a multiple of one-half of the diffusion contact grid and a vertical grid that is set by the metal 1 pitch. In the example above, the gate electrode feature and diffusion contact grid is 0.36 µm. The diffusion contacts and gate electrode contacts will land on a horizontal grid that is a multiple of 0.18 µm. Also, the vertical grid for 90 nm process technologies is about 0.24 µm.

Figure 4C:
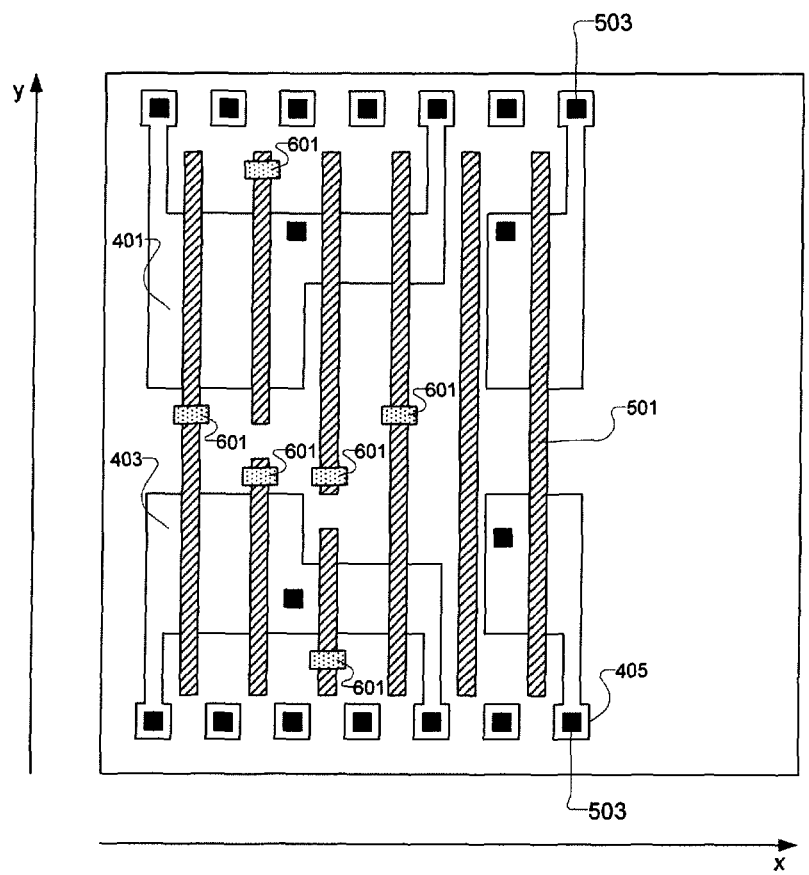
FIG. 4C is an illustration showing a gate electrode contact layer defined above and adjacent to the gate electrode layer of FIG. 4B, in accordance with one embodiment of the present invention.

As described in U.S. patent application Ser. No. 11/683, 402, which is incorporated by reference herein, FIG. 4C is an illustration showing a gate electrode contact layer defined above and adjacent to the gate electrode layer of FIG. 4B, in accordance with one embodiment of the present invention. In the gate electrode contact layer, gate electrode contacts 601 are drawn to enable connection of the gate electrode features 501 to the overlying metal conduction lines. In general, design rules will dictate the optimum placement of the gate electrode contacts 601. In one embodiment, the gate electrode contacts are drawn on top of the transistor endcap regions. This embodiment minimizes white space in the dynamic array when design rules specify long transistor endcaps. In some process technologies white space may be minimized by placing a number of gate electrode contacts for a cell in the center of the cell. Also, it should be appreciated that in the present invention, the gate electrode contact 601 is oversized in the direction perpendicular to the gate electrode feature 501 to ensure overlap between the gate electrode contact 601 and the gate electrode feature 501.

Figure 4D:
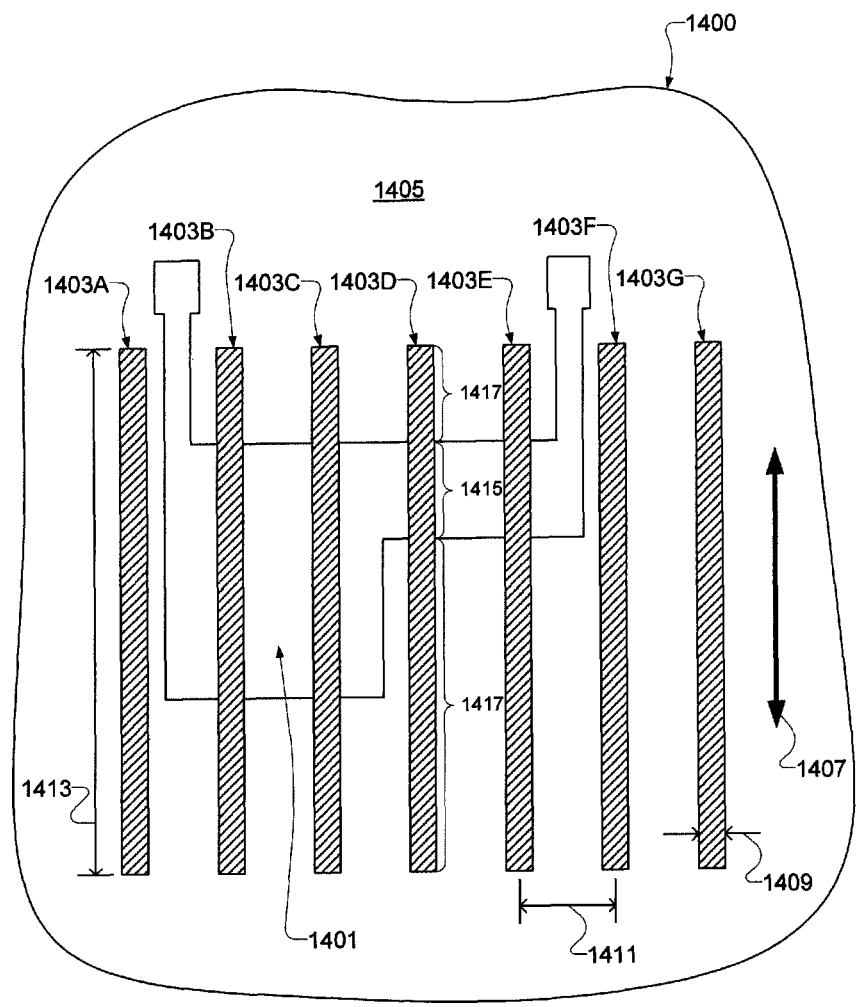
FIG. 4D is an illustration showing a semiconductor chip structure, in accordance with one embodiment of the present invention.

As described in U.S. patent application Ser. No. 11/683, 402, which is incorporated by reference herein, FIG. 4D is an illustration showing a semiconductor chip structure 1400, in accordance with one embodiment of the present invention. The semiconductor chip structure 1400 represents an exemplary portion of a semiconductor chip, including a diffusion region 1401 having a number of conductive lines 1403A-1403G defined thereover. The diffusion region 1401 is defined in a substrate 1405, to define an active region for at least one transistor device. The diffusion region 1401 can be defined to cover an area of arbitrary shape relative to the substrate 1405 surface.

The conductive lines 1403A-1403G are arranged to extend over the substrate 1405 in a common direction 1407. It should also be appreciated that each of the number of conductive lines 1403A-1403G are restricted to extending over the diffusion region 1401 in the common direction 1407. In one embodiment, the conductive lines 1403A-1403G defined immediately over the substrate 1405 are polysilicon lines. In one embodiment, each of the conductive lines 1403A-1403G is defined to have essentially the same width 1409 in a direction perpendicular to the common direction 1407 of extension. In another embodiment, some of the conductive lines 1403A-1403G are defined to have different widths relative to the other conductive lines. However, regardless of the width of the conductive lines 1403A-1403G, each of the conductive lines 1403A-1403G is spaced apart from adjacent conductive lines according to essentially the same center-to-center pitch 1411.

As shown in FIG. 4D, some of the conductive lines (1403B-1403E) extend over the diffusion region 1401, and other conductive lines (1403A, 1403F, 1403G) extend over non-diffusion portions the substrate 1405. It should be appreciated that the conductive lines 1403A-1403G maintain their width 1409 and pitch 1411 regardless of whether they are defined over diffusion region 1401 or not. Also, it should be appreciated that the conductive lines 1403A-1403G maintain essentially the same length 1413 regardless of whether they are defined over diffusion region 1401 or not, thereby maximizing lithographic reinforcement between the conductive lines 1403A-1403G across the substrate. In this manner, some of the conductive lines, e.g., 1403D, defined over the diffusion region 1401 include a necessary active portion 1415, and one or more uniformity extending portions 1417.

It should be appreciated that the semiconductor chip structure 1400 represents a portion of the dynamic array described above with respect to FIGS. 1-4C. Therefore, it should be understood that the uniformity extending portions 1417 of the conductive lines (1403B-1403E) are present to provide lithographic reinforcement of neighboring conductive lines 1403A-1403G. Also, although they may not be required for circuit operation, each of conductive lines 1403A, 1403F, and 1403G are present to provide lithographic reinforcement of neighboring conductive lines 1403A-1403G.

The concept of the necessary active portion 1415 and the uniformity extending portions 1417 also applies to higher level interconnect layers. As previously described with regard to the dynamic array architecture, adjacent interconnect layers traverse over the substrate in transverse directions, e.g., perpendicular or diagonal directions, to enable routing/connectivity required by the logic device implemented within the dynamic array. As with the conductive lines 1403A-1403G, each of the conductive lines within an interconnect layer may include a required portion (necessary active portion) to enable required routing/connectivity, and a non-required portion (uniformity extending portion) to provide lithographic reinforcement to neighboring conductive lines. Also, as with the conductive lines 1403A-1403G, the conductive lines within an interconnect layer extend in a common direction over the substrate, have essentially the same width, and are spaced apart from each other according to an essentially constant pitch.

In one embodiment, conductive lines within an interconnect layer follow essentially the same ratio between line width and line spacing. For example, at 90 nm the metal 4 pitch is 280 nm with a line width and line spacing equal to 140 nm. Larger conductive lines can be printed on a larger line pitch if the line width is equal to the line spacing.

Figure 4E:
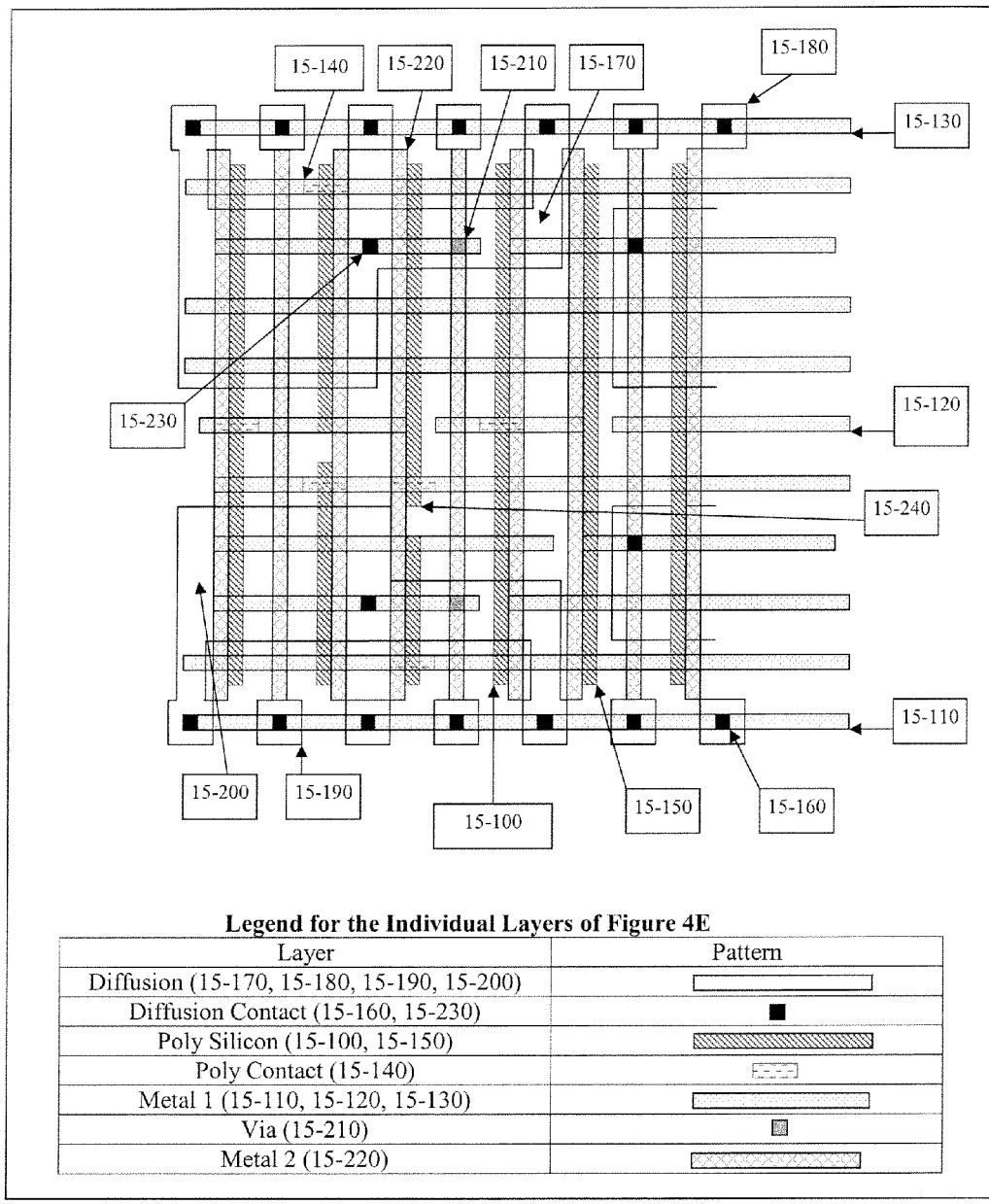
FIG. 4E shows an example layout architecture defined in accordance with one embodiment of the present invention.

As described in U.S. patent application Ser. No. 11/683, 402, which is incorporated by reference herein, FIG. 4E shows an example layout architecture defined in accordance with one embodiment of the present invention. The layout architecture follows a grid pattern and is based upon a horizontal grid and a vertical grid. The horizontal grid is set by the poly gate pitch. The vertical pitch is set by the metal 1/metal 3 pitch. All of the rectangular shapes should be centered on a grid point. The layout architecture minimizes the use of bends to eliminate unpredictable lithographic interactions. Bends are allowed on the diffusion layer to control transistor device sizes. Other layers should be rectangular in shape and fixed in one dimension.

II. Logic Cell Design Using Self-Aligned Local Interconnects on Canvas

Figure 5A:
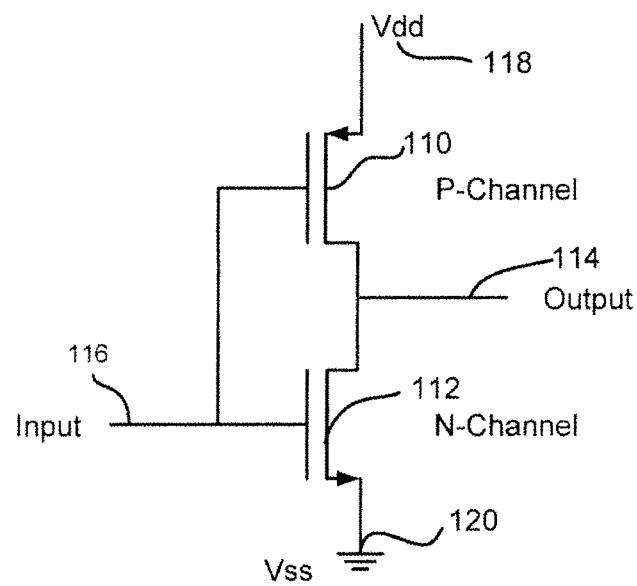
FIG. 5A illustrates a circuit representation of a logic inverter using a PMOS and an NMOS transistor, in accordance with one embodiment of the present invention.

FIG. 5A illustrates a circuit representation of the exemplary logic inverter. However, as noted above, the logic inerter is only being shown and discussed to convey the process of making the self-aligned local interconnects, which can be implemented any other primitive, cell, logic device, or process methodology. As shown, the PMOS transistor 110 and the NMOS transistor 112 are coupled to make a logic inverter. The source of the PMOS transistor 110 is connected to Vdd 118 and the drain of the PMOS transistor 112 is connected to the drain of the NMOS transistor 112. The source of the NMOS transistor 112 is connected to the ground (Vss) 120. A common input 116 is provided to the transistors and the output 114 is provided at the connection of the drain of the PMOS transistor 110 and the drain of the NMOS transistor 112. Again, the inverter logic is used as an example to provide an understanding of the embodiments of the present invention. A person skilled in the art, however, would appreciate that the embodiments may also be employed in the fabrication of any other types of logic cells, devices, and integrated circuits.

Figure 5B:
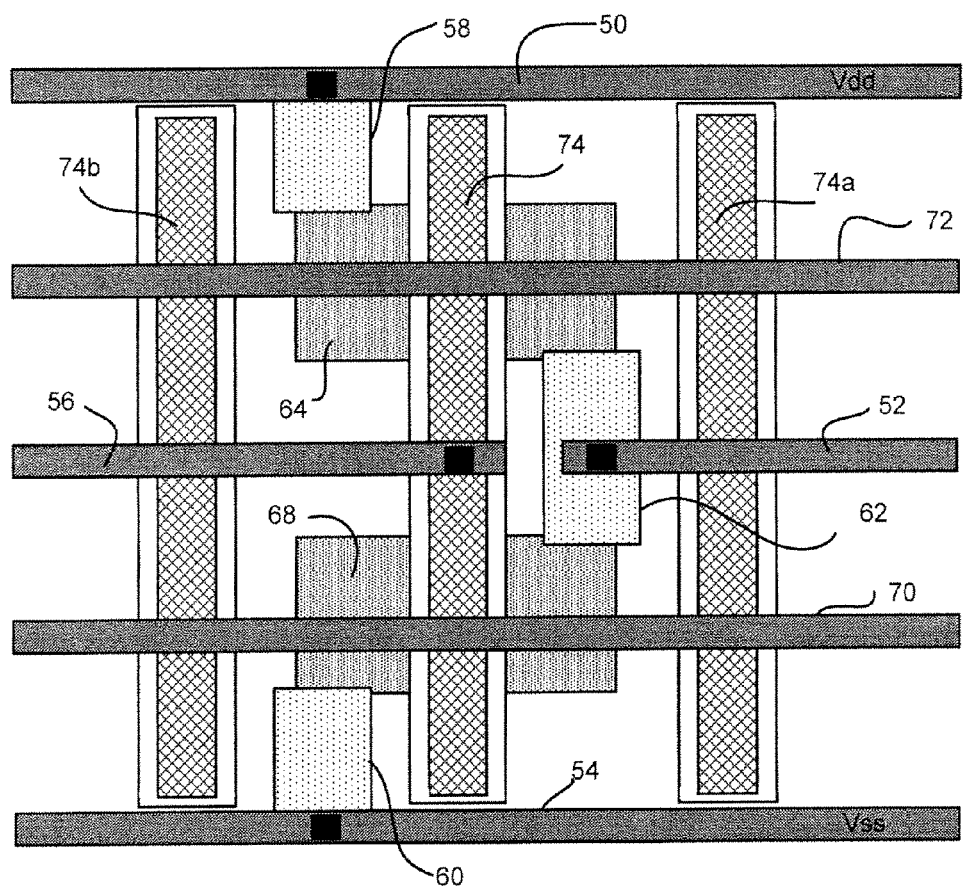
FIG. 5B illustrates a plan view of an exemplary logic inverter to demonstrate a use of the self-aligned local interconnects, in accordance with one embodiment of the present invention.

FIG. 5B illustrates a plan view of an exemplary logic inverter having self-aligned local interconnects 58/60 to connect P 64 and N 68 diffusion regions to Vdd 50 and Vss 54, respectively. A self-aligned local interconnect 62 is also being used to connect the drain of the PMOS transistor to the drain of the NMOS transistor. In one embodiment, all self-aligned local interconnects in an integrated circuit run parallel to the gate electrode channels on the substrate. One of many advantages of laying the local interconnects in one direction is that the local interconnect layer can replace one metal layer that would otherwise be needed to make the connections that are being made using the self-aligned local interconnects. Metal 1 lines 50, 72, 70, and 54 are aligned in one direction that is perpendicular to the gate electrode line 74. The alignment of metal lines can be different in other embodiments.

Still referring to FIG. 5B, there are numerous advantages of employing the self-aligned local interconnects. In one example, the self-aligned local interconnect 58 connecting P diffusion region 64 to Vdd line 50 eliminates the need of fabricating an L shaped diffusion region extending towards the Vdd line 50. In some designs, the self-aligned local interconnect 58 eliminates the need for a metal strap to connect the diffusion region 64 to the Vdd line 50. Elimination of the metal strap and associated contact increases device performance and reduces device size. Performance is increased because a metal strap connecting to the diffusion regions would require one or more contacts, which interferes with beneficial straining of silicon. Thus, reducing metal contacts to the diffusion regions, unless necessary for some design configurations, will boost device performance.

Figure 6A:
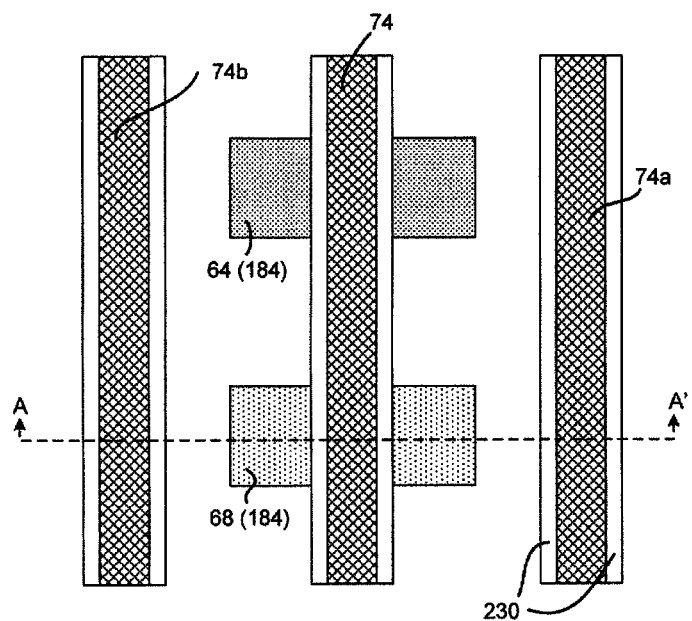
FIG. 6A illustrates a plan view of an exemplary logic inverter showing transistor source/drains, electrodes, and sidewall spacers surrounding the gate electrodes, in accordance with one embodiment of the present invention.

FIG. 6A illustrates a plan view of a partially fabricated integrated circuit showing a P diffusion region 64 and a N diffusion region 68 and a gate electrode line 74 over the P diffusion region 64 and the N diffusion region 68. In this partial view example, the other gate electrode lines 74a, 74b are laid over shallow trench isolation (STI) regions. The gate electrodes 74, 74a, 74b include dielectric spacers (or gate sidewall spacers) on both sides.

Although not shown for ease of discussion, the ends of the gate electrodes may also have dielectric spacers. Since, by design, the gate electrode lines are uniformly placed on the substrates, some of the gate electrode lines are formed over the STI regions. Thus, gates formed over the STI are inactive gates. An active gate is formed when a gate electrode is placed over a diffusion region, and a transistor can be defined. In one embodiment, the partially fabricated integrated circuit is fabricated using a standard CMOS fabrication process.

Figure 6B:
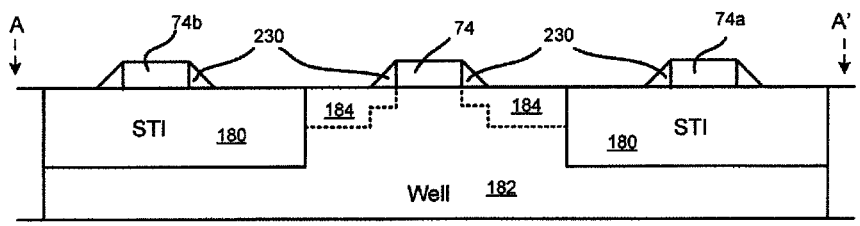
FIG. 6B illustrates a cross-section view of cutline A-A' of the exemplary logic inverter of FIG. 6A showing a transistor well, transistor source/drains, gate electrodes, sidewall spacers, and STI regions, in accordance with one embodiment of the present invention.

FIG. 6B illustrates a cross-section of a partially fabricated integrated circuit of FIG. 6A. It should be understood that the figures are not meant to provide an exact representation of dimensions or exact relative dimensions. On the other hand, the figures should be understood to generally convey the placement of features, layers and the example sequence of processing. Additionally, it should be understood that some sequence steps are not pictorially illustrated, as they are known to those skilled in the art, and not important to the process and sequence flows illustrated herein.

With this in mind, the partially fabricated integrated circuit, is formed over a silicon wafer, and includes a well 182 and shallow trench isolation (STI) regions 180, to provide isolation between adjacent active devices in the integrated circuit. The well 182 includes diffusion regions 184 and a gate electrode 74. The gate electrodes include dielectric spacers (also known as sidewall spacers) 230 formed along the sides of the gate electrode lines. As discussed above, to optimize the design, the gate electrodes (or lines) are fabricated in a parallel orientation, relative to each other. As described herein, therefore, "channels" are defined between the respective gate electrodes. The spacing between two adjacent gate electrode channels is therefore dictated by the regular spacing of the gate electrode lines. As will be discussed in more detail below, the resulting self-aligned local interconnects will reside in the channels between adjacent gate electrodes (or beside a gate electrode if no neighboring gate electrode is present). Because they will predominantly remain in the channels, the self-aligned local interconnects will be self-aligning.

Figure 7A:
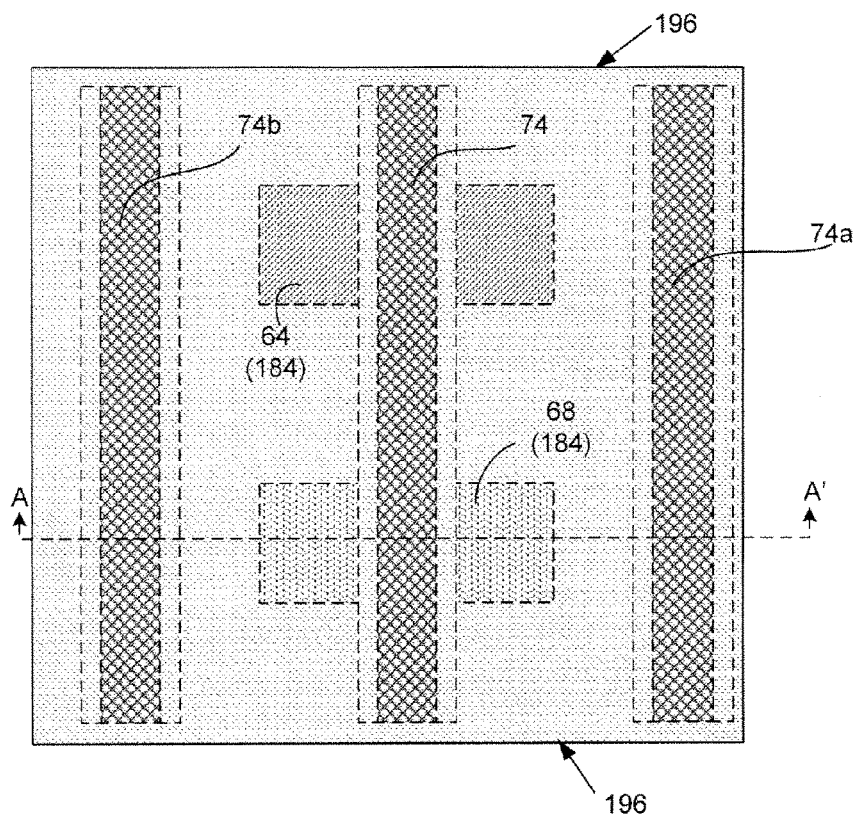
FIG. 7A shows a section of an exemplary logic inverter with a local interconnect layer covering the underlying elements shown in FIG. 6A, in accordance with one embodiment of the present invention.
Figure 7B:
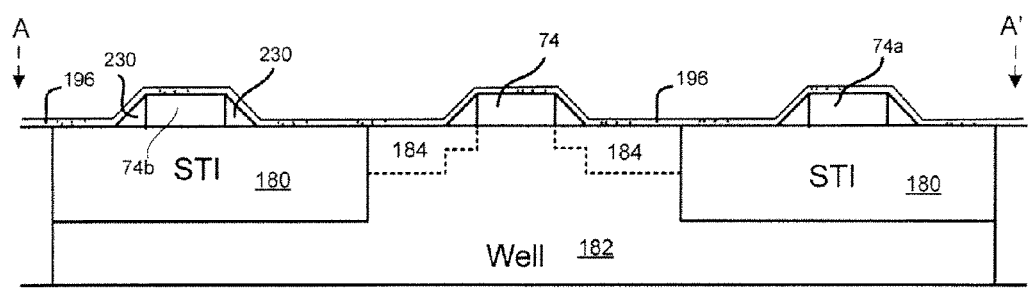
FIG. 7B is a cross-section view of a section of an exemplary logic inverter with a local interconnect layer covering the underlying elements shown in FIG. 6B, in accordance with one embodiment of the present invention.

In FIGS. 7A and 7B, a local interconnect layer 196 is formed over the diffusion regions 184, the gate electrodes 74, 74a, 74b, and the spacers. By way of example, formation of the local interconnect layer 196 can be through a metal deposition process. For ease of visualizing, the local interconnect layer 196 is shown in FIG. 7A as a semi-transparent layer. The cross-section of FIG. 7B shows the local interconnect layer 196 deposited over the features of FIG. 6B.

In one embodiment, the local interconnect layer 196 is generally metallic. In a more specific embodiment, the metal may be predominantly nickel (Ni). In other embodiments, the metal can be titanium, platinum, or cobalt. In yet another embodiment, a combination of nickel and platinum can be used. Preferably, the purity of the metal used in the local interconnect layer should comply with the industry standard metals. In one embodiment, the local interconnect layer is deposited using physical vapor deposition (PVD) technique. In other embodiments, the deposition of the local interconnect layer may be done through chemical vapor deposition (CVD) or atomic layer deposition (ALD).

After depositing the interconnect layer 196, the metal of the interconnect layer is reacted with the underlying silicon and if present in the gate electrode, polysilicon. In one example, the reaction is facilitated through a thermal processing step. The reaction can be carried out under a number of process conditions, but as an example, the temperature can be in a range of between about 200 to 400 degree Celsius, and run for a time in a range of about 5 to about 60 seconds for a nickel layer; higher temperatures may be used for other metals. In another example, the temperature can be set to about 300 degrees Celsius, and processed for about 30 seconds. The reaction step is generally performed in a chamber that uses nitrogen or other inert gases.

Figure 8A:
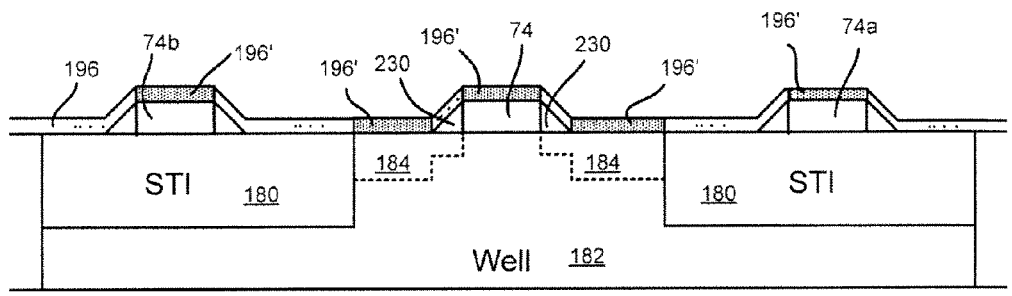
FIG. 8A illustrates formation of silicide through annealing of the local interconnect layer, in accordance with one embodiment of the present invention.

As shown in FIG. 8A, as a result of the reaction process, silicide 196' is formed over the exposed silicon areas. Thus, the silicidation (i.e. formation of silicide 196') occurs over the exposed silicon substrate portion and exposed polysilicon gate if present. As is known, silicide 196' provides good conduction even if the layer is thin. Portions of the local interconnect layer 196 metal not touching silicon will, of course, remain as a metal after the reaction process. In the drawings, FIG. 8A shows the silicide 196' as shaded, in contrast to the metal of the local interconnect layer 196 which did not react.

Figure 8B:
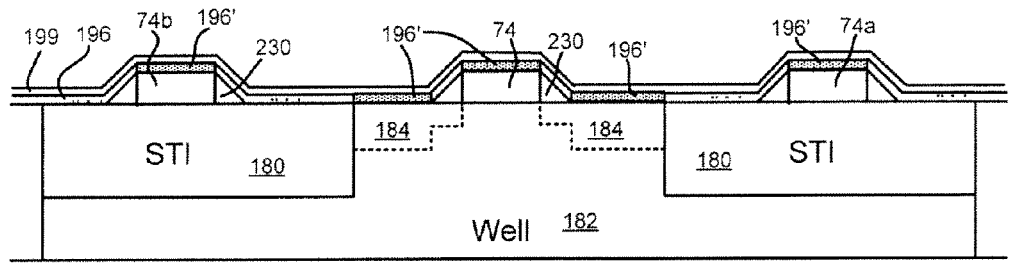
FIG. 8B illustrates depositing a hard mask layer on top of the local interconnect layer over the substrate, in accordance with one embodiment of the present invention.

FIG. 8B illustrates the result after a hard mask layer 199 is deposited over the local interconnect layer 196. In one embodiment, the hard mask layer 199 is an oxide (e.g., $SiO_2$, etc.). In another embodiment, the hard mask layer 199 is a nitride (e.g., silicon nitride, etc.). In yet another embodiment, the hard mask layer 199 is an amorphous carbon (APF). The hard mask layer 199 can be formed in a number of ways, and one such exemplary way is by employing one of a CVD, ALD, or PECVD process. The hard mask layer 199, in this embodiment, is used to protect the local interconnect layer 196 during subsequent removal steps, which remove portions of the local interconnect layer 196 where no conductive connection is needed.

Figure 9A:
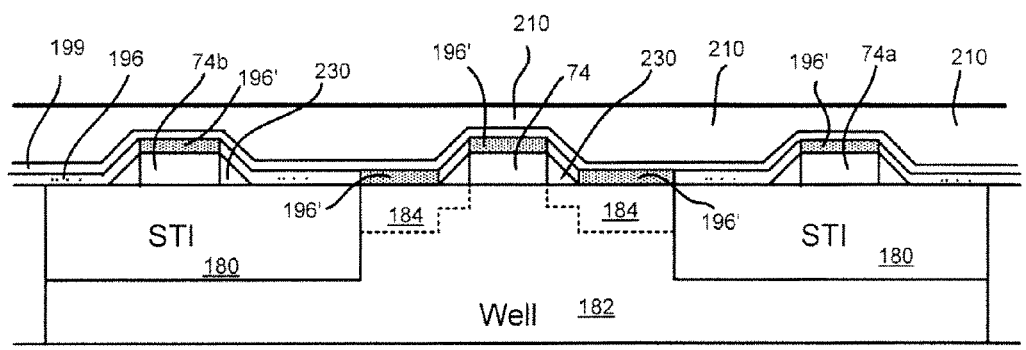
FIG. 9A illustrates a polymer layer covering the elements of FIG. 8B, in accordance with one embodiment of the present invention.
Figure 9B:
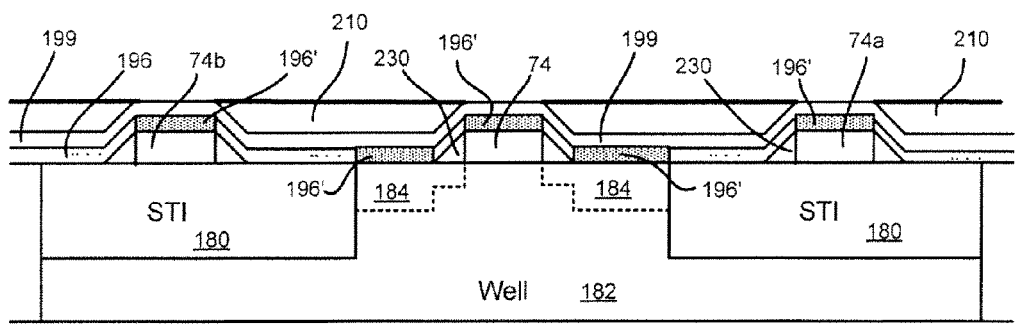
FIG. 9B illustrates a cross section view of the substrate in which the polymer layer is partially removed through plasma etch, in accordance with one embodiment of the present invention.
Figure 9C:
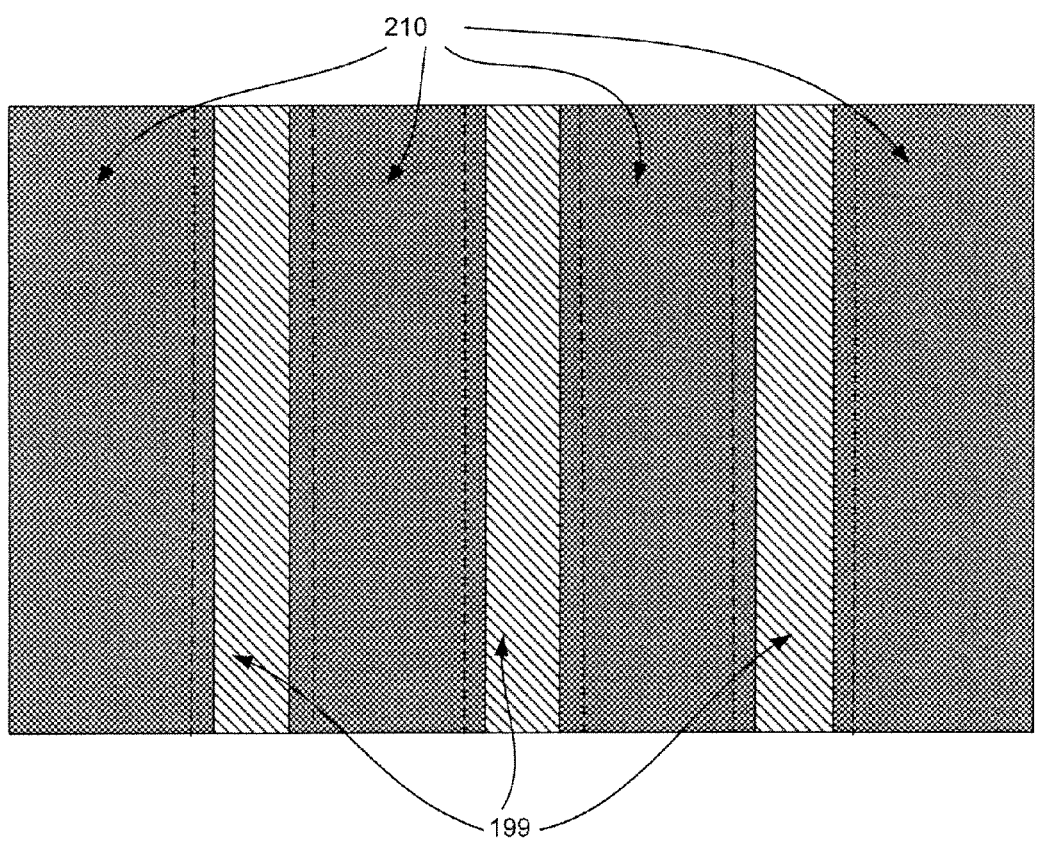
FIG. 9C illustrates a plan view of the substrate in which the polymer layer is etched back to approximately the top of the gate electrodes, in accordance with one embodiment of the present invention.

FIG. 9A shows the cross-section of FIG. 8B after a polymer layer 210 is formed over the hard mask layer 199, in accordance with one embodiment of the present invention. The polymer layer 210 can be applied in a number of ways know in the art. In one example, the polymer layer 210 is preferably spin coated over the surface of the hard mask layer 199. In another embodiment, the polymer layer 210 can be photoresist material, either positive or negative, depending on the desired development process. Other types of photoresist can include, for example, unsensitized photoresists, polymethyl methacrylate resists (PMMA), etc. Once applied, the polymer layer 210 is partially and evenly removed until the hard mask layer 199 is exposed, as shown in FIG. 9B. The removal is preferably performed using a plasma etching operation. One example etching process can take place in an oxygen plasma. The etching process, in this step, is preferably anisotropic in nature, so as to achieve a substantially even removal profile down to the first exposed hard mask layer 199. Standard end-point detection techniques may be used to determine when to stop the etch operation illustrated in FIG. 9B. FIG. 9C is a plan view, showing the exposed hard mask layer 199 and the remaining polymer layer 210. At this stage, the gate sidewall spacers (i.e. dielectric spacers) 230 are also still covered by the polymer layer 210.

It should be noted that another advantage of placing the gate electrode lines at a uniform regular spacing is that the polymer layer 210 is defined uniformly, having a substantially equal thickness. Without such uniform spacing, the polymer layer 210 could exhibit variations in thickness, which would not be desired. For example, if the thickness of the polymer layer 210 is not substantially uniform over the substrate, some gate electrodes with relatively less polymer material cover may be exposed first, causing possible over etching of the hard mask over certain gates.

Figure 10A:
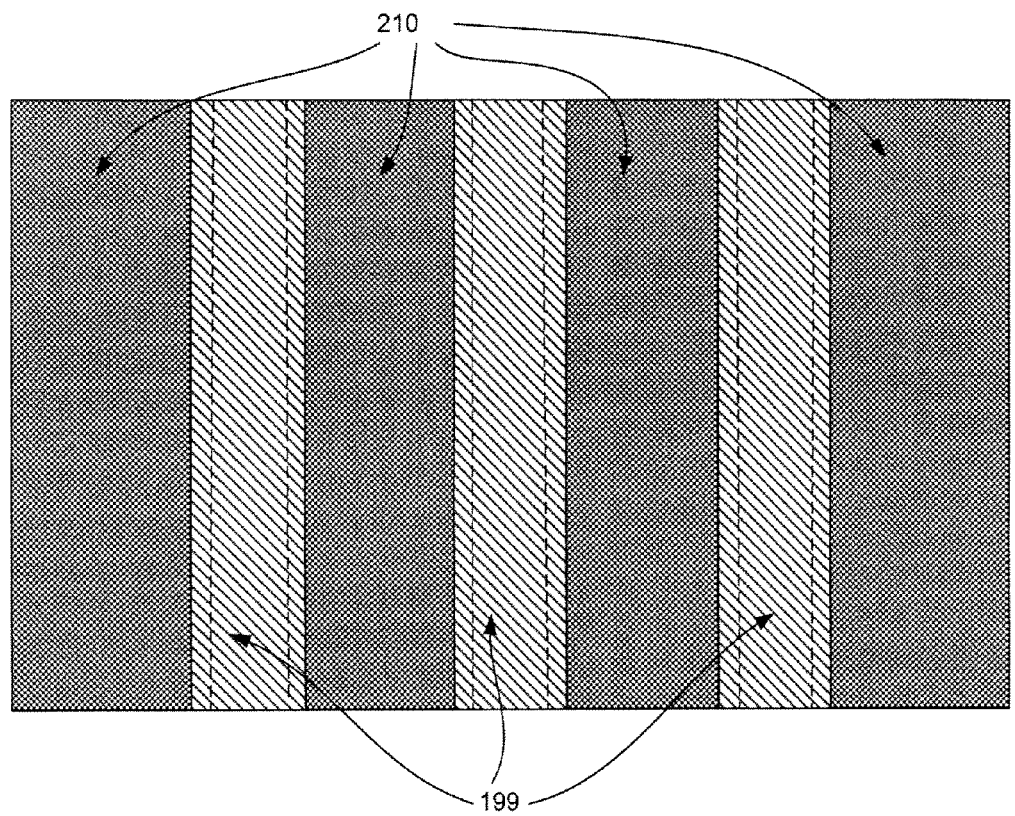
FIG. 10A illustrates a plan view of the exemplary logic inverter after a wet etch to remove the polymer from the dielectric spacers, in accordance with one embodiment of the present invention.
Figure 10B:
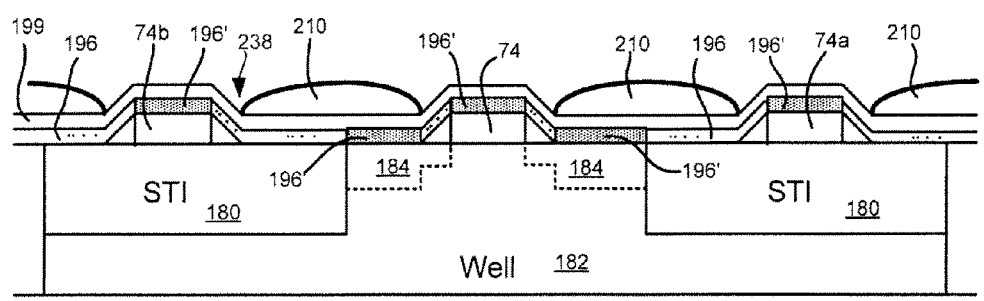
FIG. 10B illustrates a cross-section view of the exemplary logic inverter after removal of the polymer covering the dielectric spacers, in accordance with one embodiment of the present invention.

Once the hard mask layer 199, over the top of the gate electrodes 74, 74a, 74b is exposed, an isotropic etch is performed. The isotropic etching is designed to remove lateral parts 238 of the polymer layer 210, such as the polymer layer 210 on the gate electrode dielectric spacers 230. As illustrated in FIGS. 10A and 10B, after this isotropic etch is complete, the polymer layer 210 should remains in the form of strips between the gate electrodes 74, 74a, 74b, offset and self-aligned to the gate dielectric spacers 230. Thus, the polymer layer 210 will remain everywhere on the substrate except on the gate electrode lines 74, 74a, 74b and the gate dielectric spacers 230.

Figure 11A:
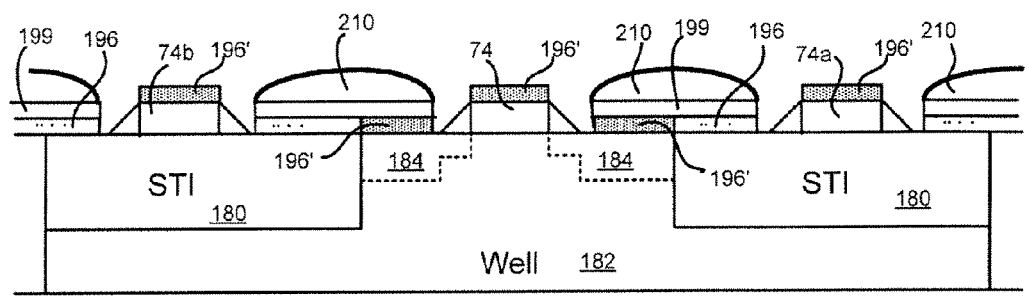
FIG. 11A illustrates a cross section view of the exemplary logic inverter after etching the local interconnect layer and the hard mask layer from the gate electrodes and dielectric spacers, in accordance with one embodiment of the present invention.

FIG. 11A illustrates a cross-section of the substrate after the hard mask layer 199, which is not covered by the polymer layer 210, is removed. Depending on the material of the chosen hard mask, the removal can be performed using a number of known wet or dry etching processes. In one embodiment, once the exposed hard mask layer 199 is removed, the etching can continue so as to remove part of the local interconnect layer 196 material from over the dielectric spacers 230. Removal of this part of the local interconnect layer 196 will provide for a slight separation between the local interconnect layer 196/silicide 196' and the dielectric spacers 230. At this point, the remaining local interconnect layer 196 material, silicide 196' material and hard mask layer 199, as covered by the polymer layer 210, will run in channels between and aligned by the dielectric spacers 230.

Figure 11B:
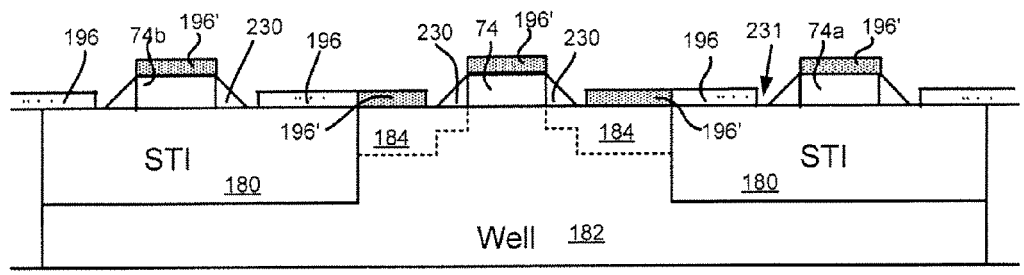
FIG. 11B illustrates a cross section view of the exemplary logic inverter after selective etch of the remaining polymer layer and hard mask layer, in accordance with one embodiment of the present invention.
Figure 12:
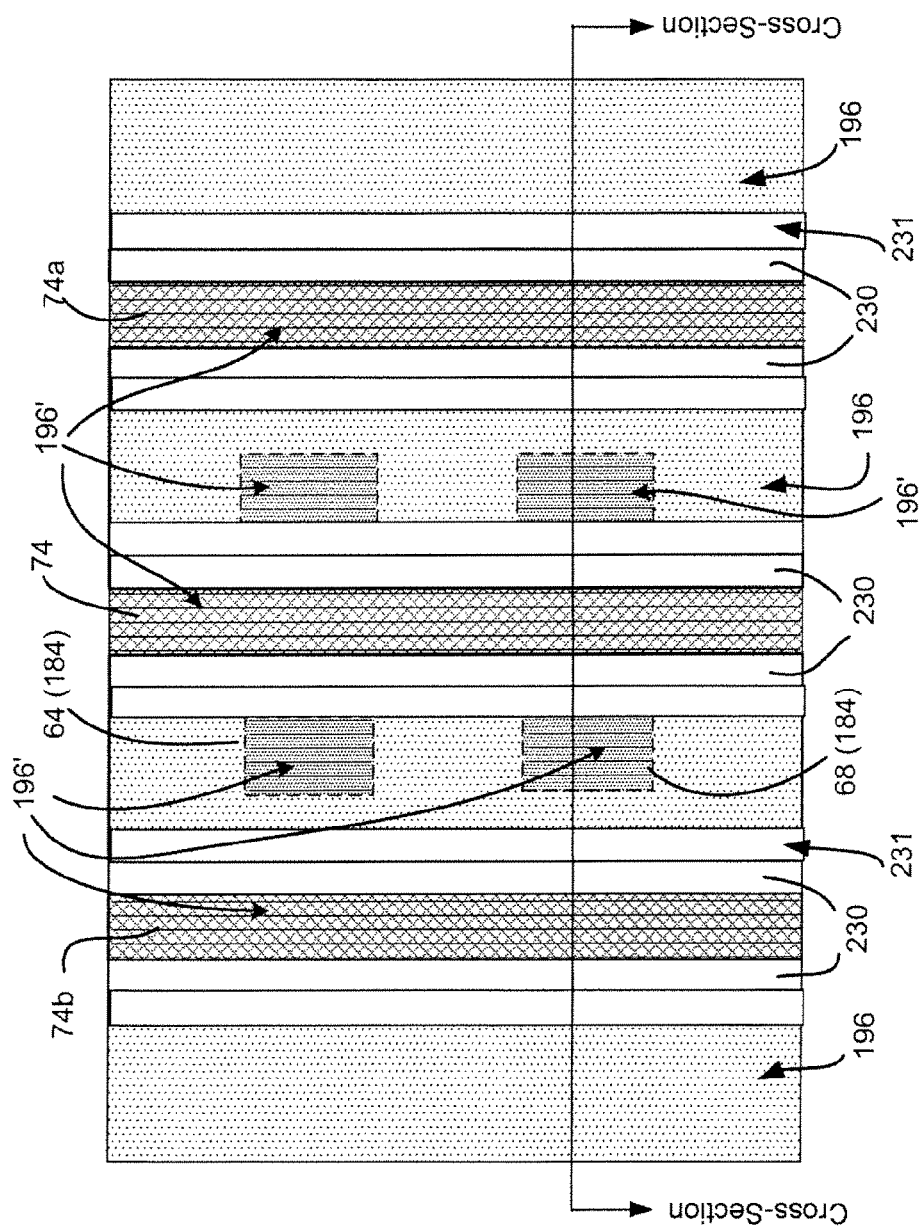
FIG. 12 illustrates a plan view of the exemplary logic inverter after selective etch of the remaining polymer layer and hard mask layer, in accordance with one embodiment of the present invention.

FIG. 11B illustrates a cross-section of the substrate after another selective etching operation is performed to remove the polymer layer 210 and the hard mask layer 199, from above the local interconnect layer 196 (including silicide portions 196'). As can be seen, the local interconnect layer 196 material and the silicide portions 196' will be self-aligned between the dielectric spacers 230. FIG. 12 shows a plan view of substrate in FIG. 11B. As shown, the local interconnect layer 196 runs in the channels between the gate dielectric spacers 230. As noted above, as a result of the etching, the self-aligned local interconnect layer 196 is also spaced a distance 231 apart from dielectric spacers 230. FIG.

12 also illustrates the P 64 and N 68 diffusion regions (both these regions are illustrated in the cross-section illustrations as diffusion region 184).

Figure 13:
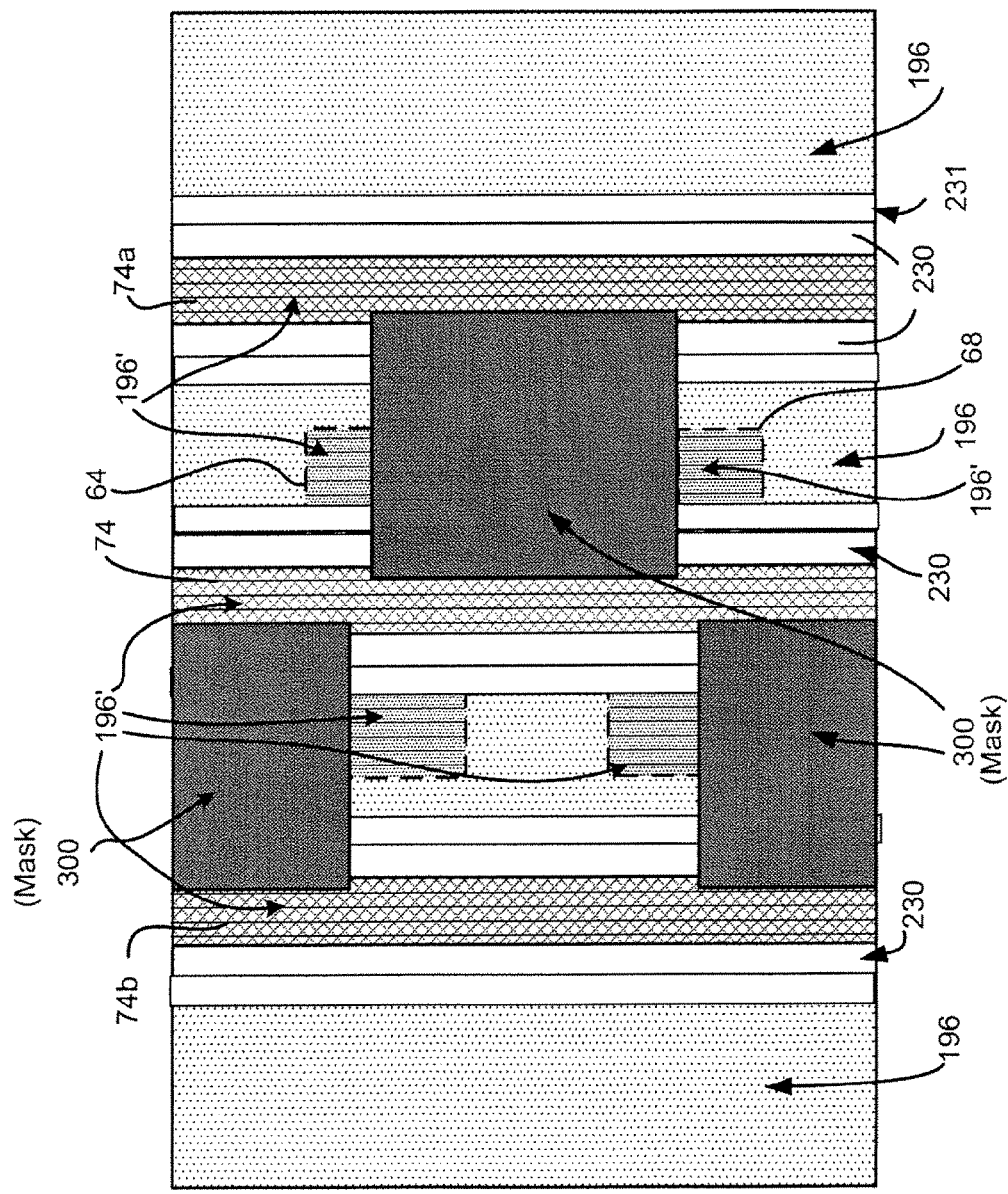
FIG. 13 illustrates a plan view of the exemplary logic inverter after masking portions of the local interconnect layer to protect the local interconnect layer at desired places, in accordance with one embodiment of the present invention.

FIG. 13 illustrates a patterning operation that will facilitate etching, in accordance with one embodiment of the present invention. In one embodiment, a photoresist can be spin coated and then exposed using standard photolithography, to define mask 300. The mask 300, as shown, is defined to cover portions of the local interconnect layer 196 that is to remain after an etching operation is performed. The reacted material that forms the silicide 196', over the exposed silicon or polysilicon if present, will also remain after the etch, even though it is not covered by the mask 300. In one embodiment, the mask 300 can be easily defined without tight layout constraints, as the mask 300 can be defined to loosely lie over the gate electrodes 74, 74a, 74b.

It should be appreciated that tight layout constraints are not needed, as the local interconnect layer 196 material only lies in the channels, and has already been self-aligned between the dielectric spacers 230. Again, the silicide 196' material, will however remain after the etching that is employed to remove the unprotected portions of the local interconnect layer 196. Electrically, the local interconnect layer 196 and the silicide 196' material will define a conductive link or connection or conductive line, similar to a regular interconnect metallization line.

Figure 14:
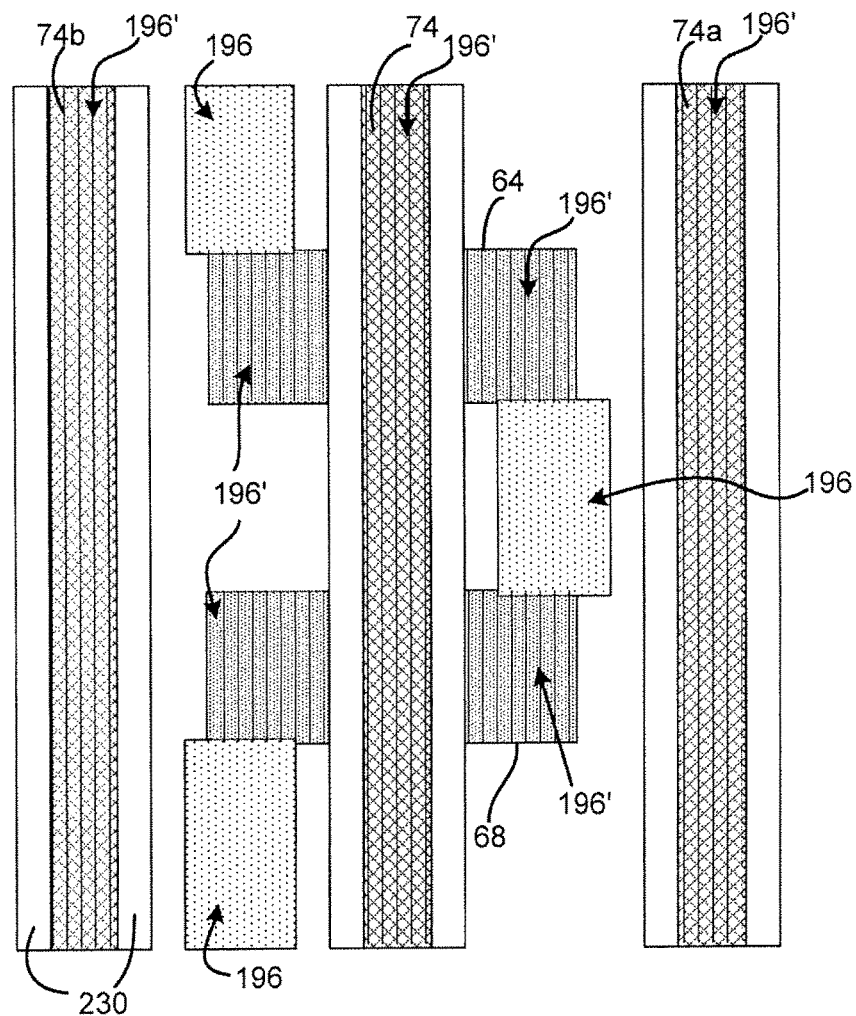
FIG. 14 illustrates a plan view of the exemplary logic inverter showing remaining regions of silicided and non-silicided local interconnect, in accordance with one embodiment of the present invention.

FIG. 14 illustrates a plan view of the substrate after the etching and subsequent removal of the mask 300. As shown, the local interconnect layer 196 will remain in the channels, where the mask 300 protected the material, thus forming true self-aligned local interconnect features. The local interconnect layer 196 that remains, therefore, will functionally complete any interconnection desired within the channel defined between the dielectric spacers 230. After removal of the mask 300, an annealing operation can be performed. The annealing could be, for example, a rapid thermal annealing (RTA) process, that is operated at approximately 450 degrees Celsius, for approximately 30 seconds for nickel.

Figure 15:
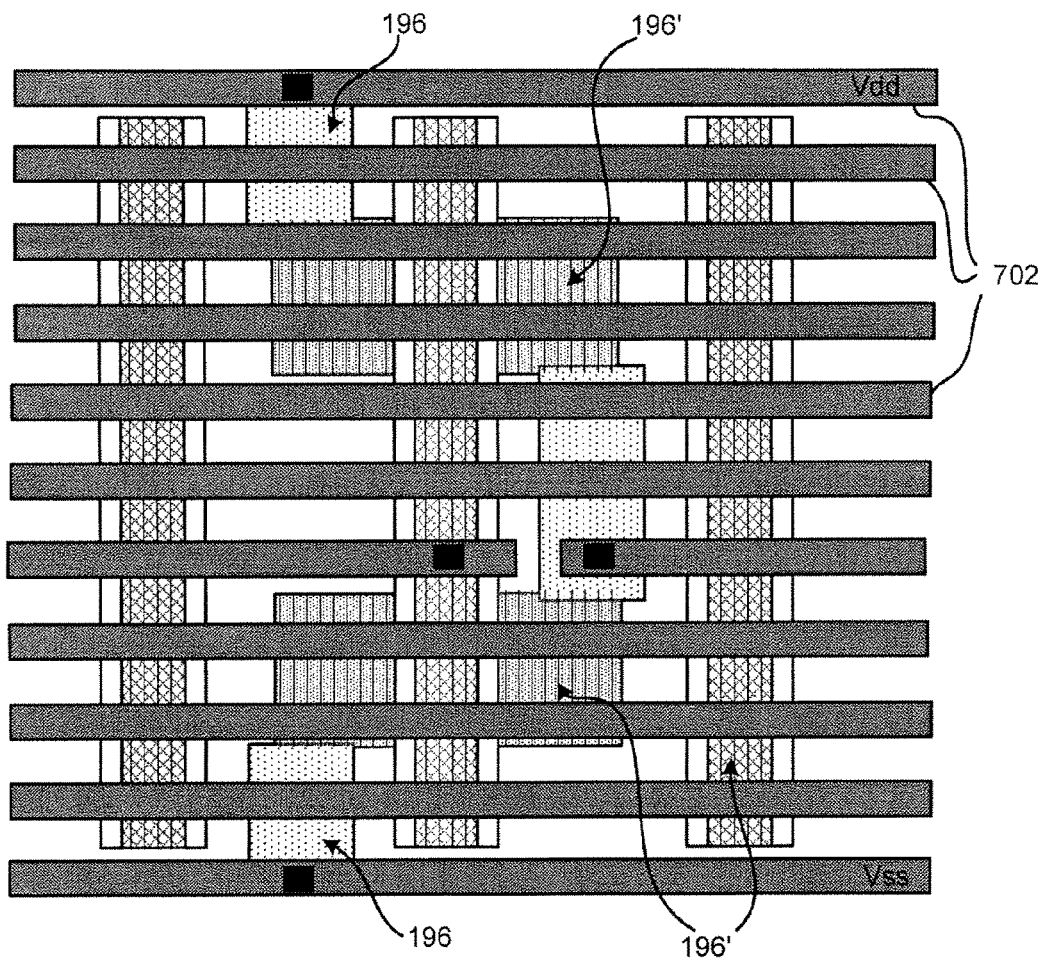
FIG. 15 illustrates a plan view of an exemplary logic inverter as in FIG. 14, with contacts and metal lines added to shown a functional interconnection, in accordance with one embodiment of the present invention.

Referring back to FIG. 5B, metal 1 lines can be fabricated perpendicular to the gate electrode lines 74, 74a, 74b, as shown in FIG. 15. Furthermore, contacts are formed at desired places, to provide electrical conduction between various layers, that is necessary to form the exemplary logic circuit.

In one embodiment, the metal-1 tracks 702 can be fabricated closer to each other, which may enable easier routing and desired connections. Of course, the pitch between lines will depend on the manufacturing capability, the particular circuit, layout, and layout constraints for the type of design and/or circuit. As the self-aligned local interconnects 196 are aligned perpendicular to metal-1 tracks 702, a greater degree of freedom in term of space is available for defining/selecting a contact between the self-aligned local interconnects 196 and selected metal-1 tracks. Therefore, besides the previously discussed advantages of the self-aligned local interconnects, the self-aligned local interconnects also help to provide more freedom in routing metal tracks in levels above, which in turn provide for flexibility in design and fabrication.

Figure 16:
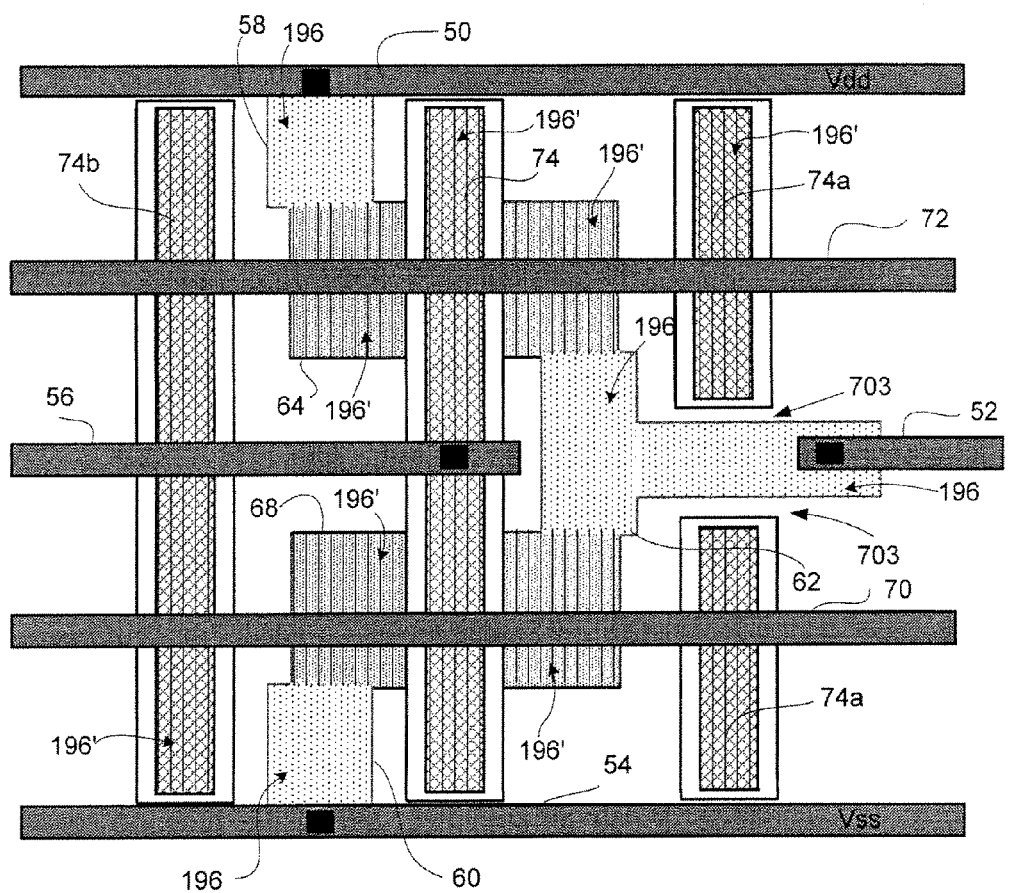
FIG. 16 illustrates a plan view of an exemplary logic inverter showing the self-aligned local interconnect in a gap of a gate line, in accordance with one embodiment of the present invention.

FIG. 16 illustrates an exemplary inverter logic cell, which is fabricated using the self-aligned local interconnects of the present invention. The circuit is similar to the one illustrated in FIG. 5A, except that the gate electrode line 74a is broken into two sections, to provide a gate electrode gap 703. It may be noted that only one gap is shown for the ease of illustration only. In other embodiments, one or more gate electrode lines can have one or more gate electrode gaps. In one embodiment, the gate electrode gap 703 can be used to fabricate the self-aligned local interconnects that are aligned perpendicular to the gate electrode line 74a. The self-aligned local interconnects in these gate electrode gaps 703 can be used to connect two or more devices or two self-aligned local interconnects that are parallel to the gate electrode line 74a. The self-aligned local interconnects in the gate electrode gaps 703 can also ease metal track routing and eliminate the need for some of the metal-1 tracks.

Figure 17A:
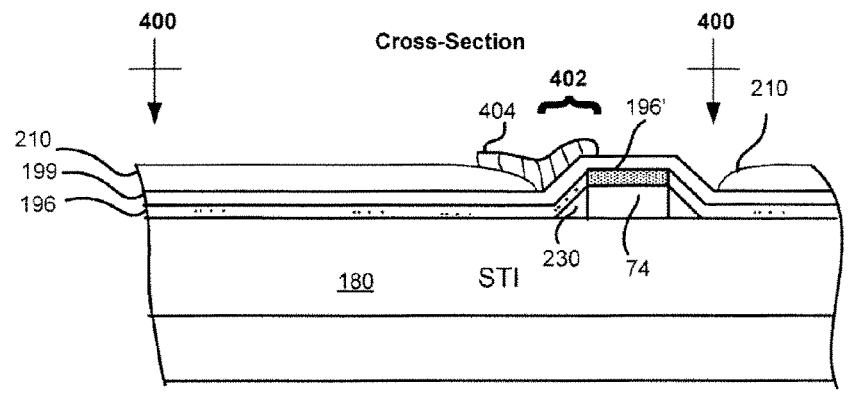
FIGS. 17A-17D illustrate cross-sectional views of an exemplary logic inverter, which uses the local interconnect metal to make connections to a gate, in accordance with one embodiment of the present invention.

FIG. 17A-17D illustrate process operations used to fabricate a connection using the local interconnect layer 196, to make contact to a gate electrode 74, in accordance with another embodiment of the present invention. For ease of understanding, reference is made to a cross-section 400, which is also shown in FIG. 18. FIG. 17A represents a stage in processing that is similar to that described up to FIG. 10B. However, a mask 404 is also formed over a region 402, which lies substantially over the sidewall of the spacer 230 of gate electrode 74. The exact sizing is not particularly important, so long as protection is provided over the material that lies along the spacer 230. This protects the local interconnect material 196 in this region from later etching. The mask 404 can be defined from either hard masks or photoresist masks, depending on the chosen fabrication process.

Figure 17B:
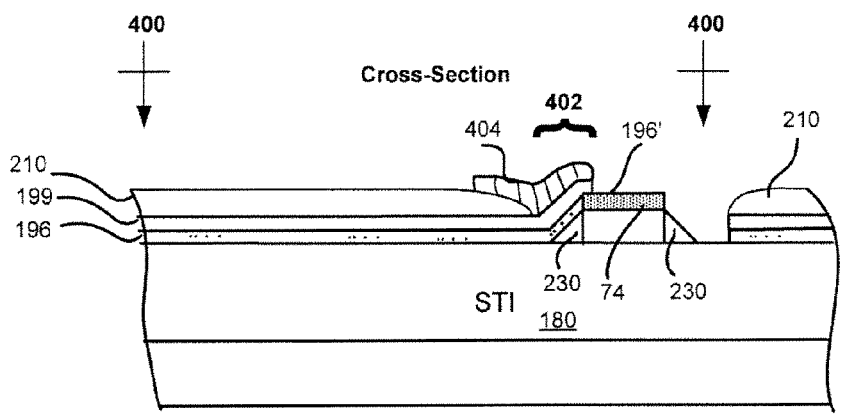
Figure 17C:
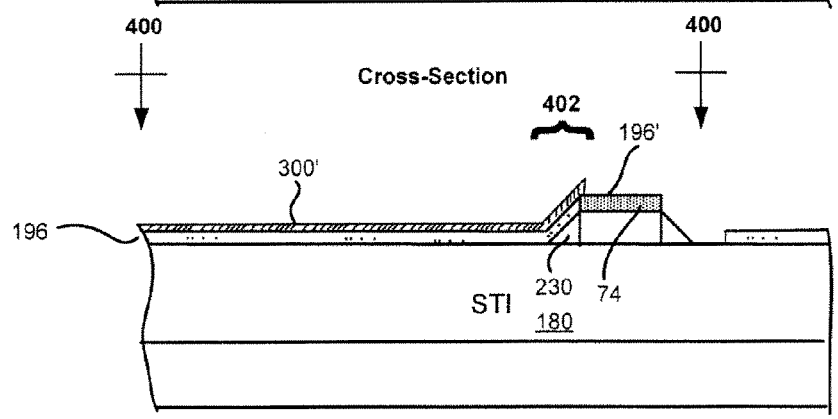
Figure 17D:
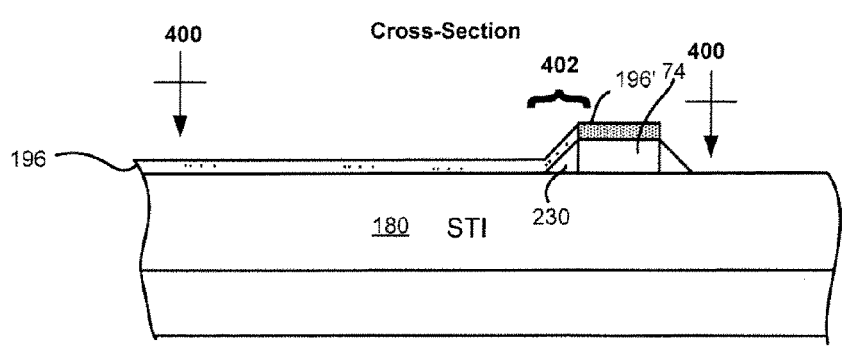
Figure 18:
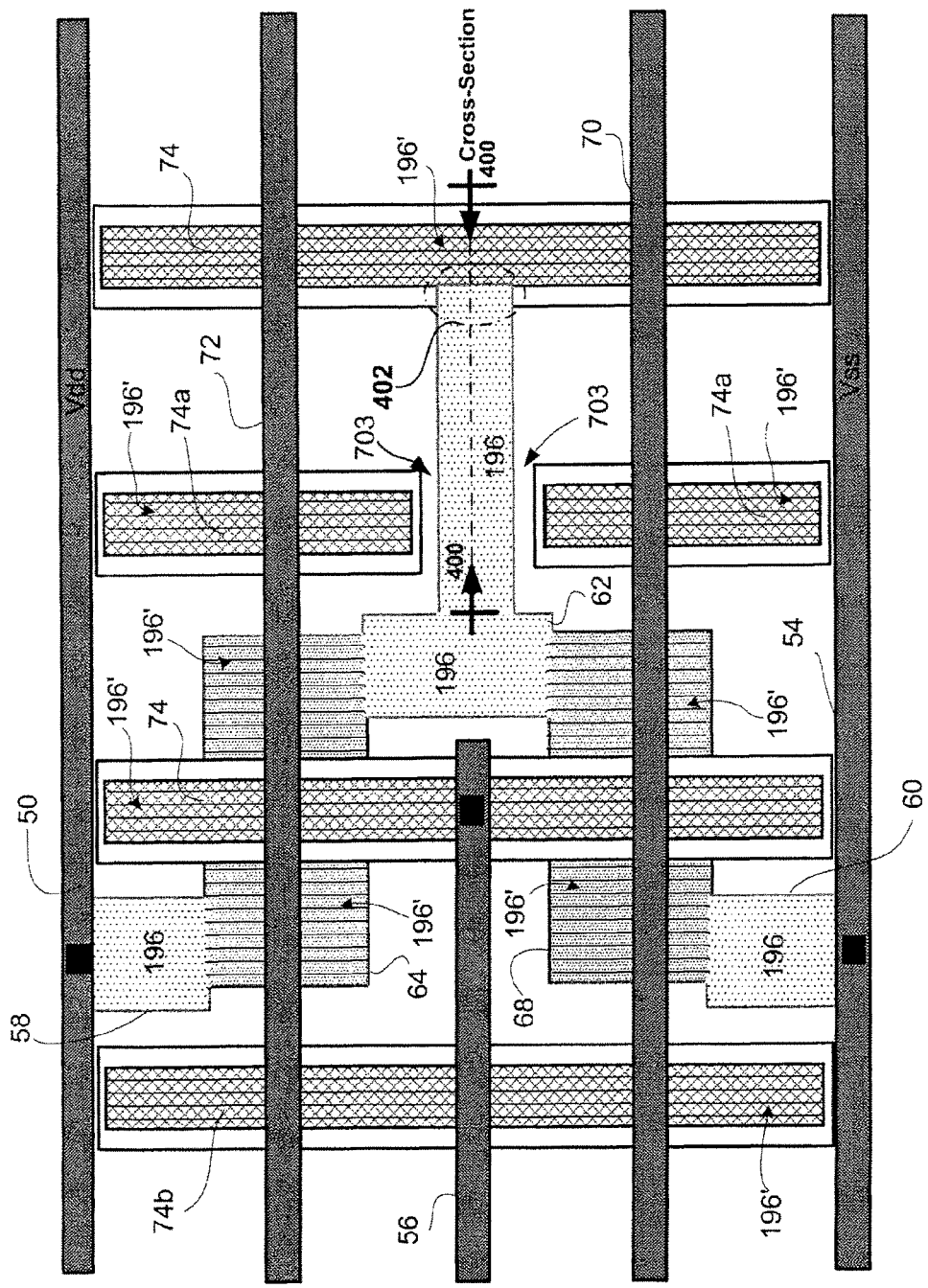
FIG. 18 illustrates a plan view of an exemplary logic inverter showing the self-aligned local interconnect in a gap of a gate line and making connection to a gate upon "climbing" a spacer, in accordance with one embodiment of the present invention.

FIG. 17B shows the processing after an etching operation is used to remove the exposed hard mask layer 199. As shown, the exposed hard mask layer 199 and local interconnect layer 196 is removed, similar to the process of FIG. 11A. Now, the mask 404, the polymer layer 210, and the hard mask 199 is removed, leaving the local interconnect layer 196, as shown in FIG. 17C. FIG. 17C also shows a mask 300' that is used to protect the local interconnect layer 196 in places where it is intended to remain. The mask 300' is shown protecting up to and over to the local interconnect layer 196 in region 402. Thus, because the mask 404 was used, the local interconnect layer 106 will remain on the side wall of the spacer 230, thus allowing the resulting connection of the local interconnect layer 196 to the silicide 196' material of the gate electrode 74. As a result, the connection is made at the level of the substrate, without the need for upper metal levels and contacts, for making a connection to the gate electrode 74.

FIG. 18 shows an example use of a local interconnect layer 196, which climbs the dielectric spacer 230 to make a connection to the gate electrode 74 in Region 402. In this example, the local interconnect layer 196 (which goes over the spacer 230), makes electrical connection to the gate electrode 74. It should be understood, however, that the structures and methods used to form the connections that climb up the spacers 230 can be used in many different designs, circuits, cells, and logic interconnections.

Methods, designs, layouts, and structures have been disclosed, which define ways of using the self-aligned local interconnects. It should be kept in mind that the benefits and advantages of using these self-aligned local interconnects are not tied to any particular circuit, cell or logic. To the contrary, the disclosure of these self-aligned local interconnect methodologies and structures can be extended to any circuit layout, logic device, logic cell, logic primitive, interconnect structure, design mask, etc. And, the resulting layout, design, configuration or data used to define the self-aligned local interconnects (in any part or region of a chip, larger overall system or implementation), can be stored electronically on a file. The file can be stored on a computer readable media, and the computer readable media can be shared, transferred or communicated over a network, such as the Internet.

Therefore, with the above embodiments in mind, it should be understood that the invention may employ other variations in the fabrication process, fabrication steps, sequence of the fabrication steps, chemical used in the fabrication, processes used in the fabrication, configurations and relative positions of the various components. While this invention has been described in terms of several preferable embodiments, it will be appreciated that those skilled in the art upon reading the specifications and studying the drawings will realize various alternation, additions, permutations and equivalents thereof. It is therefore intended that the present invention includes all such alterations, additions, permutations, and equivalents as fall within the true spirit and scope of the invention.

What is claimed is:

1. An integrated circuit, comprising:
    a first gate electrode level conductive structure configured to include a substantially linear-shaped portion that extends in a first direction and that has a lengthwise centerline oriented in the first direction, the substantially linear-shaped portion of the first gate electrode level conductive structure forming both a gate electrode of a first transistor of a first transistor type and a gate electrode of a first transistor of a second transistor type, the first transistor of the first transistor type including a first diffusion region of a first diffusion type and a second diffusion region of the first diffusion type, the first transistor of the second transistor type including a first diffusion region of a second diffusion type and a second diffusion region of the second diffusion type;
    a second gate electrode level conductive structure configured to include a substantially linear-shaped portion that extends in the first direction and that has a lengthwise centerline oriented in the first direction, the second gate electrode level conductive structure positioned next to the first gate electrode level conductive structure such that the first diffusion region of the first diffusion type is located between the first gate electrode level conductive structure and the second gate electrode level conductive structure;
    a third gate electrode level conductive structure configured to include a substantially linear-shaped portion that extends in the first direction and that has a lengthwise centerline oriented in the first direction, the third gate electrode level conductive structure positioned next to the first gate electrode level conductive structure such that the first diffusion region of the second diffusion type is located between the first gate electrode level conductive structure and the third gate electrode level conductive structure, the lengthwise centerline of the third gate electrode level conductive structure substantially aligned with the lengthwise centerline of the second gate electrode level conductive structure, the third gate electrode level conductive structure separated from the second gate electrode level conductive structure by a gap having an extent measured in the first direction between the third gate electrode level conductive structure and the second gate electrode level conductive structure; and
    a local interconnect conductive structure including a first portion and a second portion, the first portion of the local interconnect conductive structure configured to physically contact both the first diffusion region of the first diffusion type and the first diffusion region of the second diffusion type, the second portion of the local interconnect conductive structure configured to extend away from the first portion of the local interconnect conductive structure and through the gap that separates the third gate electrode level conductive from the second gate electrode level conductive structure.

2. The integrated circuit as recited in claim 1, wherein the second gate electrode level conductive structure does not form a transistor using the first diffusion region of the first diffusion type.

3. The integrated circuit as recited in claim 2, wherein the third gate electrode level conductive structure does not form a transistor using the first diffusion region of the second diffusion type.

4. The integrated circuit as recited in claim 1, wherein the first portion of the local interconnect conductive structure is substantially centered between the first gate electrode level conductive structure and the second gate electrode level conductive structure in a second direction perpendicular to the first direction, and
    wherein the first portion of the local interconnect conductive structure is substantially centered between the first gate electrode level conductive structure and the third gate electrode level conductive structure in the second direction perpendicular to the first direction.

5. The integrated circuit as recited in claim 1, wherein the local interconnect conductive structure does not physically contact the first gate electrode level conductive structure, and wherein the local interconnect conductive structure does not physically contact the second gate electrode level conductive structure, and wherein the local interconnect conductive structure does not physically contact the third gate electrode level conductive structure.

6. The integrated circuit as recited in claim 1, wherein a width of the first gate electrode level conductive structure as measured in a second direction perpendicular to the first direction is substantially equal to a width of the second gate electrode level conductive structure as measured in the second direction, and wherein the width of the first gate electrode level conductive structure as measured in the second direction is substantially equal to a width of the third gate electrode level conductive structure as measured in the second direction.

7. The integrated circuit as recited in claim 1, further comprising:
    a fourth gate electrode level conductive structure configured to include a substantially linear-shaped portion that extends in the first direction and that has a lengthwise centerline oriented in the first direction, the substantially linear-shaped portion of fourth gate electrode level conductive structure positioned next to both the substantially linear-shaped portion of the second gate electrode level conductive structure and the substantially linear-shaped portion of the third gate electrode level conductive structure.

8. The integrated circuit as recited in claim 7, wherein a distance as measured in a second direction perpendicular to the first direction between the lengthwise centerline of the substantially linear-shaped portion of the first gate electrode level conductive structure and the lengthwise centerline of the substantially linear-shaped portion of the second gate electrode level conductive structure is substantially equal to a gate electrode pitch, and
    wherein a distance as measured in the second direction between the lengthwise centerline of the substantially linear-shaped portion of the second gate electrode level conductive structure and the lengthwise centerline of the substantially linear-shaped portion of the fourth gate electrode level conductive structure is substantially equal to the gate electrode pitch.

9. The integrated circuit as recited in claim 7, wherein the second portion of the local interconnect conductive structure is configured to physically contact the fourth gate electrode level conductive structure.

10. The integrated circuit as recited in claim 9, wherein the second portion of the local interconnect conductive structure is configured to extend over a sidewall spacer of the fourth gate electrode level conductive structure to physically contact the fourth gate electrode level conductive structure.

11. The integrated circuit as recited in claim 9, wherein the local interconnect conductive structure that includes the first portion and the second portion is a first local interconnect conductive structure, the integrated circuit further including a second local interconnect conductive structure configured to physically contact the second diffusion region of the first diffusion type.

12. The integrated circuit as recited in claim 11, further comprising:
a third local interconnect conductive structure configured to physically contact the second diffusion region of the second diffusion type.

13. The integrated circuit as recited in claim 12, wherein the second local interconnect conductive structure is electrically connected to a power supply, and wherein the third local interconnect conductive structure is electrically connected to a reference ground potential.

14. The integrated circuit as recited in claim 12, further comprising:
a first interconnect level conductive structure configured to include a substantially linear-shaped portion that extends in a second direction perpendicular to the first direction and that has a lengthwise centerline oriented in the second direction; and
a first contact conductive structure configured to physically contact both the first interconnect level conductive structure and the second local interconnect conductive structure.

15. The integrated circuit as recited in claim 14, further comprising:
a second interconnect level conductive structure configured to include a substantially linear-shaped portion that extends in the second direction and that has a lengthwise centerline oriented in the second direction; and
a second contact conductive structure configured to physically contact both the second interconnect level conductive structure and the third local interconnect conductive structure.

16. The integrated circuit as recited in claim 15, wherein the first interconnect level conductive structure is electrically connected to a power supply, and wherein the second interconnect level conductive structure is electrically connected to a reference ground potential.

17. The integrated circuit as recited in claim 15, further comprising:
a third interconnect level conductive structure configured to include a substantially linear-shaped portion that extends in the second direction and that has a lengthwise centerline oriented in the second direction; and
a third contact conductive structure configured to physically contact both the third interconnect level conductive structure and the first gate electrode level conductive structure.

18. The integrated circuit as recited in claim 17, wherein the third interconnect level conductive structure is positioned between the first transistor of the first transistor type and the first transistor of the second transistor type relative to the first direction.

19. The integrated circuit as recited in claim 18, wherein the third interconnect level conductive structure does not extend directly over the first local interconnect conductive structure.

20. The integrated circuit as recited in claim 18, further comprising:
a fourth interconnect level conductive structure configured to include a substantially linear-shaped portion that extends in the second direction and that has a lengthwise centerline oriented in the second direction, the fourth interconnect level conductive structure positioned between the first interconnect level conductive structure and the third interconnect level conductive structure relative to the first direction; and
a fifth interconnect level conductive structure configured to include a substantially linear-shaped portion that extends in the second direction and that has a lengthwise centerline oriented in the second direction, the fifth interconnect level conductive structure positioned between the fifth interconnect level conductive structure and the third interconnect level conductive structure relative to the first direction.

21. The integrated circuit as recited in claim 20, wherein each of the first interconnect level conductive structure, the second interconnect level conductive structure, the third interconnect level conductive structure, the fourth interconnect level conductive structure, and the fifth interconnect level conductive structure is located within a first interconnect level above a gate electrode level.

22. The integrated circuit as recited in claim 21, wherein the lengthwise centerline of the fourth interconnect level conductive structure is separated from the lengthwise centerline of the first interconnect level conductive structure by a first interconnect level pitch as measured in the first direction, and
wherein the lengthwise centerline of the third interconnect level conductive structure is separated from the lengthwise centerline of the fourth interconnect level conductive structure by the first interconnect level pitch as measured in the first direction, and
wherein the lengthwise centerline of the fifth interconnect level conductive structure is separated from the lengthwise centerline of the third interconnect level conductive structure by the first interconnect level pitch as measured in the first direction, and
wherein the lengthwise centerline of the second interconnect level conductive structure is separated from the lengthwise centerline of the fifth interconnect level conductive structure by the first interconnect level pitch as measured in the first direction.

23. A method for manufacturing an integrated circuit, comprising:
forming a first gate electrode level conductive structure configured to include a substantially linear-shaped portion that extends in a first direction and that has a lengthwise centerline oriented in the first direction, the substantially linear-shaped portion of the first gate electrode level conductive structure forming both a gate electrode of a first transistor of a first transistor type and a gate electrode of a first transistor of a second transistor type, the first transistor of the first transistor type including a first diffusion region of a first diffusion type and a second diffusion region of the first diffusion type, the first transistor of the second transistor type including a first diffusion region of a second diffusion type and a second diffusion region of the second diffusion type;

forming a second gate electrode level conductive structure configured to include a substantially linear-shaped portion that extends in the first direction and that has a lengthwise centerline oriented in the first direction, the second gate electrode level conductive structure positioned next to the first gate electrode level conductive structure such that the first diffusion region of the first diffusion type is located between the first gate electrode level conductive structure and the second gate electrode level conductive structure;

forming a third gate electrode level conductive structure configured to include a substantially linear-shaped portion that extends in the first direction and that has a lengthwise centerline oriented in the first direction, the third gate electrode level conductive structure positioned next to the first gate electrode level conductive structure such that the first diffusion region of the second diffusion type is located between the first gate electrode level conductive structure and the third gate electrode level conductive structure, the lengthwise centerline of the third gate electrode level conductive structure substantially aligned with the lengthwise centerline of the second gate electrode level conductive structure, the third gate electrode level conductive structure separated from the second gate electrode level conductive structure by a gap having an extent measured in the first direction between the third gate electrode level conductive structure and the second gate electrode level conductive structure; and forming a local interconnect conductive structure including a first portion and a second portion, the first portion of the local interconnect conductive structure configured to physically contact both the first diffusion region of the first diffusion type and the first diffusion region of the second diffusion type, the second portion of the local interconnect conductive structure configured to extend away from the first portion of the local interconnect conductive structure and through the gap that separates the third gate electrode level conductive from the second gate electrode level conductive structure.

* * * * *